(12) United States Patent
Contario et al.

(10) Patent No.: US 8,674,823 B1
(45) Date of Patent: Mar. 18, 2014

(54) POWER MANAGEMENT SYSTEM

(75) Inventors: Brian P. Contario, Milford, OH (US); Iwan Antonow, Ft. Wright, KY (US)

(73) Assignee: Plug ID, LLC., Ft. Wright, KY (US)

( * ) Notice: Subject to any disclaimer, the term of this patent is extended or adjusted under 35 U.S.C. 154(b) by 741 days.

(21) Appl. No.: 12/778,295

(22) Filed: May 12, 2010

Related U.S. Application Data

(60) Provisional application No. 61/177,362, filed on May 12, 2009.

(51) Int. Cl.
| | | |
|---|---|---|
| G08B 1/00 | (2006.01) | |
| G08B 1/08 | (2006.01) | |
| G08B 23/00 | (2006.01) | |
| H04L 12/28 | (2006.01) | |

(52) U.S. Cl.
USPC ......... 340/538; 340/693.1; 340/333; 370/401

(58) Field of Classification Search
None
See application file for complete search history.

(56) References Cited

U.S. PATENT DOCUMENTS

| | | | |
|---|---|---|---|
| 6,577,630 | B1 | 6/2003 | Markwalter et al. |
| 7,730,223 | B1* | 6/2010 | Bavor et al. ...................... 710/8 |
| 7,898,397 | B2* | 3/2011 | Kerr et al. .................. 340/407.2 |
| 2004/0037300 | A1* | 2/2004 | Lehr et al. ..................... 370/401 |
| 2006/0018338 | A1* | 1/2006 | Binder ........................... 370/463 |
| 2006/0142066 | A1* | 6/2006 | Lauper ........................... 455/561 |
| 2006/0192434 | A1* | 8/2006 | Vrla et al. ........................ 307/64 |
| 2006/0206741 | A1* | 9/2006 | Allison et al. ................. 713/340 |
| 2007/0075843 | A1* | 4/2007 | Riveiro et al. ........... 340/310.11 |
| 2009/0234512 | A1* | 9/2009 | Ewing et al. ................... 700/295 |

OTHER PUBLICATIONS

HomePlug Powerline Alliance, http://www.homeplug.org/home/, printed Nov. 16, 2010.
HP Insight Rapid Deployment Sotware, HP Business Support Center, http://h2000.www2.hp.com/bizsupport/TechSupport/Home.jsp?lang=en&cc=us&prodT, printed Nov. 16, 2010.
KNX Assocation, Welcome to the New ETS4, http://www.knx.org., printed Nov. 16, 2010.
Smart Grid: Closing the Gap Between Perception and Reality, http://www.cera.com/aspx/cda/client/knowledgeArea/serviceDescription.aspx?KID=245&gclid=CNjjos01pqUCF07KgodZB08VQ, pp. 1-9, printed Nov. 16, 2010.
Universal Powerline Association, http://en.widipedia.org/siki/Universal_Powerline_Association, printed Nov. 16, 2010.
"Using ProLiant Essentials Rapid Deployment Pack for scripted blade-based switch configuration", Hewlett Packard Invent, http://h2000.www2.hp.com/bc/docs/support/SupportManual/coo112018/c00112018.pdf, printed Nov. 17, 2010, pp. 1-23.

\* cited by examiner

*Primary Examiner* — Steven Lim
*Assistant Examiner* — Omeed Alizada
(74) *Attorney, Agent, or Firm* — Frost Brown Todd LLC

(57) ABSTRACT

A system comprises a power provider and a plurality of power consumers. The power provider has a plurality of power outlets. The power consumers are coupled with the power outlets via corresponding power cables. The power provider and power consumers may communicate via the power cables using powerline communication as the power provider provides operational power to the power consumers. Powerline communication may be provided using radio frequency integrated circuits in the power provider and in the power consumers. The power provider may provide power event notifications to the power consumers through the power cords. The power provider may also provide equipment identification of the power consumers through the power cords. The power provider may also monitor and regulate power consumption by the power consumers. An adapter may be used to retrofit a conventional computer system to provide powerline communication between a computer and a power supply.

11 Claims, 27 Drawing Sheets

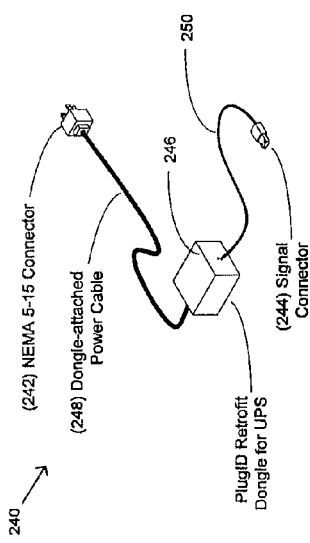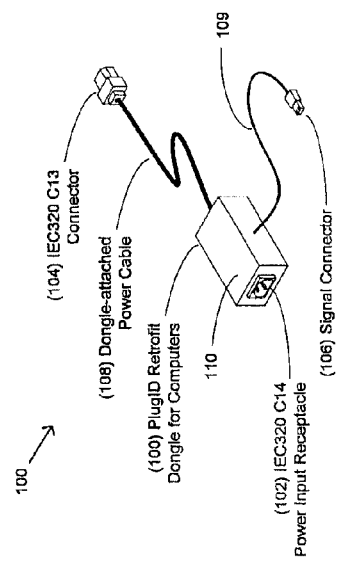

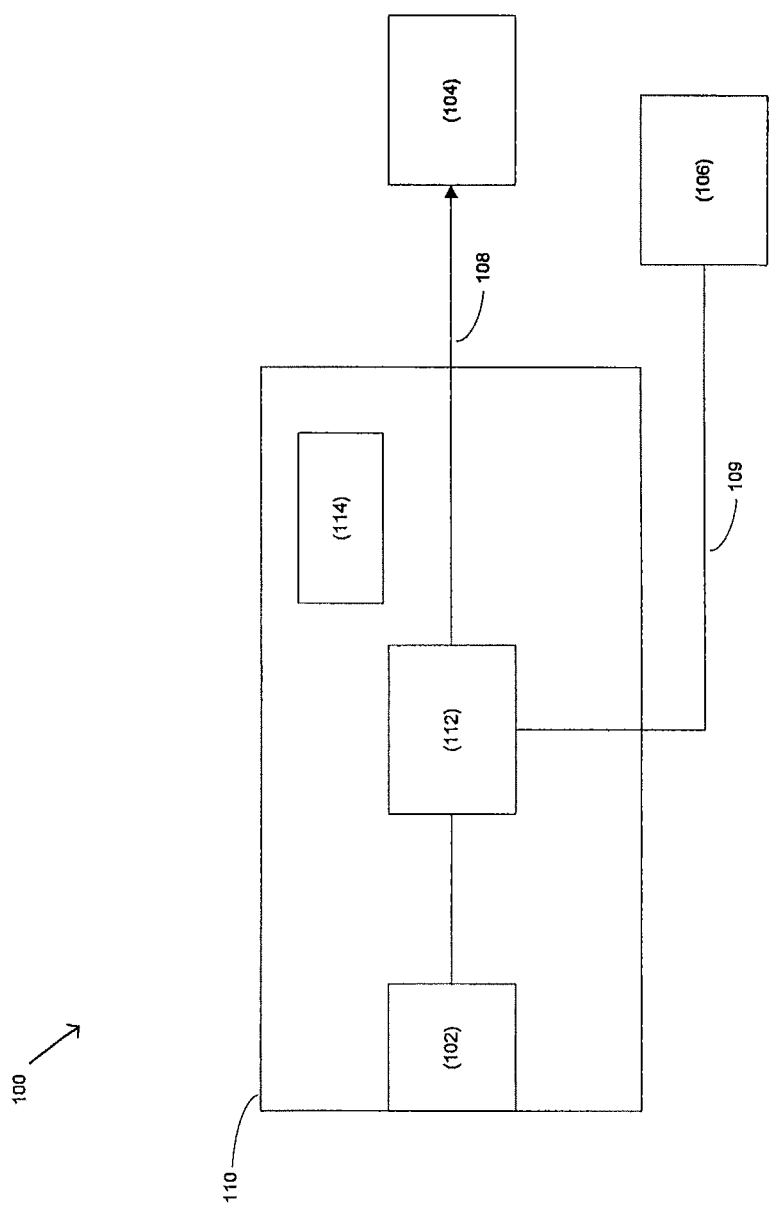

POWER MANAGEMENT SYSTEM

PRIORITY

This application claims priority to U.S. Provisional Patent Application Ser. No. 61/177,362, filed May 12, 2009, entitled "Power Management System," the disclosure of which is incorporated by reference herein.

BACKGROUND

Versions of the present invention relate, in general, to a power management system and, in particular, to hardware designed to enhance computer system power management by facilitating communication between and identification of connected components.

As home and business computer networks become larger and more complicated, managing the power connections between power provider devices, such as power distribution unit ("PDU") devices and uninterruptible power supply ("UPS") devices, and power consumers, such as servers and computers, may also become increasingly difficult. In particular, managing the multitude of wires in some data centers and server farms may be extremely confusing and tedious. Proper identification of connections between power providers and power consumers may be tedious, time consuming and susceptible to errors. In these situations, accidental power outages may be catastrophic to the equipment involved and/or the data stored thereon. Consequently, it may be beneficial to provide a power management system configured to facilitate accurate identification of power connections between components within a computer system; and to provide communication between computer system components that are connected by power cords.

While several systems, methods, and devices have been made and used for managing power connections, it is believed that no one prior to the inventors has made or used the invention described herein.

BRIEF DESCRIPTION OF THE DRAWINGS

While the specification concludes with claims which particularly point out and distinctly claim the invention, it is believed the present invention will be better understood from the following description of certain examples taken in conjunction with the accompanying drawings, in which like reference numerals identify the same elements and in which:

FIG. 11 depicts a perspective view of an exemplary power management adapter for a power provider;

FIG. 13 depicts a perspective view of an exemplary power management adapter for a power consumer;

FIG. 14 depicts a schematic view of the adapter of FIG. 13;

Figure 1:
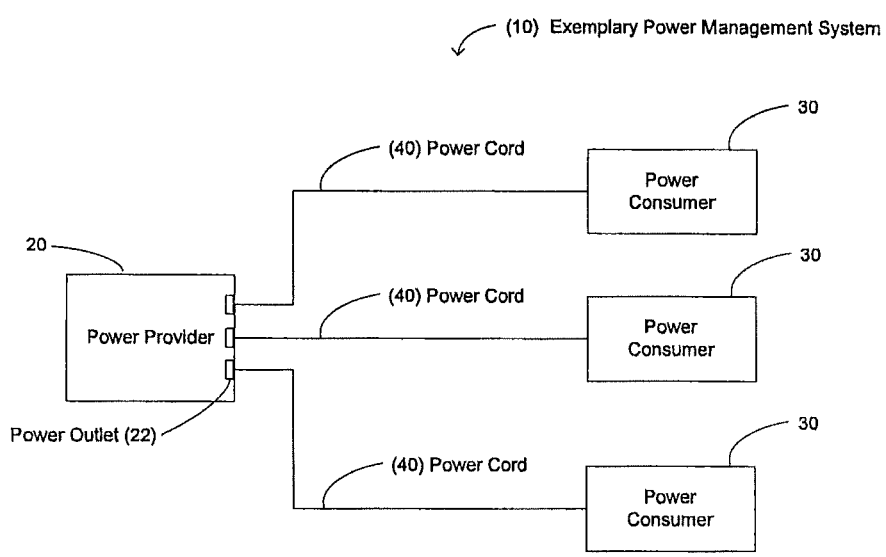
FIG. 1 depicts a schematic view of an exemplary power management system.

The drawings are not intended to be limiting in any way, and it is contemplated that various embodiments of the invention may be carried out in a variety of other ways, including those not necessarily depicted in the drawings. The accompanying drawings incorporated in and forming a part of the specification illustrate several aspects of the present invention, and together with the description serve to explain the principles of the invention; it being understood, however, that this invention is not limited to the precise arrangements shown.

DETAILED DESCRIPTION

The following description of certain examples of the invention should not be used to limit the scope of the present invention. Other examples, features, aspects, embodiments, and advantages of the invention will become apparent to those skilled in the art from the following description, which is by way of illustration, one of the best modes contemplated for carrying out the invention. As will be realized, the invention is capable of other different and obvious aspects, all without departing from the invention. Accordingly, the drawings and descriptions should be regarded as illustrative in nature and not restrictive.

I. Overview

As shown in FIG. 1, an exemplary power management system (10) includes a power provider (20) connected to a plurality of power consumers (30) via power cords (40). Power provider (20) may comprise any suitable source of power, such as a PDU, UPS, standard AC wall outlet, circuit breaker panel, fuse panel, junction box, power transfer switch, generator, power inverter, power transformer, voltage converter, or any other suitable source of power, including combinations thereof. Power provider (20) may have a plurality of discrete power outlets (22), with which power cords (40) may be connected. Power consumers (30) may comprise any device that utilizes power to operate, such as a server, computer, disk array, tape backup unit, video display unit, wired or wireless network communications equipment, computing appliance, printer, telecommunications equipment, radio communications equipment, or any other suitable devices that may be permanently or temporarily used in a computer operation environment or a domain where management of a plurality of devices is desired, such as air circulation fans, environmental control equipment, power tools, lighting equipment, electric-powered pumps, and diagnostic equipment, etc. Power cords (40) may comprise standard computer power cords, modified power cords as described below, or any other suitable devices. In some versions, power management system (10) uses power cords (40) as communications channels to distribute communication signals between power provider (20) and power consumers (30). As will be described in greater detail below, by using power cord (40) as a communications channel, power management system (10) may avoid adding additional cabling complexity to the depicted computer environment, and in fact may replace and/or eliminate the need for several types of cables to be attached to a power consumer (30), while maintaining or enhancing the usability, management, and monitoring of the power provider (20) and/or power consumer (30).

Power management system (10) may comprise at least one radio frequency integrated circuit ("RFIC") in order to provide one-way or two-way communication between power provider (20) and at least one power consumer (30). The communication may comprise narrowband communication ("NB"), which in the present example may be classified as data transfer rates below 100 Kbits/sec, or broadband communication ("BB"), which in the present example may be classified as data transfer rates above 100 Kbits/sec; and may be carried out via the corresponding power cord (40) connecting the components (20, 30). Of course, these NB and BB classifications may be flexible and may thus vary from implementation to implementation. It should also be understood that the present example includes two NB and BB classifications of the present example are arbitrary, and that classifications based on data transfer rates and/or based on other parameters may or may not have significant differences in data transfer speed capabilities and/or ranges of the radio frequency spectrum that is used for communication. As will be described in greater detail below, the at least one RFIC may be integrated within one or more of power provider (20), power consumer (30), and/or power cord (40); or may be provided within an adapter connected to one of these components (20, 30, 40). Communication via power cords (40) may be implemented without requiring any user configuration or an additional signal cable between the two components. In particular, some versions of power management system (10), such as the one depicted in FIG. 1, may utilize powerline radio-frequency communication to enhance computer management and power management as will be described in greater detail below.

By way of example only, power management system (10) may use a communication method and apparatus configured in accordance with the teachings of U.S. Pat. No. 6,577,630, titled "Self-Configuring Source-Aware Bridging for Noisy Media," issued on Jun. 10, 2003, the disclosure of which is incorporated by reference herein. Powerline communication is a system for carrying data on a conductor that is also used for electric power transmission. For instance, electrical power used to operate electromechanical devices may be in the form of 50 Hz or 60 Hz Alternating Current or non-alternating Direct Current, and may be provided via metal conductors. It has been established in prior art that it is possible to transmit Radio Frequency (RF) signals through the same metal conductors as the electrical power at the same time and use specialized filtering techniques. The specialized filtering techniques are used to separate the original desired RF signal from the 50 Hz, 60 Hz, and other RF signals caused by the equipment being powered and RF interference. RF interference is typically induced into the metal conductors via airwave propagation from an undesired RF signal source without actual physical contact between the RF signal source and the metal conductors or by direct connection with a power consumer or producer that generates an undesirable RF signal. By application of these principles, and the combining of an RF transmission apparatus and an RF receiving apparatus in one system that can operate at a level conducive to conveying the RF signal over continuous metal electrical power conductors (powerlines), use of two systems allows for reliable 2-way communication of information in the form of analog or digital data when they are both connected to the same metal electrical power conductor circuit (powerline). Because powerline communication systems use a metal conductor to carry the RF signal, the amplitude of the RF signal is low enough that it is not propagated well through the air, so by design two powerline communications systems that are not connected to the same powerline circuit may not be able to communicate with each other. Some versions of power management system (10) utilize the nature of powerline communications only working between systems attached to the same metal power conductor circuit to determine which circuit an appropriately-equipped device is attached to. Some versions of power management system (10) also utilize the ability of powerline communications to transmit and receive data through a metal power conductor circuit to identify what appropriately-equipped devices are connected to a power circuit, as well as monitor, control, and manipulate said devices.

In some versions, communication may be provided through power cords (40) in accordance with technology used by the HomePlug Powerline Alliance. In particular, the RFIC in a power management system (10) may be configured in accordance with specifications observed by the HomePlug Powerline Alliance. By way of example only, the RFIC in a BB version ("BBRFIC") of power management system (10) may include the single-chipset HomePlug 1.0 or later integrated circuit by Intellon, allowing communication of at least 1.5 Mbits/sec. Of course, any other suitable BBRFIC, or system providing functionality similar to an RFIC, may be used, if desired. As another merely illustrative example, the RFIC in a NB version ("NBRFIC") of power management system (10) may be configured in accordance with the HomePlug Command & Control (C&C) specification, allowing communication of 0.6 Kbits/sec to 7.5 Kbits/sec. Again, though, any other suitable NBRFIC may be used, if desired. Other providers of suitable technology include, but are not limited to, the Universal Powerline Association, the KNX Association, Smart Grid technology, and Insteon.

As will be described in greater detail below, some versions of power management system (10) may provide one or more of the following functionalities, among others: if power cord (40) is plugged in, power consumer (30), may be automatically shut down gracefully by the correct power provider (20); if power cord (40) is plugged in, power consumer (30) may be remotely powered on and off with certainty; if power cord (40) is plugged in, power provider (20) may be identified, inventoried, managed, monitored, electronically secured, and/or its continued physical presence may be tracked; if power cord (40) is plugged in, power usage and efficiency by power consumer (30) may be monitored and controlled; if power cord (40) is plugged in, power provider (20) and any connected power consumers (30) sharing the same power provider (20) may be visually indicated at the push of a button; and/or if power cord (40) is plugged in, power consumer (30) may be automatically shut down or powered off during data center emergencies.

Figure 2:
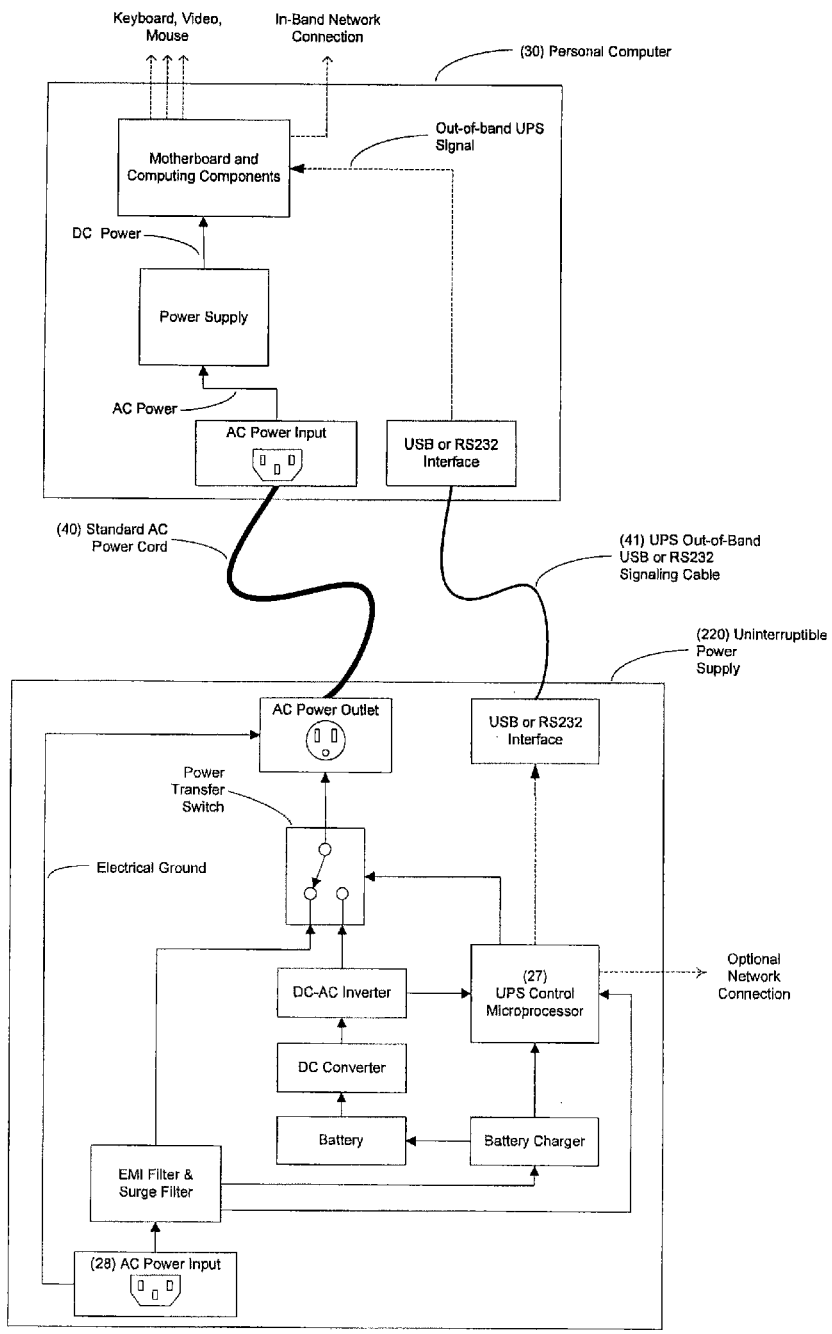
FIG. 2 depicts a schematic view of a conventional uninterruptible power supply coupled with a conventional personal computer.

An example of conventional configurations of and relationships between a conventional power provider (20) and a conventional consumer (30) is shown in FIG. 2. As shown, power provider (20) in this example comprises a conventional uninterruptible power supply. Power consumer (30) in this example comprises a conventional personal computer. Power provider (20) is coupled with power consumer (30) by two separate cables (40, 41)—a conventional power cord (40) and a conventional USB cable (41). Power cord (40) is used to communicate power from power provider (20) to power consumer (30); while USB cable (41) is used to communicate data between power provider (20) and power consumer (30) (e.g., uni-directionally in either direction and/or bi-directionally).

Figure 3:
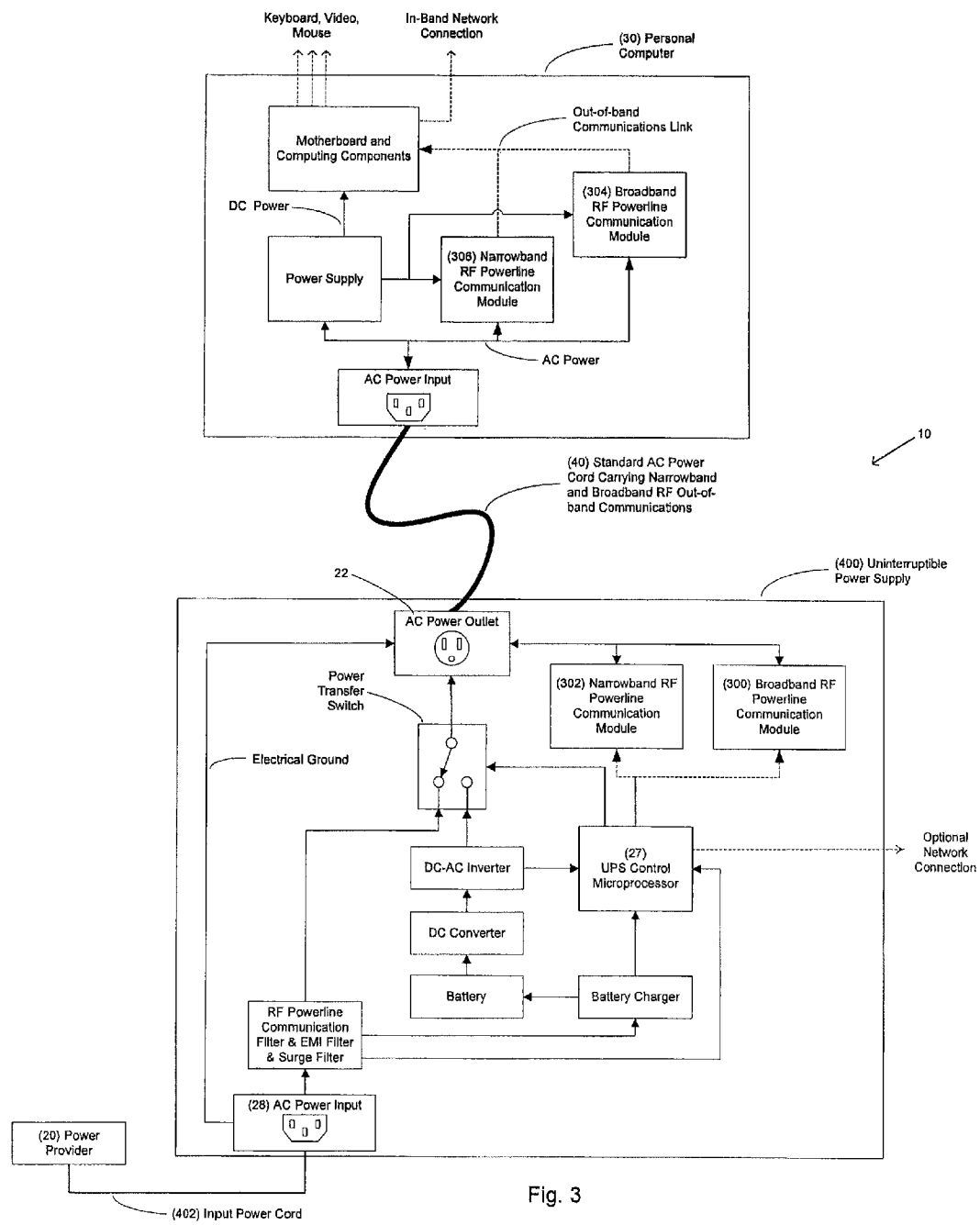
FIG. 3 depicts a schematic view of an exemplary modified uninterruptible power supply coupled with a modified personal computer.

By contrast, a merely illustrative implementation of a power management system (10) is shown in FIG. 3. In this example, power provider (20) comprises a modified uninterruptible power supply; while power consumer (30) comprises a modified personal computer. Power provider (20) is coupled with power consumer (30) by a single cable (40) in this example—a conventional power cord (40). Power cord (40) is used to communicate power from power provider (20) to power consumer (30) and to communicate data between power provider (20) and power consumer (30) (e.g., uni-directionally in either direction and/or bi-directionally). It should be understood that such communication of power and data through the same single power cord (40) may be accomplished simultaneously, using the powerline communication techniques described herein. In particular, power provider (20) of this example comprises a broadband RF powerline communication module (300) and a narrowband RF powerline communication module (302). Power consumer (20) of this example comprises a broadband RF powerline communication module (304) and a narrowband RF powerline communication module (306). Modules (300, 302, 304, 306) in this example are configured to provide data communication between power provider (20) and power consumer (30) in accordance with the teachings herein. Modules (300, 302, 304, 306) may include one or more RFICs and/or any other suitable components. While power provider (20) and power consumer (30) in this example provide capabilities of both broadband and narrowband powerline communication, it should be understood that broadband RF powerline communication modules (300, 304) or narrowband RF powerline communication modules (302, 306) may be omitted, if desired. Various ways in which power providers (20), power consumers (30), and associated components may be configured, varied, modified, and used will be described in greater detail below; while still other ways in which power providers (20), power consumers (30), and associated components may be configured, varied, modified, and used will be apparent to those of ordinary skill in the art in view of the teachings herein.

II. Exemplary Incorporation of RFIC into Power Management System

As noted above, power management system (10) may include one or more RFICs to provide communication via power cords (40). Those of ordinary skill in the art will recognize that there are a variety of ways in which one or more RFICs may be incorporated into a power management system (10). Several merely illustrative examples will be described in detail below, while other examples will be apparent to those of ordinary skill in the art in view of the teachings herein. It should be noted that many of the below examples describe methods by which a single discrete power outlet (22) or power connection may be discerned when a plurality of power outlets (22) and power connections are provided.

A. Exemplary Incorporation of RFIC in Power Provider

In the following examples, at least one RFIC (Narrow Band RFIC, Broad Band RFIC, or both) is incorporated within power provider (20). As noted above, a power provider (20) may comprise a PDU, a UPS, or any other suitable type of power source. In some settings, a PDU, a UPS, or any other suitable type of power source can supply multiple power connections or outlets on a circuit with a shared RFIC in the power provider communicating with multiple power consumers without knowledge of which of a plurality of power connections or outlets each power consumer is connected to. In some other settings, a PDU installed in a data center may be a "switched" PDU, meaning the operator can make a logical connection to the PDU (e.g., through an integrated HTTP webserver, etc.) and turn off and on individual power connections or outlets. By way of example only, a switched data center PDU may contain 2 to 20 of these individually switchable outlets, or any other number. When implementing the RFIC in power provider (20) to enable the power management functionality, there may be an added benefit to giving power provider (20) the ability to detect which outlet a power consumer (30) (e.g., server, etc.) is plugged into. For instance, connection between a power cord (40), an individual outlet of power provider (20), and power consumer (30) may be verified with virtual certainty before the operator switches the outlet's power on or off. Other potential benefits will be described in greater detail below, while still others will be apparent to those of ordinary skill in the art in view of the teachings herein.

1. One RFIC Per Outlet

Figure 4:
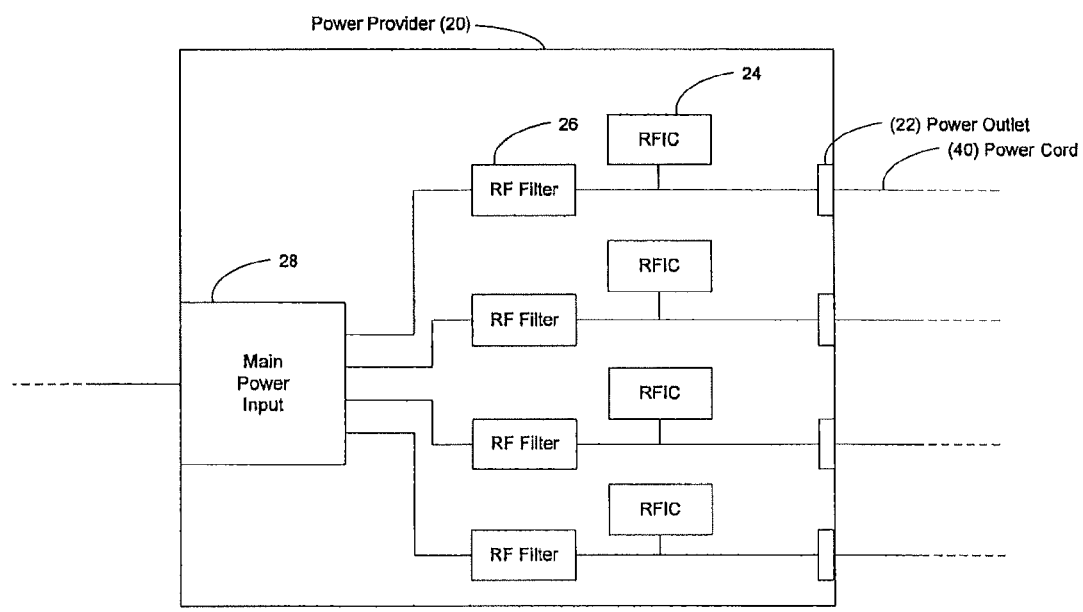
FIG. 4 depicts a schematic view of an exemplary power provider with an individual RFIC dedicated to each power outlet.

In one example, illustrated in FIG. 4, power provider (20) has a plurality of outlets (22) and one RFIC chip (24) per outlet (22). Each outlet (22) may thus have the reliability of a dedicated RFIC (24) for communication through the outlet (22). An RF filter (26) is located between each outlet/RFIC (22, 24) and a main power input (28) to prevent the RF signal generated by each RFIC (24) from internally reaching other outlets (22) or other RFICs (24). When a power cord (40) is connected to power consumer (30) that is capable of powerline communication (e.g., if power consumer includes (30) its own RFIC (24), etc.) is plugged into an outlet (22) of power provider (20), one RFIC chip (24) in power provider (20) will receive an identification signal from power consumer (30) and it may be trivial for the management logic to determine which outlet (22) the power consumer (30) is connected to. In mission-critical installations, this may be preferable, as the signal for each outlet (22) may be isolated relative to signals for other outlets (22), and events on one outlet (22) may not interfere with data communications on another outlet (22).

2. One Switchable RFIC Per Power Provider

Figure 5:
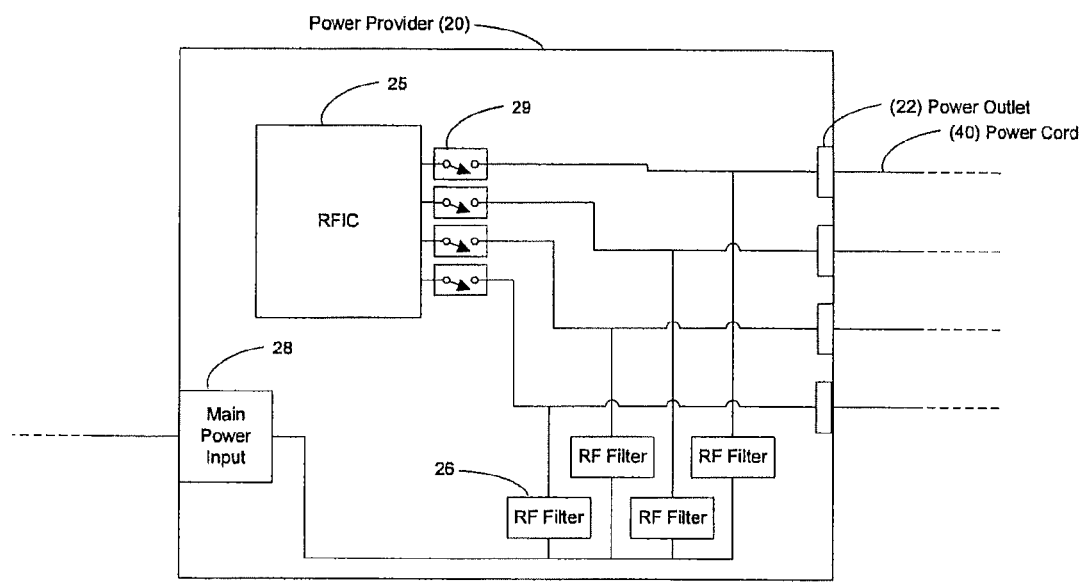
FIG. 5 depicts a schematic view of an exemplary power provider with a global RFIC in communication with a plurality of power outlets.

In another example, illustrated in FIG. 5, a power provider (20) typically comprising two to twenty outlets (22) (only four outlets (22) are shown in FIG. 5, for clarity) is equipped with one global RFIC chip (25) total that can send and receive power management data on all two to twenty outlets (22) simultaneously. This may allow the single RFIC chip (25) to "listen" for new power management data on all outlets (22) simultaneously. Additional equipment in the form of one electronically controlled switch or electronically switchable RF filter (29) added per outlet (22) and/or to inputs at RFIC (25) so that the power management data signal could selectively be allowed or blocked to RFIC (25) for each individual outlet (22) while still permitting power to be communicated through each outlet (22).

By way of example only, in a scenario with an eight-outlet power provider (20), if a new powerline communications-capable power consumer (30) (e.g., a powerline communications-capable server, etc.) is plugged in to outlet (22) number seven for the first time, power provider (20) would detect a the presence of a new powerline communications signal without knowing which outlet (22) it was coming from. Power provider (20) may then initiate a polling routine to determine which outlet (22) the powerline communications signal is coming from. For instance, power provider (20) may first block the powerline communication signal for outlets (22) numbers two through seven so it can listen for the new powerline communication signal only on outlet (22) number one. If power provider (20) did not detect the new signal on outlet (22) number one after a pre-defined timeout period, then it may block the powerline communication signal for outlets (22) number one and three through seven so it can listen for a powerline communication signal only on outlet (22) number two. This process may continue for each successive outlet (22) until power provider (20) finds that the new signal is coming from outlet (22) number seven. Power provider (20) may then re-enable receipt of powerline communication signals from all outlets (22) once again. This version may reduce costs by requiring the addition of only one RFIC (25) in power provider (20), such as to the extent that the switchable powerline communication signal blocking equipment on each individual outlet (22) costs less than adding an RFIC (24) per outlet (22). It should be understood, however, that in the present example, certain time-critical powerline communication data might be missed from outlets (22) that are being blocked during the above polling process, such that the present example may not be ideal for certain settings.

3. Two Switchable RFICs per Power Provider

Figure 6:
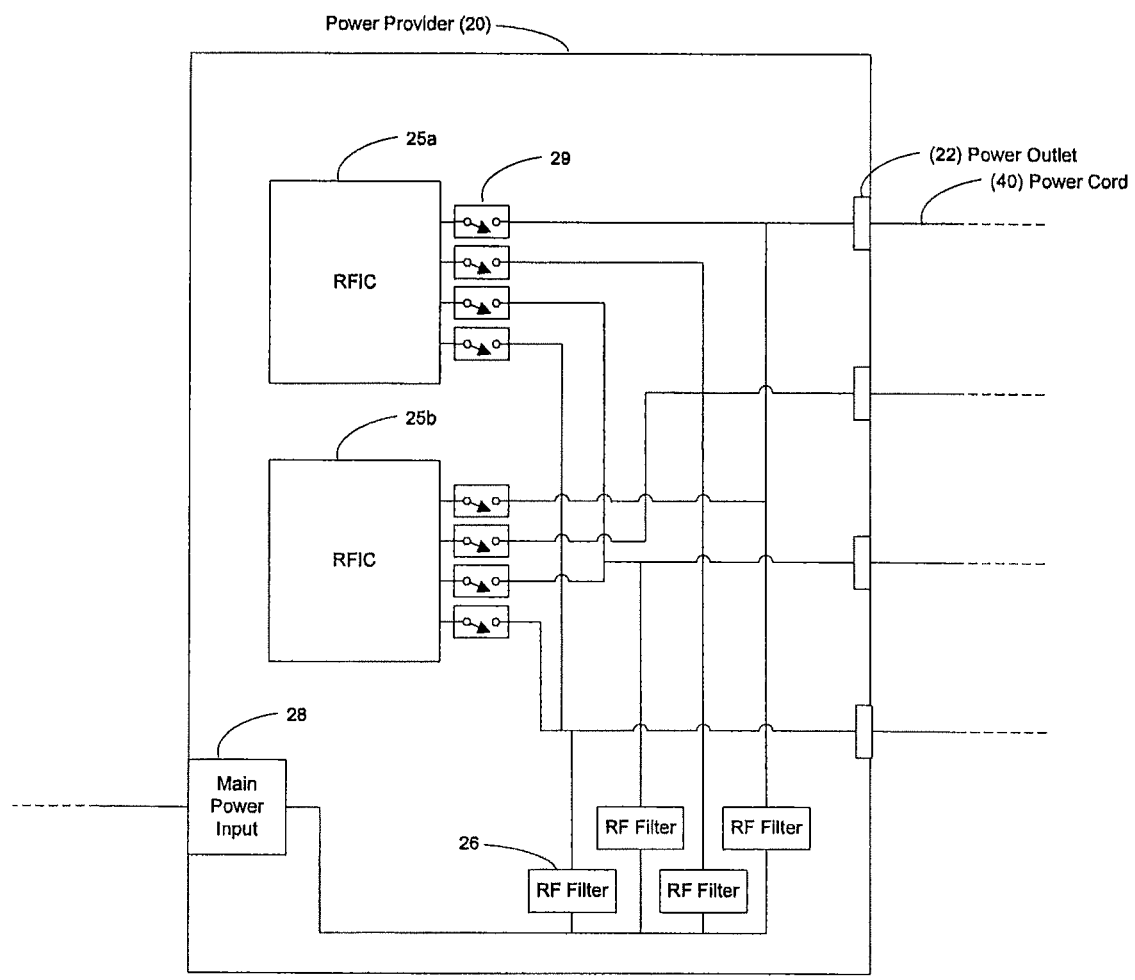
FIG. 6 depicts a schematic view of an exemplary power provider with a pair of RFICs in communication with a plurality of power outlets.

In another example, illustrated in FIG. 6, a power provider (20) is equipped with two global RFIC chips (25a, 25b) that are switchable or operable to block powerline communication data signals from one or more selected outlets (22) on a per-outlet (22) basis. The difference between this example and the example described immediately above is that while one RFIC (25a) may have the powerline communication signal switched off for all outlets (22) except for outlet (22) number seven, the other RFIC (25b) may have powerline communication signals from all outlets (22) switched on except for outlet (22) number seven. This may allow power management system (10) to determine which outlet (22) is the new powerline communication signal source, while also allowing powerline communication data to continue to be handled on all other outlets (22) during the outlet (22) interrogation process. In other words, RFICs (25a, 25b) are collectively configured to receive powerline communication data signals from all outlets (22) at any given time.

In some versions the present example, RFICs (25a, 25b) are configured such that powerline communication signals from all outlets (22) connected to a given RFIC (25a, 25b) is bridged. In other words, a powerline communication signal sent from outlet (22) number one may be bridged through RFIC (25a), such that the same powerline communication signal may also be detected at outlet (22) number two. Such bridging may be blocked or otherwise prevented using any suitable components or techniques, if desired. In addition, RFICs (25a, 25b) of the present example are switchable and are in communication with each other. RFICs (25a, 25b) may thus provide self-test functionality (e.g., switchable RFICs (25a, 25b) may verify communication and proper switching functionality per outlet (22) by communicating with each other one outlet (22) at a time, etc.) and fault-tolerance (e.g., power provider (20) may continue to provide a subset of complete powerline communication functionality if one of the two RFIC chips (25a, 25b) fail, etc.). It should therefore be understood that one of the two RFICs (25a, 25b) in the present example may be able to handle time-critical powerline communication data, such that the two RFICs (25a, 25b) may collectively handle time-critical powerline communication data on a continuous basis. This example may also provide a relative low cost of only two RFIC chips (25a, 25b) per power provider (20) (e.g., compared to the cost of two to twenty RFIC chips (24) to have one RFIC (24) per outlet, etc.). In other versions, RFICs (25a, 25b) are isolated from each other.

4. n+1 RFICs Per Power Provider

Figure 7:
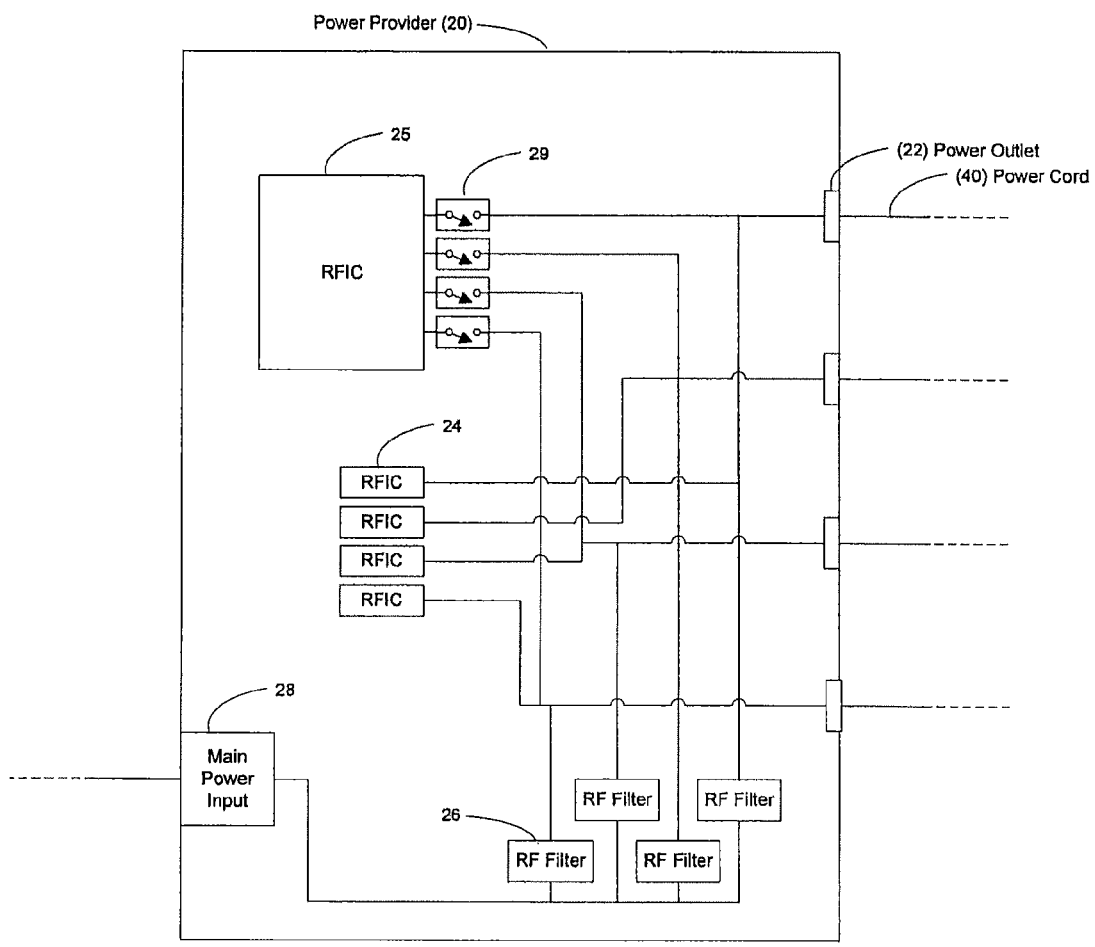
FIG. 7 depicts a depicts a schematic view of an exemplary power provider with a global RFIC in communication with a plurality of power outlets, as well as an individual RFIC dedicated to each power outlet.

In another example, illustrated in FIG. 7, a power provider (20) has outlet-dedicated RFICs (24) and a global switchable RFIC (25), providing enhanced fault-tolerance and self-test functionality. Each dedicated RFIC (24) per outlet (22) may communicate with global switchable RFIC (25) to verify functionality and provide self-test capabilities. Additionally, if any one dedicated RFIC (24) fails, then global RFIC (24) may function in its place. If a new powerline communication signal is detected by global RFIC (25) and by none of the remaining functional dedicated RFICs (24), then by deduction it may be determined that the new powerline communication signal is coming from the one outlet (22) attached to the failed dedicated RFIC (24). While not shown in FIG. 5, an RF filter (26) may also be included between each dedicated RFIC (24) and global RFIC (25), if desired.

5. Power Load Detection with One RFIC Per Power Provider

Figure 8:
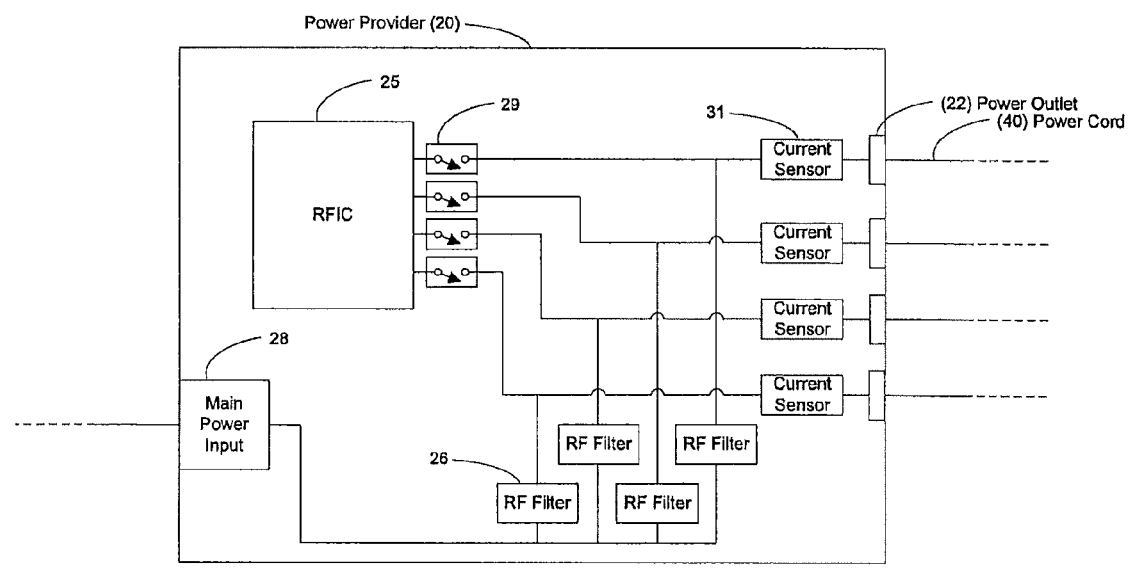
FIG. 8 depicts a schematic view of an exemplary power provider with a global RFIC in communication with a plurality of power outlets, as well as an individual power current usage detector dedicated to each power outlet.

In yet another example, illustrated in FIG. 8, power provider (20) has a global RFIC (25) (which may or may not be switchable) but relies primarily on circuitry (31) that detects individual power current usage per outlet (22) to determine which outlet (22) a new power consumer (30) is introduced to. If a new powerline communication signal is detected by global RFIC (25), and at the same time the power usage from one outlet (22) goes from zero current to a detectable current, then it can be determined with some degree of certainty which outlet (22) the new power management signal is coming from. Suitable circuitry (31) for detecting individual power current usage, such as an individual Hall effect sensor per outlet (22), will be apparent to those of ordinary skill in the art in view of the teachings herein. For instance, an off-the-shelf power provider (20) may already have preexisting circuitry (31) for detecting individual power current usage per outlet (22) (e.g., in terms of whether current is flowing or not and/or in terms of how much current is flowing, etc.).

6. One Switched RFIC and One Global RFIC Per Power Provider

Figure 9:
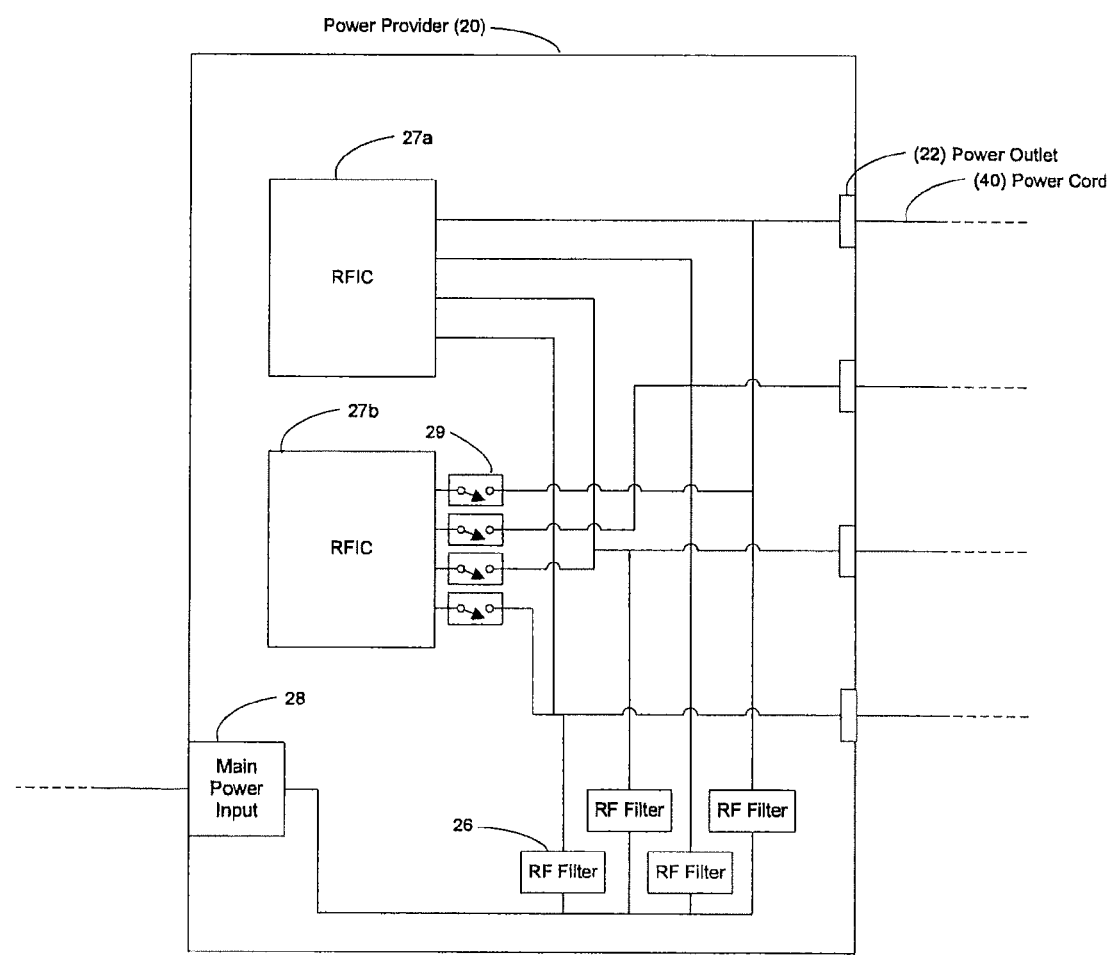
FIG. 9 depicts a schematic view of another exemplary power provider with a pair of RFICs in communication with a plurality of power outlets.

In another example, depicted in FIG. 9, a power provider (20) comprises a pair of RFICs (27a, 27b) that are arranged similarly to RFICs (25a, 25b) depicted in FIG. 4. However, in this example, one RFIC (27a) is configured such that it always connected to send and receive powerline communication data on all outlets (22) at all times (with bridging prevention); while the other RFIC (27b) is switchable or operable to block powerline communication data signals from one or more selected outlets (22) on a per-outlet (22) basis. In this example, RFIC (27b) is responsible only for determining which outlet (22) is associated with a new powerline communication data source. RFIC (27a) is responsible for handling all time-critical powerline communication data, which it can continue to do while RFIC (27b) simultaneously interrogates individual outlets (22).

It should be understood that the two RFIC chips (27a, 27b) may communicate with each other to provide both self-test functionality (e.g., switchable RFIC (27b) may verify communication and proper switching functionality per outlet (22) by communicating with primary RFIC (27a), etc.) and fault-tolerance (e.g., power provider (20) may continue to provide a subset of complete powerline communication functionality if one of the two RFIC chips (27a, 27b) fail, etc.). This example may also provide a relative low cost of only two RFIC chips (27a, 27b) per power provider (20) (e.g., compared to the cost of two to twenty RFIC chips (24) to have one RFIC (24) per outlet, etc.). It should also be understood that RFICs (27a, 27b) may be coupled with each other or isolated from each other, as desired.

7. One NBRFIC Per Outlet and One Global RFIC

Figure 10:
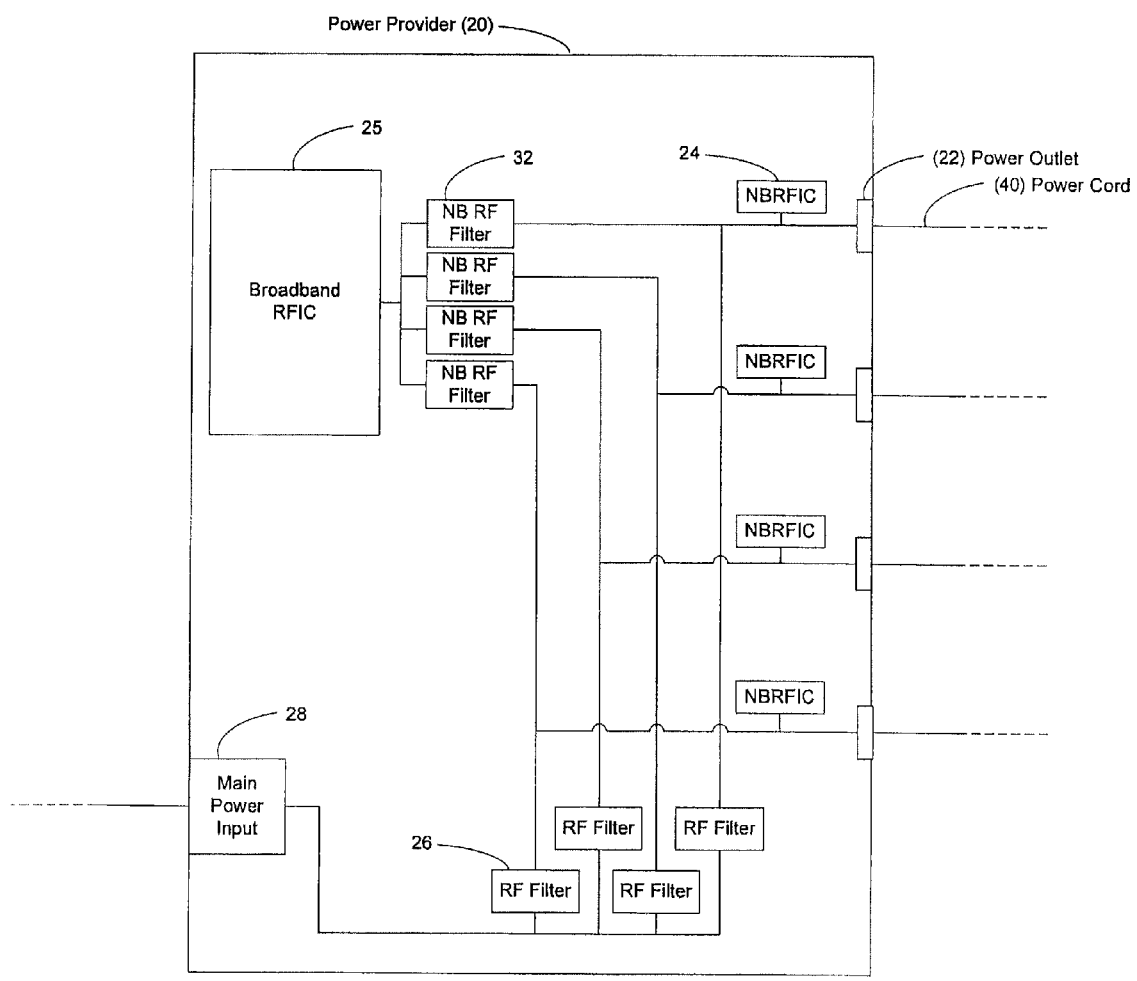
FIG. 10 depicts a schematic view of an exemplary power provider with a global RFIC in communication with a plurality of power outlets, as well as an individual RFIC dedicated to each power outlet with RF filters.

With the availability of multiple powerline communications standards, there are options for different standards to be used at the same time to accomplish one or more power management functionalities. One such example, illustrated in FIG. 10, would be to use one low-cost narrowband communications RFIC (24) chipset per outlet (22) to positively identify exactly which outlet (22) a power consumer (30) is plugged into, but then have one global higher-cost Broad-Band RFIC chip (25) for broadband high-speed communications servicing all outlets (22) simultaneously. The narrowband communications may be isolated to each outlet (22) by use of notch RF filters (32) tuned to the frequency range used by the Narrow Band RFIC (24) while allowing the broadband RFIC signal to pass between the global RFIC chip (25) and all outlets (22).

Figure 30:
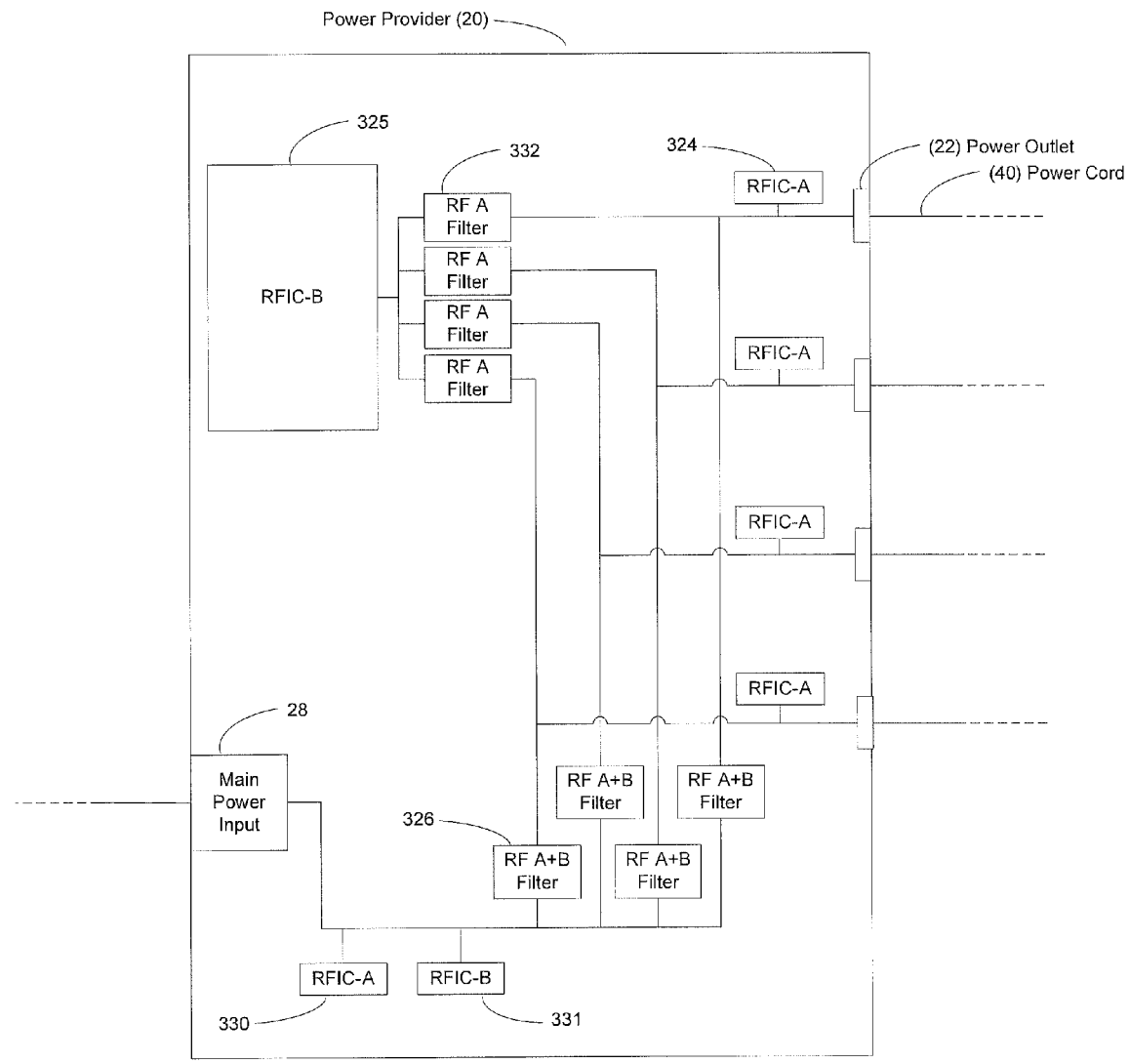
FIG. 30 depicts a schematic view of an exemplary power management system operable in non-overlapping frequency ranges with discrete RF filtering.

An additional example, illustrated in FIG. 30, would be to use two similar-capability RFIC chipsets (324, 325) which are configured to operate in non-overlapping frequency ranges which can be purposefully and discretely filtered out separately. In this case, an RFIC chipset may be configured to operate in radio frequency range "A" (RFIC-A) (324), which merely as an example may be 30-35 MHz, and another RFIC chipset configured to operate in radio frequency range "B" (RFIC-B), which merely as an example may be 45-50 MHz, where frequency ranges for RFIC-A (324) and RFIC-B (325) do not intersect or overlap. In this example, even though the communication capabilities of both RFIC-A (324) and RFIC-B (325) may be identical, by virtue of the distinct frequency ranges being used it will be evident to one of ordinary skill in the art how to implement RF A Filter (332) to filter and block the RF signals used by RFIC-A (324) without functionally impeding the RF signal of RFIC-B (325) present on the same power line, and vice-versa. Additionally, an RF filter (326) that can block RF signals used by both RFIC-A (324) and RFIC-B (325) can be used to isolate the RF signals used for communication with power consumers (30) through Power Outlets (22) from distinct and separate RF signals using the same frequencies for communications through the Main Power Input (28) by virtue of an additional RFIC-A (330) and RFIC-B (331) connected on the same side of the RF A+B Filters (326). It should be noted that in some implementations either RFIC-A (330) or RFIC-B (331) might not be needed if either could be configured to communicate on all the frequencies used separately by RFIC-A (330) and RFIC-B (331).

8. Redundant RFICs

For any of the above mentioned examples, it should be understood that any single RFIC (24, 25, 25a, 25b, 27a, 27b) could be replaced with two or more RFICs (24, 25, 25a, 25b, 27a, 27b) with identical connections so that if any one RFIC (24, 25, 25a, 25b, 27a, 27b) fails there will be other RFICs (24, 25, 25a, 25b, 27a, 27b) to provide continued functionality in the failed one's place. Other ways in which the failure of one or more RFICs (24, 25, 25a, 25b, 27a, 27b) may be addressed will be apparent to those of ordinary skill in the art in view of the teachings herein.

9. "Upstream" RFIC and "Downstream" RFIC

Figure 19:
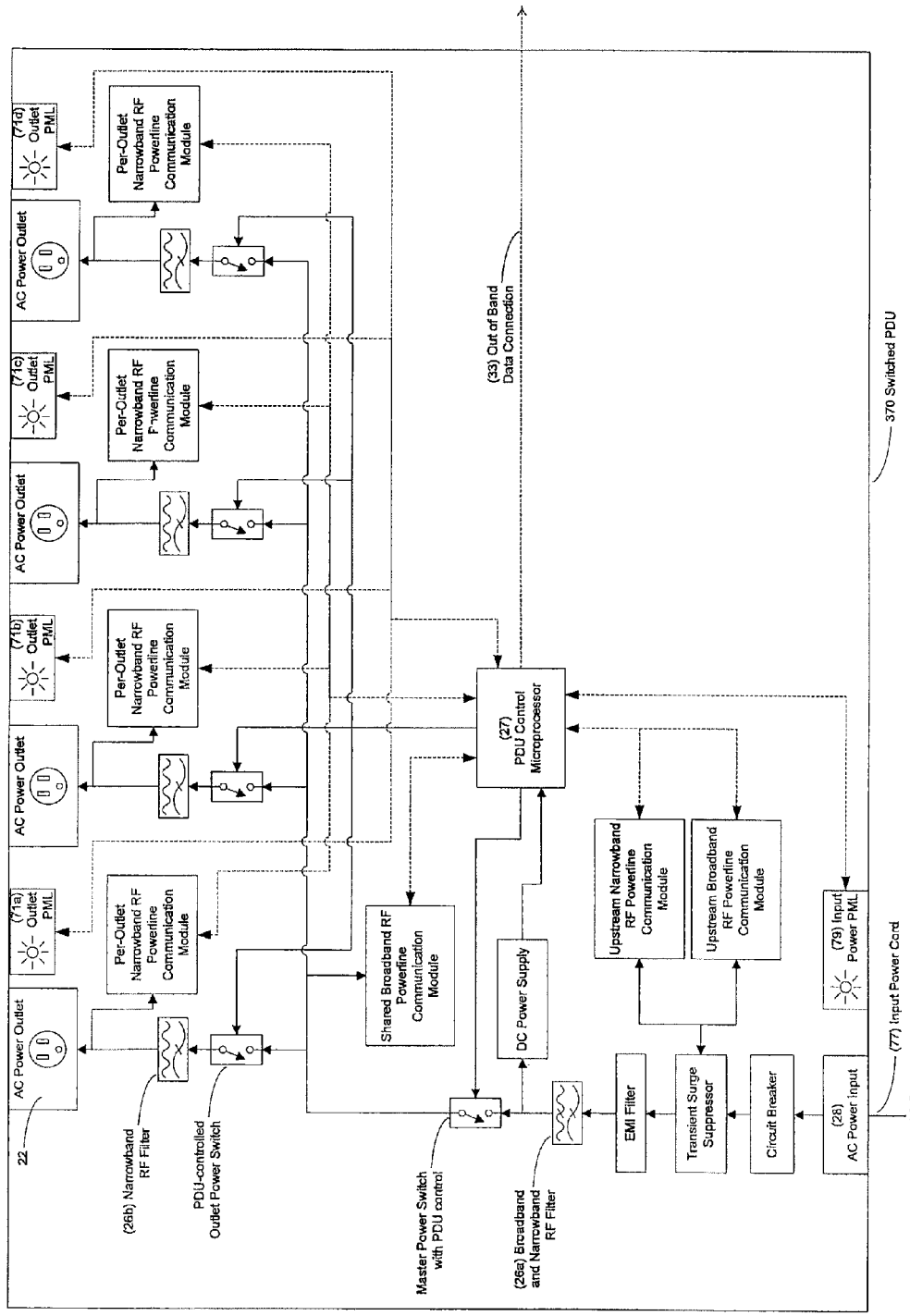
FIG. 19 depicts a schematic view of an exemplary power strip device incorporating power management lights.

Regardless of whether redundant RFICs (24, 25, 25a, 25b, 27a, 27b) are provided as described above, it should also be understood that any of the power providers (20) shown in FIGS. 4-10 and described above (as well as any other power provider described herein) may have at least two types of RFICs, with at least one RFIC being used for "upstream" powerline communications and with at least one other RFIC being used for "downstream" powerline communications. For instance, it will be understood in view of the teachings herein that a power provider (20) may be coupled between another power provider (20) and a power consumer (30), such that a power provider (20) essentially serves a dual role as both a power provider (20) and a power consumer (30). The one or more "upstream" RFIC in such a "dual role" power provider (20) could be used for powerline communications between such a "dual role" power provider (20) and an upstream power provider (20). The one or more "downstream" RFIC may be used for powerline communications between such a "dual role" power provider (20) and one or more downstream power consumers (30). Such "upstream" RFICs and "downstream" RFICs may be configured and arranged in accordance with RFICs (24, 25, 25a, 25b, 27a, 27b) shown in FIGS. 4-10 and described above; or they may have any other suitable configuration or arrangement. Furthermore, any power provider (20) described herein may be configured with "upstream" RFICs and "downstream" RFICs, if desired. By way of example only, an example of a power provider (20), in the form of a switched PDU (370), having "upstream" RFICs and "downstream" RFICs is shown in FIG. 19 and is described in greater detail below. Of course, a power provider (20) may simply have one type of RFIC, including but not limited to an RFIC type dedicated just to "upstream" powerline communication, an RFIC type dedicated just to "downstream" powerline communication, or an RFIC type configured for both "upstream" and "downstream" powerline communication. Other suitable configurations and arrangements will be apparent to those of ordinary skill in the art in view of the teachings herein.

10. RFIC Adapter

Figure 12:
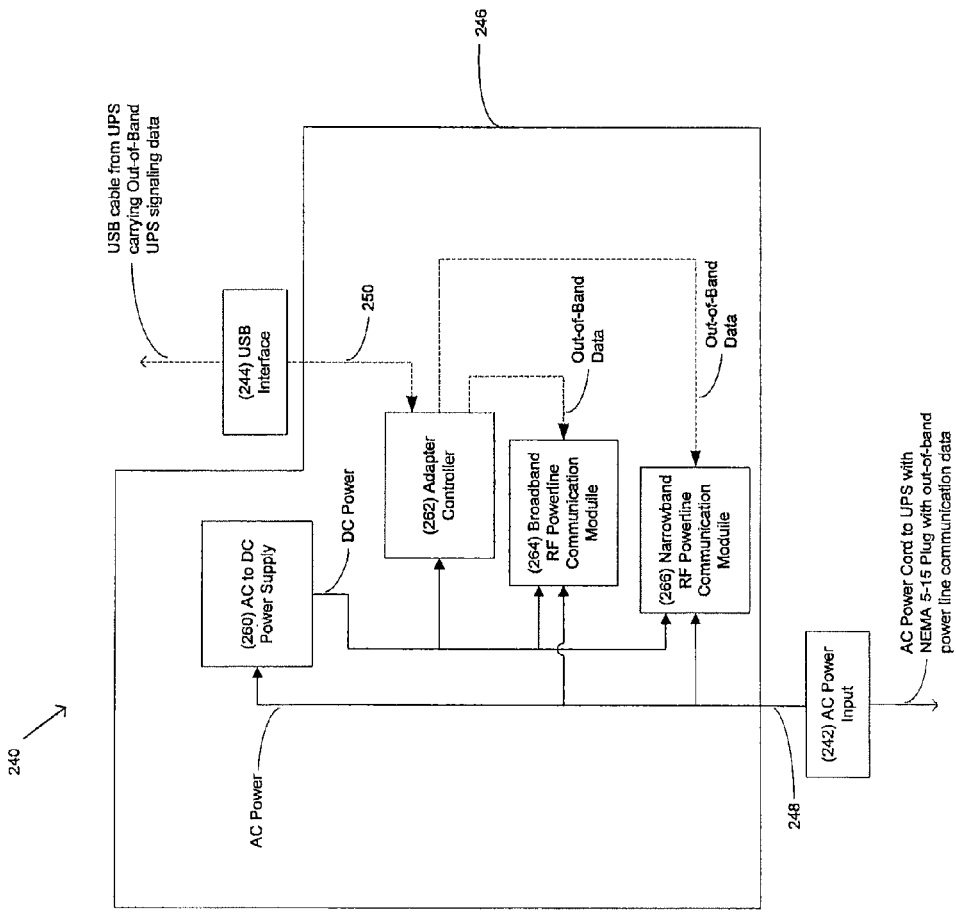
FIG. 12 depicts a schematic view of the adapter of FIG. 11.
Figure 16:
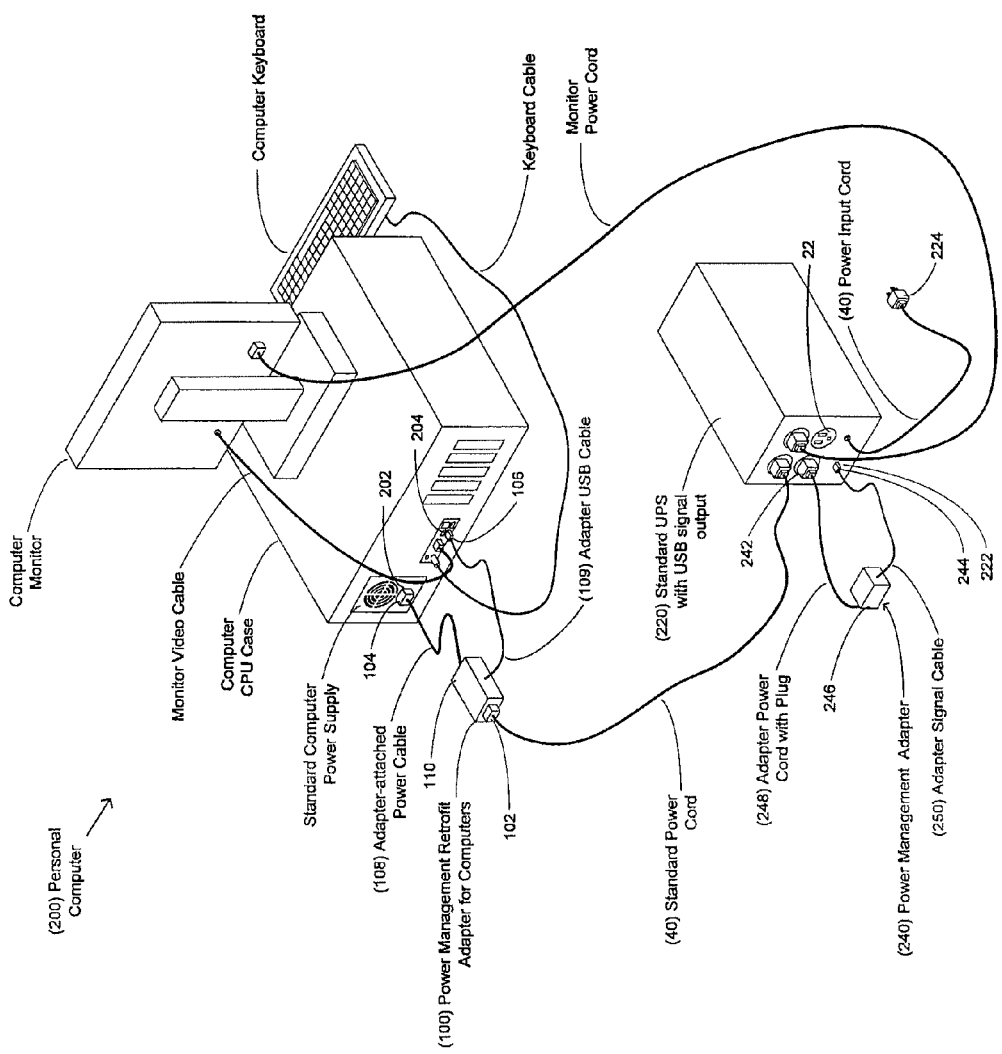
FIG. 16 depicts the adapter of FIG. 13 coupled with a conventional PC and coupled with a UPS, which is also coupled with the adapter of FIG. 11.

In some settings, it may be desirable to incorporate powerline communication into a conventional power provider (30) without having to disassemble the power provider (30). In other words, it may be desirable to essentially retrofit an RFIC device with a legacy power provider (30). One merely illustrative example of how this may be done is illustrated in FIGS. 11-12 and 16. In particular, an exemplary power management adapter (240) includes two connectors (242, 244) and a control box (246). Connector (242) comprises a conventional three-prong power plug in this example, and is coupled with control box (246) via a conventional power cable (248). In some versions, cable (248) is integrally attached to control box (246). In some other versions, cable (248) is selectively removable from control box (246) (e.g., such that a user may unplug cable (248) from control box (246) for replacement, etc.). Connector (244) comprises a conventional USB plug in this example (e.g., RJ45), and is coupled with control box (246) via a conventional USB cable (250). In some versions, cable (250) is integrally attached to control box (246). In some other versions, cable (250) is selectively removable from control box (246) (e.g., such that a user may unplug cable (250) from control box (246) for replacement, etc.). It should be understood that connectors (242, 244) may be substituted with any other suitable type of connector; and that cables (248, 244) may be substituted with any other suitable type of cable.

As shown in FIG. 16, adapter (240) is configured to couple with a conventional uninterruptible power supply (UPS) (220). In particular, UPS (220) of this example has four power outlets (22) and a USB outlet (222). UPS (220) also includes a conventional power cord (40) with a conventional three-prong plug (224). Three-prong plug (224) is configured to plug into any suitable source of power, such as a standard AC wall outlet, another power provider (30), etc., to provide power to UPS (220). Adapter (240) is coupled with UPS (220) in this example by plugging connector (242) of adapter (240) into one of the outlets (22) of UPS (220); and by coupling connector (244) of adapter (240) with outlet (222) of UPS (220).

As shown in FIG. 12, control box (246) of the present example includes a rectifier (260) in communication with connector (242). Rectifier (260) is configured to convert AC power received through connector (242) to DC power. Rectifier (260) is further in communication with a controller (262), a broadband powerline communication module (264) and a narrowband powerline communication module (266). Connector (242) is also in direct communication with modules (264, 266) in this example. In addition, modules (264, 266) are in communication with controller (262) in this example. Controller (262) is further in communication with connector (244). Rectifier (260) may comprise a conventional rectifier, while controller (262) may comprise a conventional microprocessor or other suitable type of controller. Modules (264, 266) may comprise RFICs or any other suitable components. Thus, by coupling adapter (240) with UPS (220), UPS (220) may be provided with powerline communication capabilities.

Figure 21:
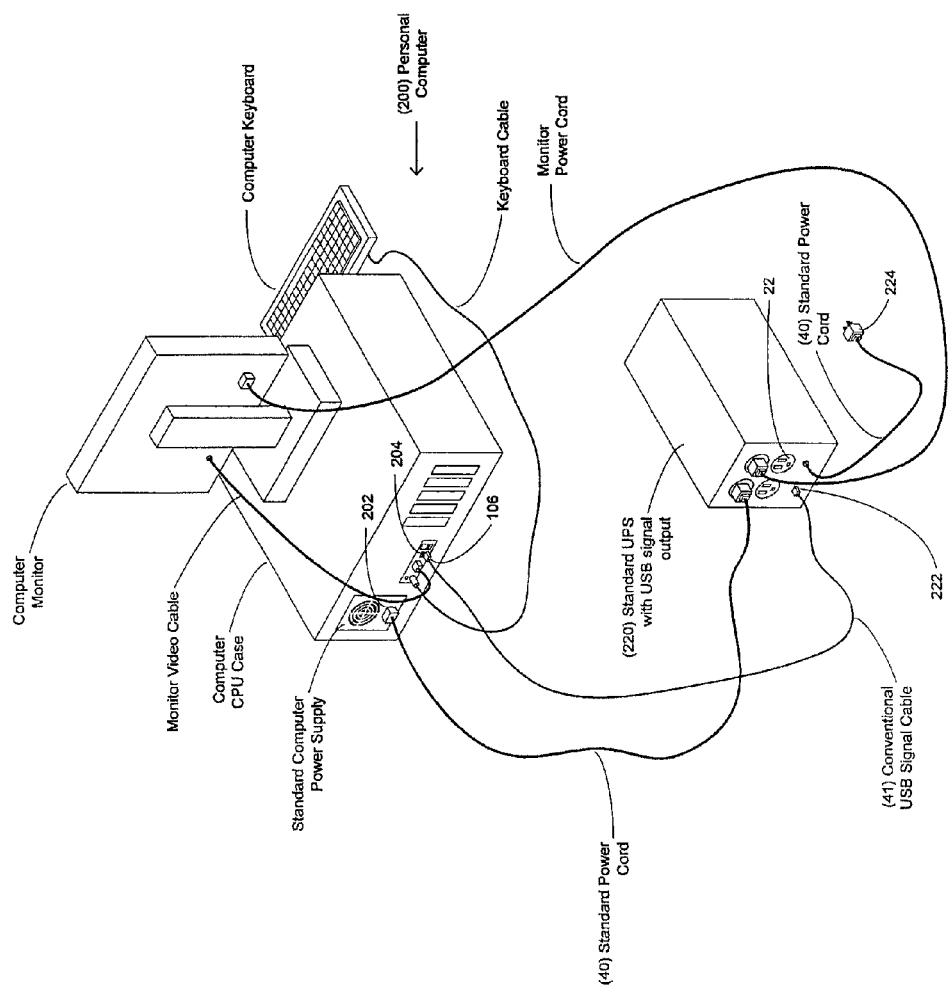
FIG. 21 depicts a perspective view of a conventional personal computer coupled with a conventional UPS power provider.
Figure 22:
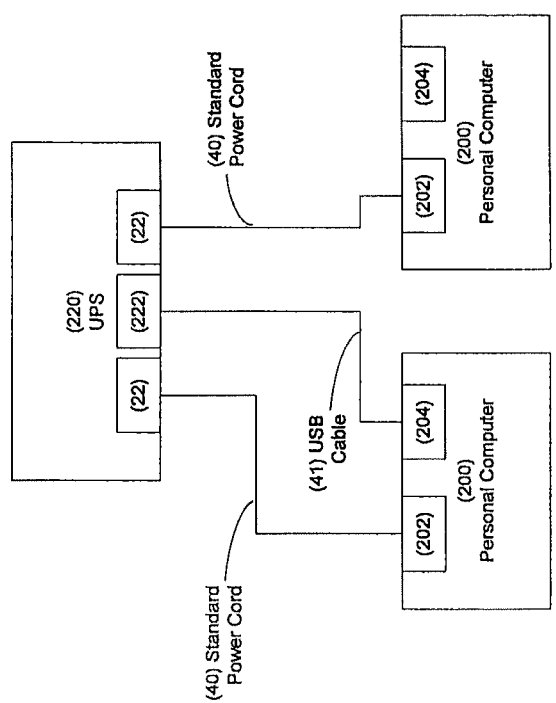
FIG. 22 depicts a schematic view of two conventional personal computers coupled with a single conventional UPS power provider.
Figure 23:
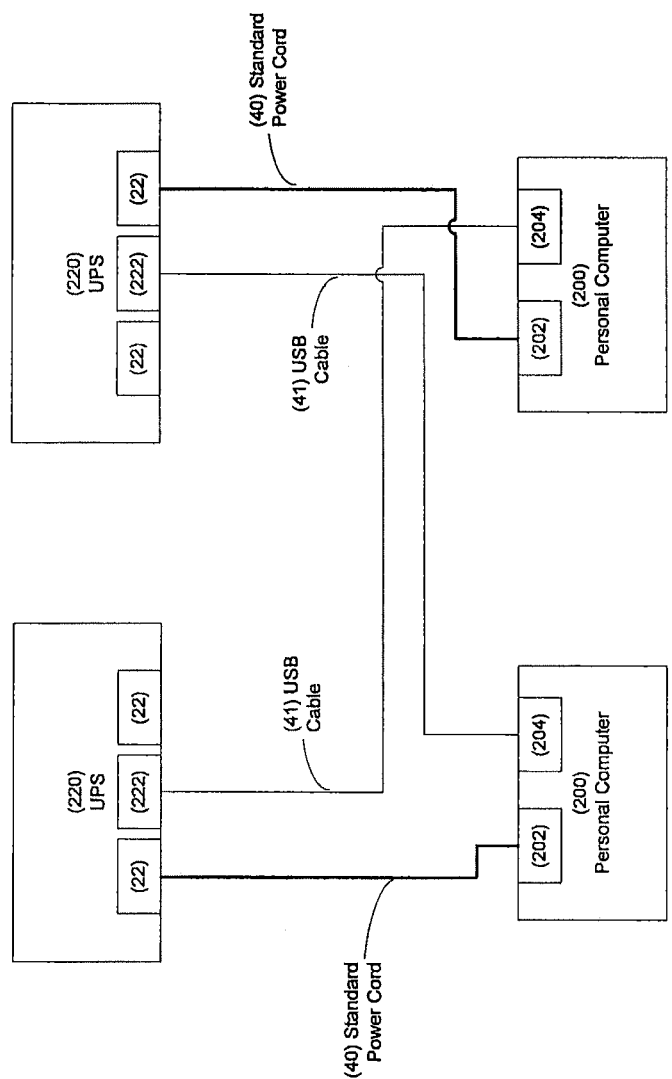
FIG. 23 depicts a schematic view of two conventional personal computers coupled with two conventional UPS power providers.

Prior art conventional operation of the UPS (220) as shown in FIG. 21 may include sending a signal through the USB communication port (222), through the conventional USB signal cable (41), into the conventional Personal Computer (200) via standard USB port (204). When the main power input to the UPS (220) is interrupted and the UPS (220) begins to operate on internal battery power, a signal may be periodically sent through the USB port (222), through the USB cable (41), and into the computer's USB port (204) with information that indicates the UPS (200) is operating on battery power and an estimated time until the battery power is exhausted. The Personal Computer (200) can then wait until a configured amount of estimated battery runtime is reached and then perform automated operations to save or store critical information on persistent storage, such as a hard disk drive, flash memory, or storage server via an optional network or internet connection. Of special note is that in FIG. 21 the USB communication cable (41) could be accidentally disconnected and the Personal Computer (200) could continue to operate but not get any notification if the UPS (220) switches to battery power and the battery is near exhaustion. Also of special note is that if two or more Personal Computers (200) are powered by a single UPS (220) as shown in FIG. 22, then only one Personal Computer (200) may have the USB cable (41) connected to get notified of battery power exhaustion, and the second Personal Computer (200) may not get notifications. Of further special note is that if two or more UPS devices (220) are provided for two or more Personal Computers (200) then use of multiple USB cables (41) may allow the USB cable (41) and the power cable (40) for a given Personal Computer to not be connected to the same UPS (220) as shown in FIG. 23.

The use of RFIC retrofit adapters (100, 240), such as those shown in FIG. 16, may improve the above situation by reducing the cable complexity. There are no longer USB cables necessarily connected between the Personal Computer (200) and the UPS (220), yet by virtue of the Powerline Communication capabilities of the USB retrofit adapters (100, 240), the notification signal generated by the UPS (220) is sent out its USB communication port (222) into the UPS adapter (240), transmitted via Powerline Communication over Standard Power Cord (40), received by the personal computer adapter (100), and sent into the personal computer (200) via USB port (204). The path of the USB signal from the UPS (220) to the personal computer (200) is different than in conventional systems, but the destinations are ultimately the same in this example. It should be understood that Powerline Communication is designed to allow transmission of a data signal through all standard metal conductors that share the same power source including electrical outlets (22), so in this case the UPS adapter (240) transmits a signal through attached power cord (248) into the power outlet (22) and the signal propagates through the plurality of outlets (22) and into power cords (40) plugged into the outlets (22) and therefore reaches the computer adapter (100) where the Powerline signal is converted back into a USB signal. It should also be understood that some USB and/or other dedicated signaling cable implementations may have distance limitations (e.g., 3 meters or 10 meters, etc.). By contrast, Powerline Communication may have distance limitations of hundreds or thousands of meters, so the Standard Power Cord (40) may be of significantly greater length than a properly functioning USB cable may be. Those of ordinary skill in the art will find that the Standard Power Cord (40) may be replaced or functionally lengthened with additions of extension cords between Standard Power Cord (40) and UPS (220), or UPS (220) may be of the type that is wired directly into power circuits in a home, office, server room, or data center, etc. It should be understood that benefit may be found by allowing increased distances and physical barriers to separate the Personal Computer (200) and the UPS (220) without requiring additional lengths of USB or other dedicated signaling cables between the Personal Computer (200) and the UPS (220). It should also be understood that this principle may be realized in virtually any example described herein, including those where an RFIC is integrated into one or more system components, and that this principle is not limited to the examples of an RFIC being part of an RFIC retrofit adapter (100, 240).

It should be understood that the adapters (100, 240) may be modified in various ways. For instance, control box (246) may include only one of modules (264, 266) instead of including both. Another merely exemplary modification may be that the UPS adapter (240) may be reconfigured to resemble the computer adapter (100) in that it has both a power input cord and a power output receptacle so that the adapter (240) is placed in-between the UPS (220) and the computer (200) and the powerline communication signal does not have to pass through the UPS outlets (22). Other ways in which adapter (240) may be varied or modified will be apparent to those of ordinary skill in the art in view of the teachings herein. Furthermore, while a UPS (220) is shown in FIG. 16, it should be understood that adapter (240) may alternatively be coupled with any other suitable type of power provider (30).

B. Exemplary Incorporation of RFIC Between Power Provider and Power Consumer

The above examples include incorporating one or more RFICs into a power provider (20). It should be understood, however, that one or more RFICs may be incorporated in a variety of other locations, in addition to or in lieu of having an RFIC incorporated into a power provider (20). For instance, several examples of ways in which one or more RFICs may be incorporated somewhere between a power provider (20) and a power consumer (30) are described in detail below. Of course, the below examples are merely illustrative, and various other examples will be apparent to those of ordinary skill in the art in view of the teachings herein.

1. RFIC Adapter

A legacy computer system that does not have built-in power management capability may be retrofitted with a power management adapter. An exemplary power management adapter (100) is depicted in FIGS. 13-14. Power management adapter (100) of this example has two connectors (104, 106). Power cord receptacle (102) accepts the end of a conventional computer power cord (e.g., which may be coupled with an output (22) of a power provider (20), etc.), the second connector (104) plugs into the power supply input receptacle (202) of a power consumer (30), and the third connector is a signal connector (106). Signal connector (106) could be USB, RS232, firewire, or any other computer connection types that would be supported by operating system drivers so the computer can communicate through power management adapter (100). Connector (106) may be coupled with power consumer (30) (e.g., server, computer, or any other suitable device). Connectors (104, 106) may be coupled with a control box (110) via cables (108, 109). In the present example, connector (102) is integral with control box (110), though it should be understood that connector (102) may alternatively be coupled with control box (110) via a cable (108) that may be of modular design; and connector (106) is integral with control box (110), though it should be understood that connector (106) may be alternatively be coupled with control box (110) via a cable (109) that may be of modular design. Control box (110) may include an RFIC chip (112) and supporting electronics and logic (114). Control box (110) may permit communication of power management data signals therethrough (e.g., from connector (102) to connector (106) and/or from connector (106) to connector (102)); as well as communication of electrical power (e.g., from connector (102) to connector (104)). Other suitable ways in which a power management adapter (100) may be configured will be apparent to those of ordinary skill in the art in view of the teachings herein.

FIG. 16 depicts an example of adapter (100) being coupled with a conventional PC (200) and a UPS (220). As shown, PC (200) includes a power supply input (202) and a USB port (204). Connector (104) is coupled with power supply input (202) to communicate power to PC (200). Connector (106) is coupled with USB port (204) to provide communication of data/commands/etc. from PC (200) to port (102) and/or from port (102) to PC (200). As described herein, control box (110) may be configured to transmit data/commands/etc. that are received through connector (102) to connector (106). Likewise, control box (110) may be configured to transmit data/commands/etc. that are received through connector (106) to connector (102). Data/commands/etc. that are transmitted to or from connector (102) may be further communicated to or from a conventional power cord (40), which is coupled with connector (102), using powerline communication as described herein. In this example, power cord (40) is coupled with UPS (220), and is able to further communicate data/commands/etc. to or from UPS (220). In addition, power cord (40) also communicates power, which it also receives from UPS (220), to PC (200). UPS (220) in this example has been retrofitted with an adapter (240) to provide powerline communication capability to UPS (220) as described in greater detail above. However, it should be understood that UPS (220) may be substituted with an alternative UPS, some other type of power provider (20) that is coupled with adapter (240), or some other power provider (20) that already has powerline communication capabilities.

Figure 15:
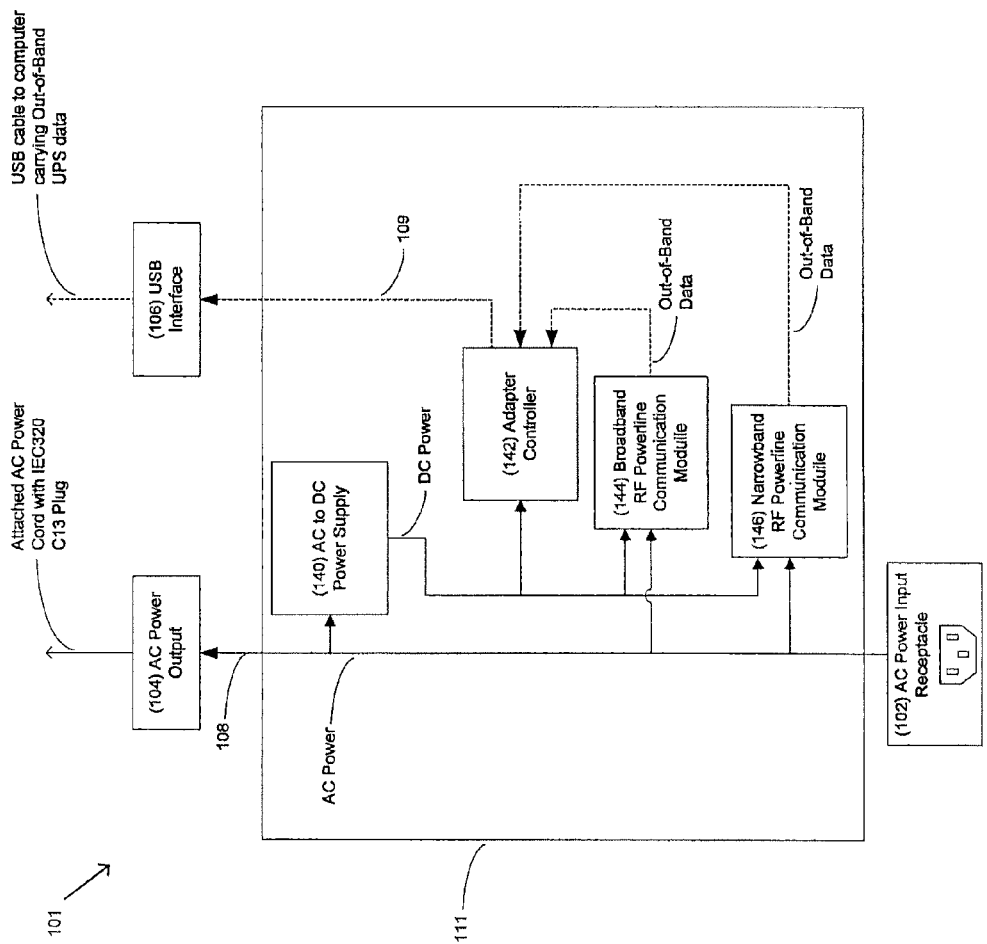
FIG. 15 depicts a schematic view of an exemplary alternative power management adapter for a power consumer.

A variation of adapter (100) is shown in FIG. 15. In this example, adapter (101) comprises three connectors (102, 104, 106). Connectors (102, 104, 106) of adapter (101) in this example are essentially the same as connectors of adapter (100) described above. Connectors (104, 106) of this example are coupled with a control box (111) via cables (108, 109). In the present example, connector (102) is integral with control box (111), though it should be understood that connector (102) may alternatively be coupled with control box (111) via cables (108, 109). Control box (111) of this example includes a rectifier (140) in communication with connector (102). In some versions, rectifier (140) is actually more than just a rectifier. For instance, rectifier (140) may include a voltage converter such as a transformer and/or transistors and integrated circuits to regulate the DC output voltage. Thus, use of the term "rectifier" herein should not be read as implying that a rectifier must only be capable of converting AC into DC, as it is contemplated that a rectifier as referred to herein may have various additional functionalities and components. Rectifier (140) of the present example is of course configured to convert AC power received through connector (102) to DC power (of possibly another voltage). Rectifier (140) is further in communication with a controller (142), a broadband powerline communication module (144) and a narrowband powerline communication module (146). Connector (102) is also in direct communication with modules (144, 146) in this example. In addition, modules (144, 146) are in communication with controller (142) in this example. Controller (142) is further in communication with connector (106). Rectifier (140) may comprise a conventional rectifier, while controller (142) may comprise a conventional microprocessor or other suitable type of controller. Modules (144, 146) may comprise RFICs or any other suitable components.

It should therefore be understood that control box (111) may permit communication of power management data signals therethrough (e.g., from connector (102) to connector (106) and/or from connector (106) to connector (102)); as well as communication of electrical power (e.g., from connector (102) to connector (104)). Of course, other versions of control box (111) may include only one of modules (144, 146) instead of including both. Other suitable ways in which a power management adapter (100, 101) may be configured will be apparent to those of ordinary skill in the art in view of the teachings herein.

2. RFIC in Power Cord

Figure 17:
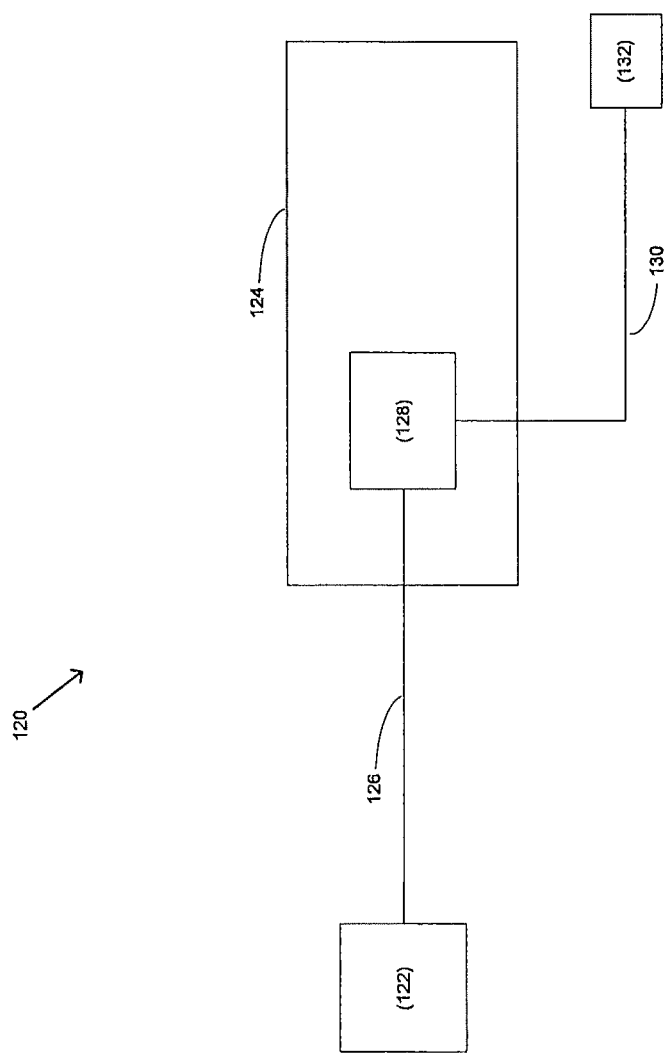
FIG. 17 depicts a schematic view of an exemplary modified power cord.

FIG. 17 depicts an exemplary power cord (120), which has connectors (122, 124) that are coupled via a cable (126). Cable (126) comprises a conventional power cord (e.g., two meters long, etc.). Connector (122) is configured to couple with an output (22) of a power provider (20); while connector (124) is configured to couple with a power consumer (30) (e.g., the power input of a computer power supply). Connector (124) of this example also includes an RFIC chip (128) and a cable (130) extending therefrom. A signal connector (132) is coupled with cable (130). Signal connector (132) could be USB, RS232, firewire, or any other computer connection types that would be supported by operating system drivers so the computer can communicate through power cord (120). Connector (132) may be coupled with power consumer (30) (e.g., server, computer, or any other suitable device). Other suitable ways in which a power cord (120) may be configured will be apparent to those of ordinary skill in the art in view of the teachings herein.

3. Replacement Power Supply with RFIC and USB Connector

A legacy computer system that does not have built-in power management capability may be retrofitted with a replacement power supply (e.g., one that is integral with a PC or integral with some other component of a computer system) that incorporates an RFIC and an interface to the legacy computer system by means of a signal connector (106). Such a replacement power supply may be coupled with any power provider (20) described herein (or any suitable variation thereof) by a power cord (40). Signal connector (106) could be USB, RS232, firewire, or any other computer connection types that would be supported by operating system drivers so the computer can communicate through the replacement power supply. Replacement power supply may provide communication of power management data signals generated by its own means, handle power switching and manipulation requested by a power provider (20), as well as allow data communication to and from the legacy computer system. Other suitable ways in which a replacement power supply may be configured will be apparent to those of ordinary skill in the art in view of the teachings herein.

4. RFIC Integrated in Power Supply Supported by ACPI (Advanced Configuration and Power Interface) with Data Link via USB, NDIS, or PCI connection A computer system that is designed to support management through powerline communications may incorporate one or more RFIC modules in the power supply itself with specialized dedicated data link between the power supply and the motherboard. This data link could take the form of a USB, NDIS, PCI, PCI-express, or other suitable low bandwidth or high bandwidth data link that can be enumerated with ACPI (and/or other proprietary or standards-based protocol) for recognition by the computer system's operating system. The RFIC and its supporting electronics may directly interface with the power supply circuitry to allow control and management of the power state of the computer via powerline communications, independent of the motherboard.

5. Integrated in Motherboard via RF Cable From Power Supply

A computer system that is designed to support management through powerline communications may incorporate one or more RFIC modules in the motherboard itself with a specialized RF cable which may connect from the motherboard to the power supply (e.g., the power supply that is internal to the computer system and coupled with a power provider (20)), the power outlet, or any other appropriate place where the RF cable can make a connection to allow the RF signal to be transmitted and received through the computer's power connection (e.g., the power connection by which the computer system's power supply is coupled with a power provider (20) via a cable (40)). This approach may allow for great flexibility in the form the data connection can take, such as PCI, PCI-express, direct motherboard chipset integration, or any other means which allows, BIOS, ACPI, or other proprietary or standards-based means for recognition and interaction by the computer system's operating system. In some versions of this implementation, the RFIC may have a direct connection to the power supply to control power states (e.g., power states within the computer system), or the RFIC may act via its connection to the existing motherboard components to control the power supply state (e.g., the state of the power supply within the computer system).

6. Integrated in Power Supply with Direct Connection to IPMI or Lights Out Management Unit A computer system that is designed to support management through powerline communications may contain IPMI (Intelligent Platform Management Interface) or other forms of Lights Out Management to manage aspects of computer configuration and operation when the computer has a power connection but is operationally powered off in addition to when the computer is powered on and fully operational. The computer system may incorporate one or more RFIC modules that directly communicate with the Lights Out Management unit via serial interface, USB, firewire, Ethernet, or any other type of data link that would be apparent to those of ordinary skill in the art in view of the teachings herein. The Lights Out Management unit may have direct control and management of the power state of the computer, as well as, but not limited to, computer health metrics such as temperatures, fan speeds, and voltage levels. Therefore, by providing a data link between the RFIC and the Lights Out Management unit, a great deal of management functionality may be available directly through the powerline communication. The RFIC module would additionally have a link to the power connection to enable the transmitting and receiving of the RF signal through the powerline.

C. Exemplary Incorporation of RFIC within Non-Computer Devices

1. Embedded Passive Power Management with Static Information in ROM or Flash Memory For electrical devices that have no microprocessor but it is desired to provide basic identification to other devices equipped with powerline communication capabilities, an RFIC can be embedded in the device with static information stored in ROM, Flash Memory, or some other type of memory. Some versions of this embodiment may allow the producer of a device to store device identification information that does not change, such as model number, serial number, and other data that may be useful to the users of the device to collect electronically, such as but not limited to typical starting power usage, typical operating power usage, heat output in BTUs, typical noise level, electrical schematics, user manual documents, and service manual documents. Some or all of above static information may be stored in ROM, in Flash Memory, or in some other suitable type of memory. With reference to Flash Memory specifically only for purposes of illustration, additional static information that may be purposefully stored in Flash Memory by the user of the device, rather than the producer of the device, may include but is not limited to corporate asset tag identifiers, owner identification, and device service and repair history. The method by which the user of the device would update the static information in Flash Memory may include but is not limited to USB, RS232, Firewire, or any other applicable current or future electronic data connection standard, and the connector used to make this connection may be located internal or external to the device. Another method by which the user may update static information stored in Flash Memory includes but is not limited to data obtained via powerline communication or Ethernet with instructions to store the information. By virtue of the RFIC system, a similarly equipped device connected to the same power cord or power connection may query and obtain any or all pieces of static information stored in ROM or Flash Memory (or other type of memory) after following any authentication and/or authorization methods that may be required for the information to be accessed.

2. Embedded Passive Power Management with Realtime Information updated in Flash Memory or Transmitted via Powerline Communications In addition to the functionality described in the above "1. Embedded Passive Power Management with Static Information in ROM or Flash Memory", additional information that may be stored in Flash Memory (or other type of memory) updated internally by the RFIC system and/or may be transmitted via the powerline communication to a device equipped with a similar RFIC system that queries this information may include but is not limited to total time device has been supplied power, total time device has been operating, date and time records of changes to the supplied power or changes to the operating status of the device, and records of what other devices with powerline communications capabilities have identified themselves through the power connection. Other information may also be stored in Flash Memory (or other type of memory) and/or may be transmitted via the powerline communication to a device equipped with a similar RFIC system that queries this information that can be obtained by the RFIC system itself about the device without the device being supplied with its own microprocessor may include but is not limited to readings from internal or external connections to various sensors, such as power usage readings from a hall effect current sensor, device temperature from a thermal sensor, device operational rotations per minute, device orientation or acceleration changes from an accelerometer, or realtime device settings or metrics, such as fan speed selection, thermostat setting, user-operated switch on or off status, or external indicator light status. By virtue of the RFIC system, a similarly equipped device connected to the same power cord or power connection may query and obtain any or all pieces of static information stored in ROM or Flash Memory (or other type of memory) after following any authentication and/or authorization methods that may be required for the information to be accessed.

3. Passive Power Management Cord Dongle with Optional USB Port to Connect and Program ID Information into Flash Memory In much the same way a device may be designed with an embedded RFIC system as described in the preceeding "1. Embedded Passive Power Management with Static Information in ROM or Flash Memory" and "2. Embedded Passive Power Management with Realtime Information updated in Flash Memory or Transmitted via Powerline Communications", it may be desired that a device that was not designed with an embedded RFIC system be retrofitted with the capability to provide similar static information. This goal may be accomplished through the use of a dongle added to the power cord or power connection of any device. It may be irrelevant as to whether the dongle is providing the static identification information on the behalf of a device that is a power consumer (30) or a power provider (20), since as long as the device on the other end of the power cord (40) or power connection (or otherwise downstream of power cord (40)) has the capability to use powerline communication to query this information it can determine what device or devices are attached to the same power cord (40) or power connection. The dongle may take the form of a housing for the RFIC system that can be connected, permanently or temporarily, between the device and the power cord (40) or power connection. The dongle may provide an internal or external connector (e.g., USB) for making a data connection to read and write the contents of Flash Memory or other type of memory.

4. Active Power Management with Data Outputs and/or Inputs

In addition to the functionality described in "2. Embedded Passive Power Management with Realtime Information updated in Flash Memory or Transmitted via Powerline Communications" and "3. Passive Power Management Cord Dongle with Optional USB Port to Connect and Program ID Information into Flash Memory", an RFIC system may be equipped with logic outputs which can be used to change the state of internal or external components. An exemplary use of said logic output would be to connect a power relay switch to a logic output that can have the state of On or Off. The power relay switch would then either allow power to pass through to the connected device or cause the power to be switched off to the connected device depending upon the state of the logic output. A power consumer (30) connected to an exemplary dongle could have its power turned on or off via commands sent through the power cord (40) or power connection using the powerline communication. A power provider (20) connected to an exemplary dongle could allow or switch off power to all of the one or more power consumers (30) that are operating on the provided power (20). An RFIC system that is embedded in a device or provided via a dongle (or otherwise coupled with the device) may have zero, one, or more data outputs and/or data inputs. The state of data outputs can be changed via instructions sent through the powerline communication. For instance, the state of data outputs may be changed to "on" or "off," to output at a specific analog voltage, or to output a digital numeric value. Uses of a logic output may include but are not limited to changing a basic setting on a device, such as "on" or "off," fan speed selection, thermostat setting, volume setting, or the state of an indicator device such as a light, buzzer, or vibration alert. Uses of a data input may include but are not limited to detection of the manual "on" or "off" state of a device, temperature sensing, speed/RPM sensing, or other operational or environmental parameters of the system.

5. Data center Cooling Equipment (Auxiliary Fans)

An exemplary device that may embody at least some of the above listed functionality would be an auxiliary cooling fan with an embedded RFIC system that is brought into a data center and plugged into an outlet to improve air temperature by moving cooler air into an area that is too hot. For instance, by virtue of the functionality described in "4. Active Power Management with Data Outputs" and preceding sections, the act of plugging the power cord of the cooling fan into the outlet of a power provider (20) equipped with powerline communications capability, the fan may be immediately identified to the power provider (20) and the operator and management or monitoring systems that are logically connected to said power provider (20). The identification information provided through the powerline communication may include static information in ROM or other type of memory, such as Brand=Grainger; Model Number=CF3823; Serial Number=Z9878D238831. This information may allow the fan to be accurately identified as soon as the power cord (40) is plugged in. Information provided may include static information from Flash Memory or other type of memory, such as Asset Tag=P55359; Owner=Information Technology Department, Joe Smith; Service Record=Bearings replaced 2008/12/10, Fan blades cleaned 2008/7/13. This information may allow an operator (e.g., person) that can logically query the device to determine the history of the device and if it is owned by the department or obtained from somewhere else. Information provided may include dynamic information from Flash Memory (or other type of memory) and Data Inputs, such as Time Powered=3271 h; Time Running=865 h; Air Temperature=31 deg C.; Motor Temperature=54 deg C.; Fan Speed=723 RPM, Accelerometer=0.0 g X, 0.99 g Y (Upright). This information may allow the operator that can logically query this information to determine if the air temperature is cool enough to cease using the fan, whether the fan is currently running or not, and the direction in which gravity is acting upon the fan to determine if the fan has fallen over. Data Outputs that may be changed by instructions from another device equipped with powerline communication may include Fan Motor Supplied Power=True; Fan Speed Selection=Medium. Changing these settings allows the operator to turn the fan on or off, and select the relative fan speed, for example Low, Medium, or High. Other types of devices in which such functionality may be similarly implemented will be apparent to those of ordinary skill in the art in view of the teachings herein.

6. Home & Commercial Automation Systems Equipment

In some implementations, a Power Management System can encompass all power provider (20) circuits in a location. The power input for a house, building, department, floor, or other area where power is supplied through electrical wiring can include an RF filter to isolate the powerline communications signals to within the desired area. An exemplary RF filter implementation may be installed immediately before, after, or integrated with the power company's electrical meter so that a single powerline communications device may propagate its signal to all power consumers (30) receiving power provided through the electrical meter in that location. Another implementation may install RF filters immediately after each circuit breaker so that each independent circuit has isolated powerline communication only between devices on the same power circuit. Other suitable configurations for such settings will be apparent to those of ordinary skill in the art in view of the teachings herein.

Applications for such systems in the home may include but are not limited to management, monitoring, and control of household devices such as refrigerators, microwaves, heating and cooling systems, aquariums, lighting, audio/video equipment, and coffee makers. Applications for such systems in a commercial setting may include but are not limited to management, monitoring, and control of devices such as manufacturing machinery, air circulation fans, heating and cooling equipment, vending machinery, printing and imaging equipment, food preparation equipment, lighting, and security/surveillance devices. Other ways in which systems and techniques described herein may be implemented in home or commercial settings will be apparent to those of ordinary skill in the art in view of the teachings herein.

7. Fixed and Dynamic Restricted Power Environments

In some implementations, a Power Management System (10) may be used in environments where the available power provided is sometimes or always less than the possible or actual demand. One merely illustrative example of this may be in buildings and/or mobile structures, etc., which rely partially or completely on alternative energy sources, such as solar power, wind power, hydropower, and/or geothermal power. In such cases the power available may vary based on a plurality of factors, including climate conditions, seasons, time of day, and low or variable energy conversion ratios, etc. The complexity of such systems may increase when measures are taken to provide reserve energy storage in forms including but not limited to electrical batteries, thermal storage, flywheel storage, and hydrologic storage. In some conventional systems, when at a given moment the power demand by power consumers (30) exceeds the capabilities of the power provider (20), the power provider (20) may fail to deliver power at the required specifications and/or cease providing power at all. By implementing a Power Management System (10) of the nature described in this disclosure and the addition of Powerline Communication and/or other communications method to both the power provider (20) and power consumers (30), interactions including but not limited to the interactions described below may take place to avoid interruption of power delivery.

Power providers (20) that can measure both instantaneous power load and instantaneous power output capability may use Powerline Communication to interact with power consumers (20) that are similarly-equipped with Powerline Communication. Power consumers (30) may be equipped with a "Request On" button and "Off" button. The "Request On" button may initiate a Powerline Communication request to the power provider (20) then await a response from the power provider (20) before activating the power consumer (30). The power provider (20), based on its configured logic, may respond to the power consumer (30) to activate and operate normally, not activate at all, or switch to queued mode and provide indication to the user that the power consumer (30) is queued for future activation when sufficient power is available. The "Off" button on the power consumer (30) would deactivate the power consumer (30) and initiate a Powerline Communication request for the power provider (20) to remove the power consumer (30) from its queues.

Power providers (20) may be optionally configured with a list of power consumers (30) that are ranked with a priority value so that in configured circumstances the power provider (20) may deactivate a power consumer (30) with lower priority to obtain enough power output capacity to provide power to a power consumer (30) with a higher priority that is requesting activation. More than one list may be provided to said power provider (20), with associated time schedules to account for some power consumers (30) being more important to the user at different times.

Power providers (20) may optionally have a means of scheduling automatic unattended activation or deactivation of power consumers (30), which may be related to or independent of the scheduling of power consumer (30) priorities.

Power consumers (30) may have a means of requesting temporary activation and assignment to the highest priority of all power consumers (30), possibly considered an override mode, by a mechanism such as but not limited to the holding of a "Request On" button or other type of user input for a configured amount of time, such as 10 seconds.

When the total power usage by the power consumers (30) is less than or equal to the power output capabilities of the power provider (20), the power provider (20) may be considered in a "normal state".

When the power provider (20) is in a "normal state" and a power consumer (30) that is currently deactivated has its activation is requested by a "Request On" button being pushed or a scheduled device activation, the power provider (20) may request the power consumer's expected power load through Powerline Communication, and then the power provider (20) may calculate if the additional power load will cause the total power demand to exceed the power provider's capabilities. In the case that the additional power load would cause the total power load to exceed the power provider's capabilities, the power provider (20) may respond via Powerline Communication in a manner that may include, but is not limited to, the type(s) of responses described below.

Power provider (20) may respond to power consumer (30) being activated with instructions to abort activation.

Power provider (20) may respond to power consumer (30) being activated with instructions to abort activation and go into queued mode, possibly alerting the user with an alert signal (e.g., light illumination and/or illumination pattern, sound, automated e-mail or text message, pop-up window or message, etc.) indicating that activation may occur at some point in the future when instructed by the power provider (20). Power provider (20) would add power consumer (30) requesting activation to a queue of devices requesting activation once sufficient power is available.

Power provider (20) may iteratively send an instruction to a currently activated power consumer (30) with the lowest configured priority to deactivate until the power usage detected by power provider (20) is sufficiently low enough that the power consumer (30) device being activated can be allowed to activate and the total power load is calculated to remain lower or equal to the power provider's capability. Power provider (20) may optionally add power consumer (30) that was deactivated to a queue of devices requesting activation once sufficient power is available.

Power provider (20) may send an instruction to all or user-configured currently activated power consumers (30) to switch into a reduced power or power-saving mode in an attempt to reduce total power load below the level needed to accommodate the power consumer (30) being activated.

When the operational state is currently "normal", but the amount of power that the power provider (20) is capable of providing is decreasing (due to environmental or other factors) and gets within a configured threshold level above the total power load, the power provider (20) may respond via Powerline Communication in a manner that may include, but is not limited to, the type(s) of responses described below.

Power provider (20) may send an instruction to all or user-configured currently activated power consumers (30) to switch into a reduced power or power-saving mode in an attempt to reduce total power load below the level needed to accommodate the power consumer (30) being activated.

Power provider (20) may select the lowest configured priority power consumer (30) device that is activated and sends an instruction for the device to deactivate to reduce the total power load. This may happen with or without an alert to notify the user that a device is being deactivated, with a possible delay to allow the user to deactivate other devices to increase available power and allow the alerting device to continue functioning instead of being deactivated. This may be repeated whenever the capability of the power provider decreases to within a threshold level of the total current power load. Power provider (20) may optionally add power consumer (30) that was deactivated to the queue of devices requesting activation once sufficient power is available.

When the operational state is currently "normal", but the amount of power that the power provider (20) is capable of providing is increasing (due to environmental or other factors), the power provider (20) may periodically inspect the queue of devices (e.g., power consumers (30)) requesting activation to calculate if the difference between the current power capability and the current power load is great enough that any device in the queue, or optionally the device with the highest priority in the queue, can be activated without causing the total power load to exceed the current power capability. If this is true, the power provider (20) may send an instruction to activate the selected device in the queue and then remove the device from the queue.

In an exemplary residential building which uses solar energy as its sole source of power input to the building, a method of converting solar radiation into electricity may have a maximum electrical output in Watts that varies throughout the day, and then drops to zero at night. In a residential building a plurality of uses for the electricity may be identified, but this example we will use four devices identified with their associated wattages as a Microwave Oven (1200 Watts), Coffeemaker (250 Watts), Clothes Washer (900 Watts), Personal Computer (500 Watts). If the combined available electrical power from the solar photovoltaic conversion is 3000 Watts, it is possible for all four identified devices to be supplied power in optimal sunlight conditions. For this example, the configured priority of the four devices may be as follows with the higher the number the higher the priority: Personal Computer=4, Coffeemaker=3, Microwave Oven=2, Clothes Washer=1.

In morning the dim and sharply-angled sunlight may provide only 400 Watts of power, so when the user presses the "Request On" button on the coffeemaker (250 Watts), a request is sent to the power provider (20), and the power provider (20) determines the expected power load. Increasing the power load from 0 Watts to 250 Watts will not exceed its power capability of 400 Watts in this example, so the power provider (20) may send a response to the coffeemaker that it is ok to activate.

While the coffeemaker is running, the user may press "Request On" on the Personal Computer (500 Watts), and since the expected additional power load of 500 Watts exceeds the total power capability of 400 Watts in this example, the power provider (20) may add the power consumer (30) to its queue of devices requesting activation and send an instruction for the Personal Computer to go into queued mode. Alternatively, depending upon the logic and configuration of the power provider (20), the higher priority of the Personal Computer may result in the coffeemaker being sent an instruction to turn off and go into queued mode; and the Personal Computer being told to turn on.

As the sunlight intensity increases, the power capability of the power provider (20) may increase. When power capability increases, the queue may be periodically inspected for power consumers (30) that have expected power loads that are smaller than the difference between the power provider's power output capability and the current power load. When the power capability exceeds 750 Watts, there is sufficient capacity to activate the 500 Watt Personal Computer from the queue, so an instruction may be sent via Powerline Communication to the Personal Computer to activate, along with sending instructions to activate any other devices in the queue that use less power than the remaining capability of the power provider, based on priority settings for the devices.

At midday the power output capability may reach the full 3000 Watts due to the intense direct sunlight. Pressing "Request On" on all four of the power consumers (30) in this example results in all four devices operating simultaneously.

As the sunlight intensity decreases from its midday peak, the power provider's output capability may reduce from 3000 Watts to 2800 Watts. During this period of declining output capability, the power provider (20) will determine that the current power load will exceed the output capability soon and determine the lowest priority active device of the four active devices, in this case the 900 Watt Clothes Washer, and the power provider (20) may optionally send a warning notification to the Clothes Washer that a "power off" signal is imminent, eventually sending a command to the Clothes Washer to deactivate and switch to queued mode, and the power provider (20) then adds the Clothes Washer to its queue of devices to activate. This will reduce the power load from 2850 Watts to 1950 Watts currently.

When the use of the Microwave Oven is completed and it switches to "Off" mode a Powerline Communication message is initiated to the power provider (20) informing it that the Microwave Oven is being deactivated. The power provider (20) will then detect that the power load drops from 1950 Watts to 750 Watts. At this point, since the power load has decreased, the power provider (20) inspects its queue of devices to activate where it sees that the Clothes Washer is queued with a 900 Watt load. Assuming that the power provider's output capability is still at the 2800 Watt level, there are 2050 Watts of power capability unused, so the power provider (20) may initiate a command to the Clothes Washer to activate.

As the power output capability of the power provider (20) decreases from 2800 Watts to 500 Watts, interactions of a similar nature to those described above may take place. Of special note is that the Personal Computer may have more advanced power management capabilities as described elsewhere in this disclosure. If the Personal Computer is active as the power capabilities decrease to 500 Watts, the power provider (20) may initiate a request to the Personal Computer to operate in a reduced-power mode to allow the computer to retain data and possibly slower or decreased functionality while still allowing its primary functionality to continue, if somewhat impeded. If the Personal Computer is capable in operating in such a reduced-power mode, it may initiate a notification via powerline communication to the power provider (20) so that the power provider (20) knows to notify the Personal Computer to resume full-power mode if available power capability increases again.

The previous example is simplified from some real world scenarios in that some power providers (20) are rated for both a "constant output" number of Watts and a "surge output" number of Watts. With those parameters available, it may be advantageous for power line communication to communicate the peak/surge Watt usage of a power consumer (30) and the constant operating Watt usage of a power consumer (30) and allow the power provider (20) to use those metrics in its logic to determine when power consumers (30) should be turned off, turned on, or queued. For instance, resistive heat power consumers (30), such as coffee makers and hairdryers, may have similar surge and constant Watt usages, whereas power consumers (30) with electrical motors, such as refrigerators, air conditioners, and computers with spinning hard drives, may have a higher Watt usage for a few seconds when turned on compared to ongoing after that point. An example of where this may provide benefit to a user is if a power consumer (30) has 600 Watts constant output available but 1000 Watts of surge output available, and a refrigerator is requesting to turn on that has communicated that it uses 800 Watts surge and 400 Watts constant. The previous example would have to rely on the 800 Watt maximum usage number, and in the absence of the 1000 Watt surge capability, the power provider (20) would have to deny a request to turn on the refrigerator due to insufficient available power. However, in the present example with the refrigerator, the 800 Watts surge usage by the power consumer (30) is less than the 1000 Watts surge output available by the power provider (20), and the 400 Watts constant usage by the power consumer (30) is less than the 600 Watts constant output available by the power provider (20), so the power provider (20) could safely allow the refrigerator to turn on. It will therefore be apparent to those of ordinary skill in the art that the use of additional information and metrics communicated via power line communication can allow the power provider (20) to make more efficient or beneficial decisions when managing power consumers (20) in various scenarios.

III. Exemplary Power Event Notification through Power Cord

It should be understood from the teachings herein that a power provider (20) may communicate with a power consumer (30) (e.g., a computer, etc.) through the same cord (40) through which operational power is provided to power consumer (30) from power provider (20). It is noted that communication from power consumer (30) to power provider (20), and/or from one power consumer (30) to another power consumer (30) where both power consumers (30) are connected to the same power provider (20), is also possible in some versions. Furthermore, power management system (10) may be utilized to provide notification of power events, such as impending power loss, requests for reduced power modes, environmental control failures, and other events, to power consumers (30) (e.g., computer systems, etc.) by a power provider (20) (e.g., UPS or PDU, etc.) directly through power cord (40) without any user configuration or an additional signal cable. This operation may include at least one-way narrowband communication from power provider (20) to power consumer (30).

Power event notification through power cords (40) may be utilized in or to prevent any or all of the following situations, among others:

A. Power Loss in System with Battery Backup

When a computer is powered by an Uninterruptible Power Supply (UPS), the result may be that when power ceases being supplied to the UPS, power continues being supplied from a battery to the connected computer for a finite period of time to allow the computer to complete critical operations and shut down before power in the battery is exhausted. The intended result is that by means of a signal cable connected to the UPS, a signal is sent to the computer to initiate the safe and planned shutdown (or hibernation) of the computer if it is not attended to by a computer user or operator. There are several situations caused by human error which can cause the computer to lose power without getting the signal from the associated UPS to shut down, including the situations described below, among others Single UPS and single computer scenarios may include any or all of the following: the signal cable is not connected because the operator failed to install a signal cable at all; the signal cable is not connected because a person, environmental event, connector failure, or cable failure has caused the cable to become physically or electrically disconnected or unable to pass the signal from the UPS to the computer; and/or the signal cable is connected, but there is no driver installed in the operating system which allows the data from the signal cable to invoke a proper response when power failure is imminent.

Multiple UPS units and/or multiple computer scenarios may include the signal cable not being connected because the operator failed to install a signal cable at all. This may occur particularly when a UPS only has one signal cable connection and 2 or more computers are powered by the UPS. Multiple UPS units and/or multiple computer scenarios may also include the signal cable not being connected because a person, environmental event, connector failure, or cable failure has caused the cable to become physically or electrically disconnected or unable to pass the signal from the UPS to the computer. Multiple UPS units and/or multiple computer scenarios may also include the signal cable being connected, but there is no driver installed in the operating system which allows the data from the signal cable to invoke a proper response when power failure is imminent. Multiple UPS units and/or multiple computer scenarios may also include the signal cable being connected to the wrong UPS. The signal cable is supposed to be connected to the same UPS and computer that the power cable is connected to, but there are events that could cause this to not be true, including the following, among others: confusion—an operator can plug the signal cable into the correct UPS but the wrong computer; confusion—an operator can plug the signal cable into the correct computer, but the wrong UPS; and/or recabling—an operator tries to reduce clutter and temporarily removes one end of the signal cable and plugs it back in to a different UPS or server than it was originally plugged into. Multiple UPS units and/or multiple computer scenarios may also include a network cable being used as a signal cable to allow the UPS to send power event information to multiple computers at once. However, there is network equipment in between the UPS and the computers it supplies power to. This network equipment can fail to allow communication from the UPS to the attached computers for several reasons, including the following, among others: network equipment not plugged in to a UPS at all and ceases operation during power loss while computers and devices plugged in to the UPS continue to operate without notification through the network of power loss; network equipment plugged in to a different UPS that exhausts battery power before other UPSes that rely on it; computers may change their network configuration data without physical cable changes taking place; and/or network changes, including but not limited to router changes or firewall rule changes, may prevent communication between the UPS and the computer.

In some versions of the systems and techniques described herein, and using the standard power cord (40) or power connection as the signal cable, all of the above undesirable scenarios can be prevented. Using powerline communication may ensure that an RFIC-equipped power consumer (30) always gets power event notification signals from the same RFIC-equipped UPS that is its power provider (20). In the event of loss of power supplied to the UPS, the UPS may send a signal using powerline communication through all power cords (40) or power connections to all power consumers (30) that are using the UPS as a power provider (20). There are no additional signal cables that have to be in place to ensure delivery of the power event notification. There are no additional pieces of equipment, such as network switches, that are required to be powered, operational, connected, and configured properly to ensure delivery of the power event notification. If the RFIC-equipped power consumer (30) is receiving power to operate it can also receive powerline communication from its power provider (20). Furthermore, an RFIC-equipped power consumer (30) may even receive powerline communication from its power provider (20) when the power consumer (30) is not actively consuming power.

Figure 18:
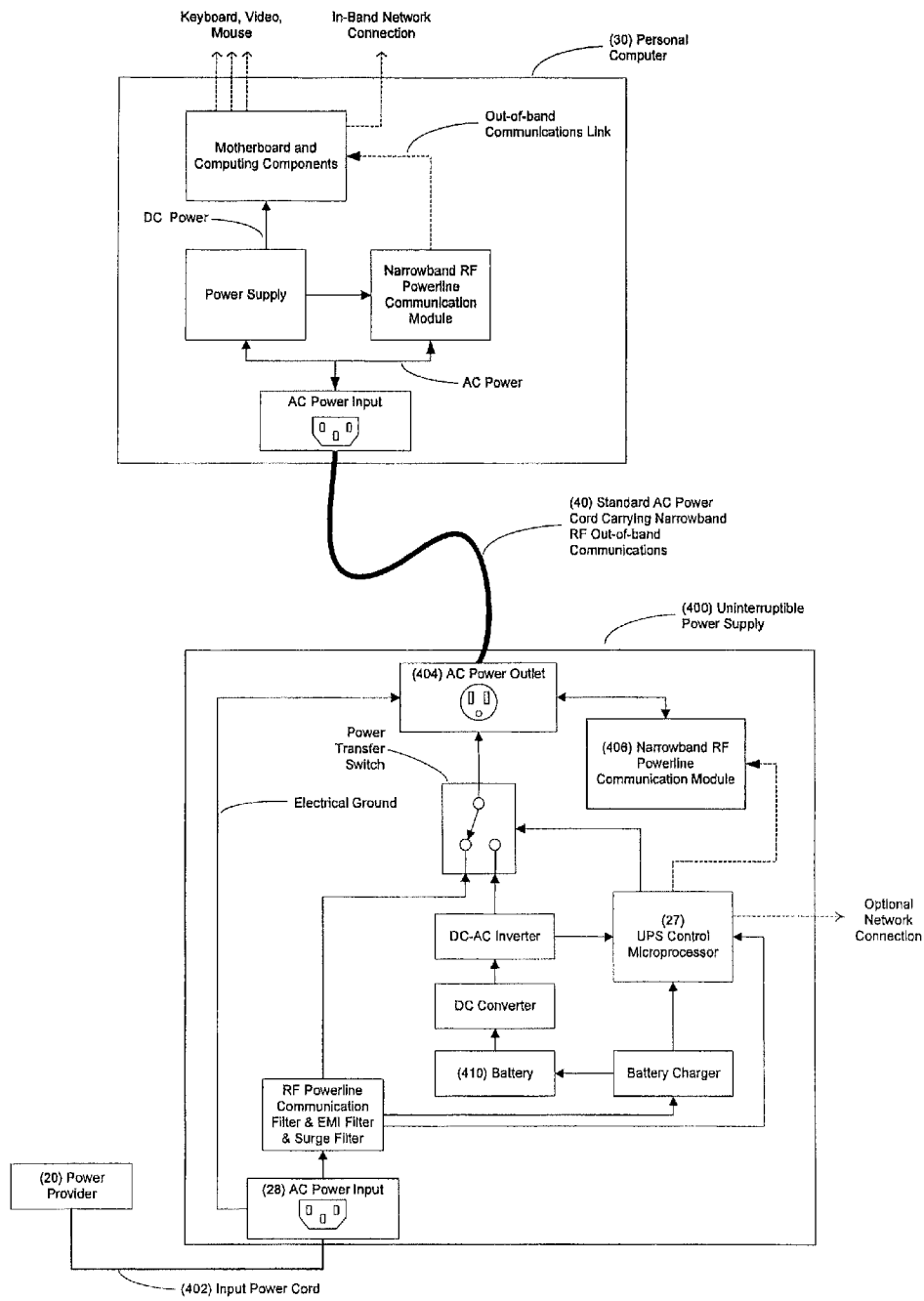
FIG. 18 depicts a schematic view of an exemplary implementation of a power management system with narrowband powerline communication.

One mere example of operation of an exemplary system in a power loss condition would be as follows, with reference to FIG. 18. In this example, an RFIC-equipped UPS (400) receives main power from power provider (20) through input power cord (402). UPS (400) performs role of power provider (20) via power outlets (404) equipped with RFIC system (406). While RFIC system (406) shown in FIG. 18 includes a narrowband RF powerline communication module, it should be understood that a broadband RF powerline communication module could be used in addition to or in lieu of a narrowband RF powerline communication module. One or more RFIC-equipped power consumers (30) receive power and powerline communication through power cords (40) attached to UPS power outlets (404) in normal operation state. While only one power consumer (30) is shown in FIG. 18, and while power consumer (30) is depicted as a personal computer, it should be understood that any other suitable number and/or type(s) of power consumers (30) may be used. During normal operation state, power consumers (30) may receive powerline communication from UPS (400) including but not limited to identification information, system status, and battery health.

Continuing the above example, when UPS controller (408) detects loss of main power or unsuitable main power through input power cord (402), UPS controller (408) transfers supply of power from input power cord (402) to power from battery (410), transmits powerline communications event notification via outlets (404) into power cords (40) onward to power consumers (30) announcing switching from main power to battery power, and begins monitoring of remaining capacity in battery (410). UPS controller (408) will periodically transmit notifications to power consumers (30) via powerline communication indicating remaining capacity in battery (410) measured in relation to total capacity and/or estimated time until battery power exhaustion so they may react in some configured combination of data protection measures, reduction of power consumption, and operational shutdown. When the UPS controller (408) determines that exhaustion of battery power is imminent, and using RFIC system (406) the UPS (400) will transmit a powerline communications event notification via outlets (404) into power cords (40) onward to power consumers (30) announcing imminent loss of power so any remaining operational power consumers (30) can prepare for power loss.

Continuing the above example of operation further, in the event that the UPS controller (406) detects the restoration of main power through the input power cord (402), the UPS (400) may restore providing power to the power outlets (404) if power had been lost, and then transmit a powerline communications event notification announcing the switching from battery power to main power. The UPS (400) may optionally wait for the battery (410) capacity to be recharged to a configured threshold level before transmitting more event notifications. Immediately or after the optional waiting period, the UPS (400) will transmit a powerline communications event notification announcing that reliable power is restored and power consumer (30) devices may begin reversing any changes resulting from the power loss, such as switching devices from an off state to an on state, changing from a reduced power consumption mode to a full performance mode, and restarting and restoration of computing processes. It is important to note that, in this particular example, only the power consumers (30) receiving power from the exemplary UPS (400) received power event notifications from same UPS (400) through their power cords (40). Also to note is that every RFIC-equipped power consumer (30) receiving power from the exemplary UPS (400) received power event notifications from same UPS (400) regardless of the presence, absence, or power state of any other connections made to the power consumers (30) or the exemplary UPS (400) in this particular example. The only operation required to provide power event notification between the power consumer (30) and the UPS (400) in this particular example is the plugging in of the power cord (40) extending between each power consumer (30) and UPS (400). Of course, a variety of other ways in which a loss of power within a power management system (10) (or other conditions arising within or otherwise affecting power management system (10)) may affect operation within power management system (10) using powerline communication will be apparent to those of ordinary skill in the art in view of the teachings herein.

B. Central UPS and Plurality of Managed PDUs

When data center primary power is provisioned by a single central power provider (20), such as a central UPS device or main power source, it may be typical in some conventional systems for there to be no communication method between the central power provider (20) and all of the downstream power consumers (20), whether they be PDUs, UPSes, servers, or other devices. This may unnecessarily put data integrity at risk in any or all of the following scenarios, among others: fire suppression system activation; central UPS exhaustion; and/or EPO (Emergency Power Off). This may cause undesired opportunity for human error in the settings of planned outages and maintenance, among other scenarios.

Figure 24:
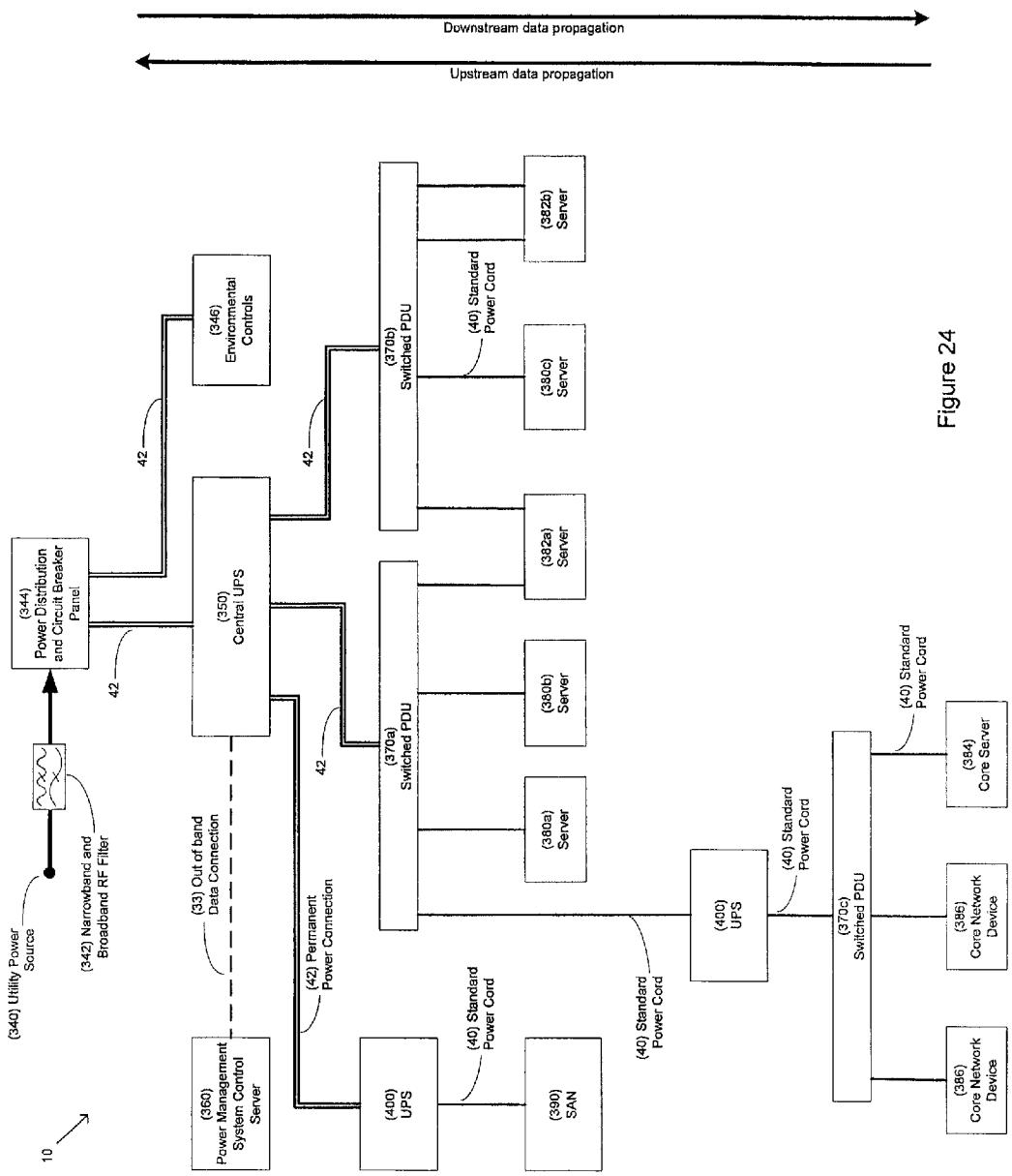
FIG. 24 depicts a schematic view of an exemplary data center environment where all block components shown contain power management system functionality.

An example of how power management system (10) may be implemented when a fire suppression system is activated is illustrated with FIG. 24. When a fire condition is detected by environmental controls (346), an event notification may be initiated via powerline communication and sent out via power connection (42) into power distribution and circuit breaker panel (344) and propagating to central UPS (350). The fire condition event notification itself may be of such a nature that it does not invoke any response or action in the depicted power providers (350, 370a-c, 400) or power consumers (380, 382, 384, 386, 390), but a power management system control server (360) may be configured with programming and logic which dictate the response to said fire condition event notification. Central UPS (350) may be configured to relay power management system data through out of band data connection (33) to accommodate such advanced analysis and logging of power management system (10) data to power management system control server (360), and upon receipt of fire condition event notification from environmental controls (346) thereby immediately transmit power management system commands for all power consumers (380, 382, 384, 386, 390) and power providers (350, 370a-c, 400) to initiate optionally a tiered shutdown or an immediate ("panic") shutdown, and said commands may be transmitted through out of band data connection (33) and in this example be received by central UPS (350). Central UPS (350) may then transmit commands via powerline communication through all upstream and downstream powerline connections as permitted by each power provider (350, 370a-c, 400). In this manner the entire area of a datacenter that is protected by a fire suppression system may react to the detection of a fire with an orderly shutdown versus an unexpected loss of power which may result in data corruption and data loss. Of course, a power management system (10) may be used in a variety of other ways when a fire suppression system is activated, as will be apparent to those of ordinary skill in the art in view of the teachings herein.

It should also be understood that any of the power providers (400, 370a, 370b, 370c) shown in FIG. 24 may have two RFIC types—one type for "upstream" powerline communications (e.g., communications with power provider (350, 370a, 400)); and another type for "downstream" powerline communications (e.g., communications with power consumers (390, 370c, 386, 384, 380a, 380b, 382a, 380c, 382b). Examples of such "upstream" and "downstream" types of RFICs are illustrated in FIG. 19, and are described in greater detail elsewhere herein. Of course, having two types of RFICs is merely optional.

C. Central Cooling Failure

Single-server overheating may be a rare occurrence with redundant fans and efficient system designs coupled with system monitoring. However, when a central data center air conditioning unit fails, multiple servers and infrastructure components can reach their temperature thresholds at different times and in an unpredictable order causing unexpected interruptions and data loss. When a data center environmental control issue is detected and a critical temperature threshold is reached, it may be determined based on the temperature trend that system failures or thermal protection shutdowns are unavoidable. At this point, data integrity concerns may warrant a controlled shutdown of systems in the affected area. An automated controlled shutdown (or hibernation) of systems may be automatically achieved via power management commands sent through central UPS and PDUs.

In particular, FIG. 24 shows an exemplary data center with power management system (10), including environmental controls (346) which comprise air cooling systems and air temperature monitoring systems. Should a failure occur, mechanical or otherwise, in environmental controls (346), it should be noted that detection of the failure and alerting of operators may already be greatly simplified and enhanced as described in section titled "Exemplary Computer Management and Monitoring through a Power Cord" elsewhere in this disclosure. In the event that environmental controls (346) have a failure that persists or is not detected, or external events occur (such as exceptionally high atmospheric temperatures) when environmental controls (346) are fully functional, the air cooling capability of the system may become hindered causing air temperatures inside the data center to rise, putting electronic equipment at risk of thermal failure and placing data at risk of loss and corruption. However, in power management system (10) of this example, a power management system control server ("control server") (360) may be in use which provides both the monitoring of the data center air temperature as a part of environmental controls (346) and the monitoring of temperature sensors which may be integral to power providers (350, 370a-c, 400) and power consumers (380a-c, 382a-b, 384, 386, 390), all of which may reveal the general trend of increasing temperatures. Programmable logic and operator configuration in control server (360) may dictate that when a threshold of temperature increase has been detected, configured actions may be performed that may partially mitigate the rising temperatures and additionally protect equipment and data in data center. Actions that may be performed by control server (360) which may partially mitigate the rising temperatures include, but are not limited to, the sending of power management system (10) commands through powerline communication instructing power consumers (380a-c, 382a-b, 384, 386, 390) to enter a mode of reduced power consumption, if the receiving devices are individually capable.

By reducing power consumption in electromechanical devices there may be a reduction of heat output and therefore a reduction of temperature increases in the absence of adequate environmental controls. Even though switching data center equipment into a mode of reduced power consumption may result in slower data processing or lower system performance in general, this may be a desirable temporary tradeoff in some settings if such lower performance allows the data center to continue to operate at acceptable temperature levels without shutting off equipment. Actions that may be performed by control server (360) to protect equipment and data in data center may include the shutting down of some or all devices in the data center. If control server (360) is not configured to shut down all power consumers (30) at once, as described elsewhere in this disclosure, a tiered shutdown may be initiated by control server (360) in which individual groups of power consumers (30) may be issued power management system (10) commands via powerline communication to save volatile data to persistent storage and shut down in such a manner that best insures data protection. It should be noted that if instructing a group or tier of equipment to shut down results in a lowering of temperatures in the air and equipment that is still in operation, the control server (360) may include programmable logic which aborts sending instructions to any remaining groups or tiers that have not yet been shut down.

No user intervention would necessarily be required for the above-described actions to occur. When configured criteria are met, such as, but not limited to, when temperatures reach a safe level again, environmental control (346) failures are eliminated, or when an operator intervenes, the control server (360) may initiate power management commands to start all equipment back up again, optionally using tiered startup as described elsewhere in this disclosure.

If a single critical component is detecting an impending outage due to climbing temperatures, then it might also make sense that the component be able to notify dependent systems that it is going to shut down. For instance, it may be desirable for a disk array or Storage Area Network (SAN), for example, to communicate through fibre channel, iSCSI, Infiniband, or other type of data connection to initiate a shutdown (or suspend/hibernation) of the servers that rely on it, but some dedicated storage protocols such as those just listed may not provide the ability to communicate event notifications of that nature, so the dependent servers may discover the disk array or SAN has stopped responding without warning. However, a power management system (10) such as those described herein may provide a means for an impending failure in a component to trigger the initiation of an out-of-band command for devices in a "logical group" (described elsewhere in this disclosure) to prepare for shutdown of the equipment with the impending failure. This may require a specialized power management event that is relayed or broadcast to other equipment in a data center.

D. Propagation of Power Management Communication

Figure 25:
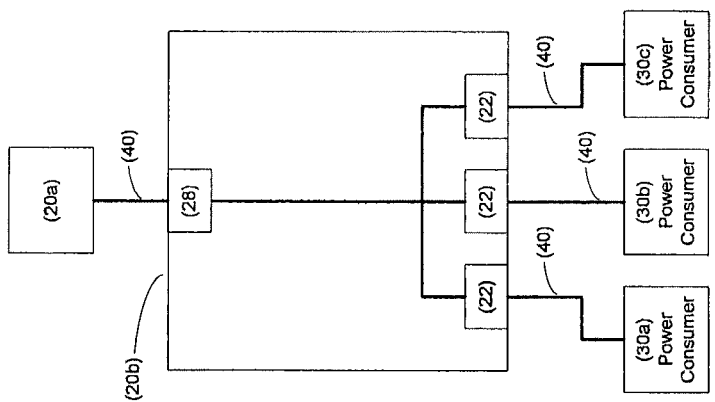
FIG. 25 depicts a schematic view of an exemplary conventional power provider, as well as an upstream power provider and downstream power consumers.

The out of band data that is transmitted by one device in power management system (10) can be received by other similarly-equipped devices that share a common power connection. Devices that are power providers (20) may also be power consumers (30) and may in some cases facilitate or prohibit the propagation of the powerline communication data in one or both directions between the power input and the power output of the device. It is noted that it is the nature of the RF signal to travel through all common power connections regardless of physical direction and regardless of whether the RF signal is traveling from power provider (20) to power consumer (30) or from power consumer (30) to power provider (20) when unhindered by components that intentionally or unintentionally filter or block the RF signal, such as an RF filter (26). Examples of various methods for facilitating or prohibiting propagation of RF signals as applies to examples described herein may include but are not limited to the following:

FIG. 25 depicts an upstream power provider (20a) and a connected downstream conventional power provider (20b) with a plurality of RFIC-equipped power consumers (30a, 30b, 30c) connected through a common power connection in downstream power provider (20b). Should any arbitrary power consumer (30), such as power consumer (30a), transmit a powerline communication RF signal, the signal will propagate to all devices with a common power connection. So in this example, the RF signal will propagate to power consumers (30b, 30c) and power providers (20b, 20a). It is noted that for all devices depicted (20a, 20b, 30a, 30b, 30c), if any one of them transmits powerline communication RF signal, all of the other devices depicted will also receive the RF signal.

Figure 26:
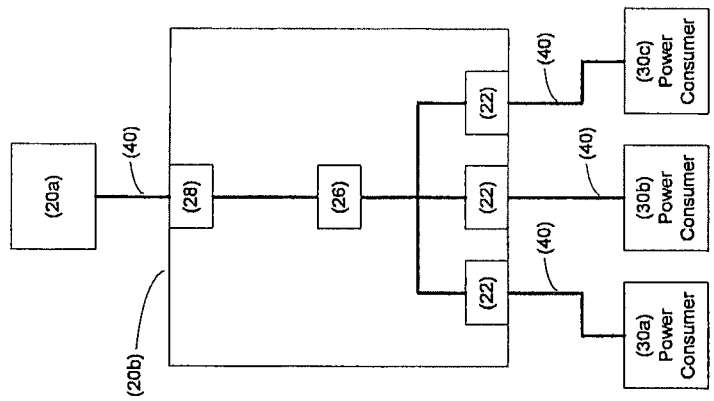
FIG. 26 depicts a schematic view of an exemplary conventional power provider containing RF filter, as well as an upstream power provider and downstream power consumers.

FIG. 26 depicts an upstream power provider (20a) and a connected downstream conventional power provider (20b) with a plurality of RFIC-equipped power consumers (30a, 30b, 30c) connected through a common power connection in downstream power provider (20b). In this diagram it is depicted that power provider (20b) contains an RF filter (26) that either intentionally or unintentionally is effective at filtering or blocking all frequencies of RF signals used by devices implementing power management system (10). Should any arbitrary power consumer (30), such as power consumer (30a), transmit powerline communication RF signal, the signal will propagate to all devices with a common power connection on the same side of the RF filter (26). So in this example, the RF signal will propagate to power consumers (30b, 30c), but the RF signal will only propagate partway through power provider (20b) due to the RF filter (26), and will not effectively propagate at all to power provider (20a). If upstream power provider (20a) transmits powerline communication RF signal, only downstream power provider (20b) will receive the RF signal.

Figure 27:
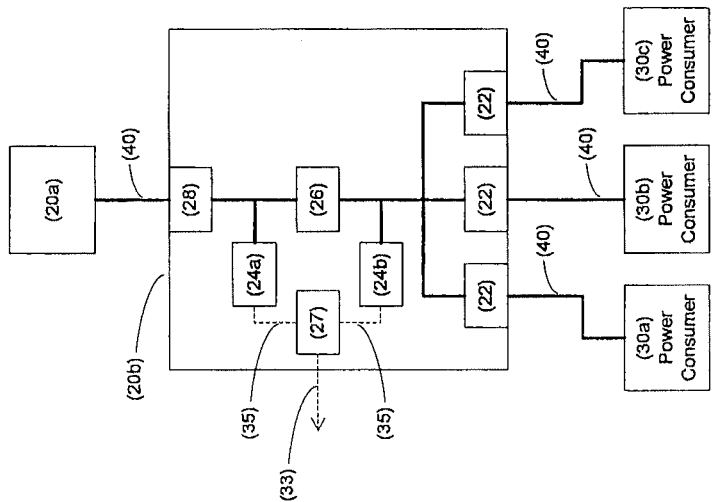
FIG. 27 depicts a schematic view of an exemplary conventional power provider containing RF filter, an upstream RFIC, a downstream RFIC, and a microprocessor, as well as an upstream power provider and downstream power consumers.

FIG. 27 depicts an upstream power provider (20a) and a connected downstream RFIC-equipped power provider (20b) with a plurality of RFIC-equipped power consumers (30a, 30b, 30c) connected through a common power connection in downstream power provider (20b). In this diagram it is depicted that power provider (20b) contains an RF filter (26) that is intentionally effective at filtering or blocking all frequencies of RF signals used by devices implementing power management system (10) so that the upstream RFIC (24a) may transmit and receive powerline communication RF signals only to upstream devices sharing a common power connection through power input (28); and the downstream RFIC (24b) may transmit and receive powerline communication RF signals only to downstream devices sharing a common power connection through power outlets (22). Should any arbitrary power consumer (30), such as power consumer (30a) transmit powerline communication RF signal, the RF signal will propagate to all devices with a common power connection on the same side of the RF filter (26). So in this example, the RF signal will propagate to power consumers (30b, 30c), as well as to the downstream RFIC (24b) in power provider (20b). If upstream power provider (20a) transmits powerline communication RF signal, only downstream RFIC (24b) in power provider (20b) will receive the RF signal.

Continuing with the example of FIG. 27, by virtue of the microprocessor (27), which communicates via data link (35) with upstream RFIC (24a) and downstream RFIC (24b), programmable logic and configurable rules may be applied to the data contained in the RF signal received by either RFIC (24a, 24b) and the decision may be made to retransmit the data in the form of RF signal using the RFIC that did not receive the original signal, thereby performing a data relay operation or acting as a data bridge. The programmable logic and configurable rules executed by microprocessor (27) may consider a plurality of factors in making the decision of what action to take in regards to received data. The results may include, but are not limited to, the decision to take certain data received by the downstream RFIC (24b) and retransmit through the upstream RFIC (24a) but not take similar data received by the upstream RFIC (24a) and retransmit through the downstream RFIC (24b), or vice-versa. Additionally, the programmable logic and configurable rules executed by microprocessor (27) may dictate to not retransmit data through an RFIC at all, but instead dictate to transmit the data through an optionally connected network interface (33). The optionally connected network interface (33) may also allow introduction of power management system (10) data from sources external to the power provider (20b) that is transmitted by one or both of the RFIC components (24a, 24b).

Figure 28:
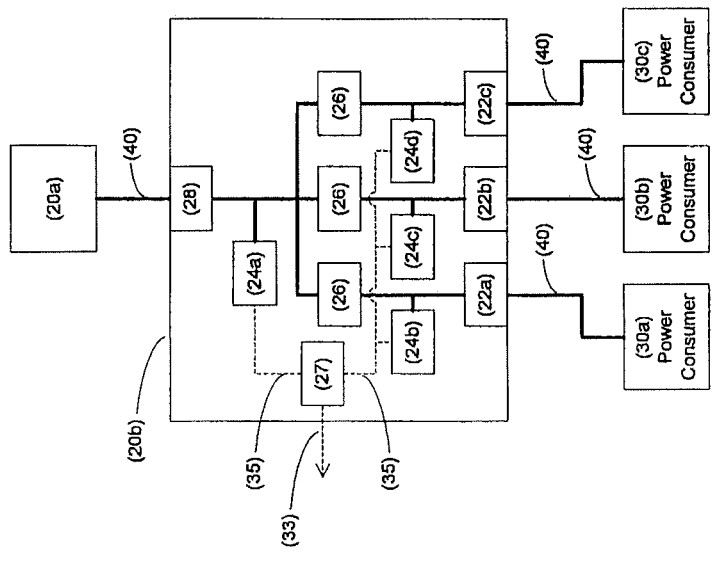
FIG. 28 depicts a schematic view of an exemplary conventional power provider containing a plurality of RF filters, an upstream RFIC, a plurality of downstream RFICs, and a microprocessor, as well as an upstream power provider and downstream power consumers.

FIG. 28 depicts an upstream power provider (20a) and a connected downstream RFIC-equipped power provider (20b) with a plurality of RFIC-equipped power consumers (30a, 30b, 30c) connected through a common power connection in downstream power provider (20b). In this diagram it is depicted that power provider (20b) contains a plurality of RF filters (26) that are intentionally effective at filtering or blocking all frequencies of RF signals used by devices implementing power management system (10) so that the upstream RFIC (24a) may transmit and receive powerline communication RF signals only to upstream devices sharing a common power connection through power input (28), but the plurality of downstream RFICs (24b, 24c, 24d) may each transmit and receive powerline communication signals only through an individual power outlet (22) to downstream power consumers (30) powered by the respective individual outlet (22). Should any arbitrary power consumer (30), such as power consumer (30a), transmit powerline communication RF signal, the RF signal will propagate only to the single connected outlet (22) and the single downstream RFIC (24b) connected to the power connection before the RF filter (26) in downstream power provider (20b). By virtue of a plurality of RF filters (26), the RF signal received from any individual power outlet (22) is prohibited from propagating to the other plurality of power outlets (22). If upstream power provider (20a) transmits powerline communication RF signal, only downstream RFIC (24b) in power provider (20b) will receive the RF signal before being prohibited by the plurality of RF filters (26).

Continuing with the example of FIG. 28, by virtue of the microprocessor (27) which communicates via data link (35) with upstream RFIC (24a) and downstream RFICs (24b, 24c, 24d), programmable logic and configurable rules may be applied to the data contained in the RF signal received by an individual RFIC (24a, 24b, 24c, 24d) and the decision may be made to retransmit the data in the form of RF signal using the RFIC that did not receive the original signal, thereby performing a data relay operation or acting as a data bridge. The programmable logic and configurable rules executed by microprocessor (27) may consider a plurality of factors in making the decision of what action to take in regards to received data. The results may include, but are not limited to, the decision to take certain data received by any single downstream RFIC (24b, 24c, 24d) and retransmit through the upstream RFIC (24a) but not take similar data received by the upstream RFIC (24a) and retransmit through the downstream RFICs (24b, 24c, 24d), or vice-versa. Likewise, the results may include, but are not limited to, the decision to take certain data received by any single downstream RFIC (24b, 24c, 24d) and retransmit through one or more of the other downstream RFICs (24b, 24c, 24d) but not retransmit through the upstream RFIC (24a). Additionally, the programmable logic and configurable rules executed by microprocessor (27) may dictate to not retransmit data through an RFIC at all, but instead may dictate to transmit the data through an optionally connected network interface (33). The optionally connected network interface (33) may also allow introduction of power management system (10) data from sources external to the power provider (20b) that is transmitted by one or more of the RFIC components (24a, 24b, 24c, 24d).

It should be understood that any of the power providers (20b, 370) shown in FIGS. 25-28 may have two RFIC types—one type for "upstream" powerline communications (e.g., communications with power provider (20a, 400)); and another type for "downstream" powerline communications (e.g., communications with power consumers (30, 30a, 30b, 30c). Examples of such "upstream" and "downstream" types of RFICs are illustrated in FIG. 19, and are described in greater detail elsewhere herein. Of course, having two types of RFICs is merely optional.

It should also be understood that various versions of the present invention may provide great configurability in the allowing and restricting of the propagation of data in the power management system (10). In addition to the previously listed methods of facilitating or prohibiting the RF signals applicable to power management system (10), the below described considerations are noted.

Downstream Power Management Events and Commands

The fundamental model of data propagation in some versions of power management system (10) is for the power provider (20) to inform the power consumer (30) about events relating to the nature of the power being provided. This fundamental propagation of data from power provider (20) to power consumer (30) is referred to as "downstream".

Upstream power management events and commands may include relaying for event propagation and/or relaying for information collection & monitoring.

Power Management Data Junctions

In FIG. 27 and FIG. 28, the programmable logic and configurable rules executed by microprocessor (27) may dictate to not retransmit specific types of data through an RFIC at all when an optionally connected network interface (33) is available as a path through which to transmit data to reduce the total amount of data being transmitted through powerline connections via powerline communication. The optionally connected network interface (33) may also allow introduction of power management system (10) data from sources external to the power provider (20b) that is transmitted by one or more of the RFIC components (24a, 24b, 24c, 24d). The optionally connected network interface (33) may comprise be a high-speed network connection with a path to a power management system control server (360).

Power Management Device Logical Groups

A hierarchy of functional unit groups, department groups, customer groups, physical location groups, etc., may be used limit which devices specific operations will affect.

For instance, a power management system (10), such as shown in FIG. 24, by virtue of its ability to communicate via powerline communication, may contain a plurality of power providers (20) and power consumers (30) that vary in their function, business department assignments, legal ownership, and physical location. It should be noted that each device participating in power management system (10), whether the device be a power provider (20) or a power consumer (30), may have a plurality of other devices that share a similarity of some kind and operators may desire to place the same devices in a logical group together. By establishing logical groups, operators may simplify the management of a plurality of devices by initiating actions that target all the devices that are members of a specific group. Unless otherwise configured by the operator, the inclusion of a device in one group would not exclude the same device from another group. In a merely illustrative example, a server (380*a*) may be included in a logical group representing devices that are located on the $2^{nd}$ floor of a building, and the same server (380*a*) may simultaneously be included in a logical group representing devices that are a part of the corporate email server infrastructure.

A logical group may also be used in a manner to provide a security barrier such that for security purposes a device may be configured to only respond to power management system data that originates from a device that is a member of a specified logical group. As a merely illustrative example, it may be desired that the accounting department database server should not respond to a power management system command to reboot if it came from the sales department web server. However, if a specific PDU that is in the logical group "accounting department infrastructure" transmits a power management system command to reboot, the accounting department database server may respond and reboot if the accounting department database server security is configured to respond to devices in the logical group "accounting department infrastructure".

Logical groups may be a construct of a central authority such as a power management system control server (360) ("control server"). Such a control server (360) may store configurations, databases, or other data structures which represent a plurality of logical groups, descriptions of what they represent, what devices are members, and other attributes assigned to the logical groups. Optionally, the devices may not manage their inclusion in logical groups but delegate that to the control server and operationally query the control server (360) to determine what logical groups a device is included in.

Logical groups may also be integrated into individual device identity. It may be the responsibility of the device itself to know what logical groups it is included and store that information in internal data storage. Other devices may have methods to operationally query a device for information about logical groups it is a member of. A device in a logical group may also store the identities of other devices in the logical group. Additionally, a device may initiate a query to discover all the logical groups established in a power management system (10) and the identities of all devices included in each logical group discovered.

E. Military Data Wipe or Security Destruct Signaling

In some versions, power management system (10) may be used to send a signal to wipe data, wipe encryption keys, or destroy electronic or electromechanical hardware. For instance, there may be special applications where the data in server memory and the data stored on disk must be protected by encryption at all times. Other special applications may place extreme value on the secrecy of the composition or construction of electronic components that perform various operations. In moments where the physical security of the systems are at risk, there may be processes that are to be in place that will trigger the permanent destruction of encryption keys, unencrypted data, encrypted data, and sometimes physical hardware. Due to the always-connected nature of power management system (10) for systems that are connected to a power provider and the ability to initiate communication and actions while the connected power consumers are turned off, power management system (10) may be an ideal method to implement the signal to initiate this "Data Wipe" procedure. Such implementations may provide the ability to determine with certainty that a device which supports power management system (10) that receives power can receive instructions via powerline communication which may initiate the data or hardware destruction, whereas using a separate signal path to initiate the data or hardware destruction there may be a risk of the signal path being accidentally or intentionally disconnected or interrupted even while the normal operation of the power consumer device continues.

F. Power-On Delays for Overcurrent Prevention.

Some pieces of electronic equipment may require a higher amount of electrical current when the power is first applied or the equipment is first "turned on" compared to the normal operational current. This can create situations where starting all the equipment at one time can exceed the available power and cause a power failure. By using a "tiered shutdown and startup" processes, equipment in different tiers can start at different times, but equipment in the same tier can possibly be the only equipment on a single power circuit, so another system may need to be used to stagger the "power on" event for individual pieces of equipment.

In the present example, the staggering of equipment startup utilizing power management system (10) is accomplished by sending "Power On" commands via power management system (10) with both a tier number and a hash sum that can be applied to the equipment serial number to determine if it is that equipment's "turn" to power on as being a part of that tier. The PDU can monitor the current and wait until the current usage has decreased before the next "Power On" command with the next hash sum is sent. A hash sum may simply be a number between 0 and 15 (or other number) which corresponds to the least significant hexadecimal digit of a CRC32 or other hashing algorithm applied to the serial number of the server equipment or the last digit of the MAC address assigned to the power management RFIC.

G. Power Control for Server Virtualization

In some settings, support for automated server shutdown by computer server virtualization platforms may be very poor at best. Virtualization kernels and hypervisors, such as VMware ESX, Microsoft Hyper-V, Virtual Iron, and Xen, may be designed to be very lean and have as little overhead as possible, and may have very few installable drivers for custom hardware interfaces. Many if not all UPS signaling interfaces may be considered proprietary, especially those that use RS232 or USB connections, and may be unsupported by server virtualization platforms. Power management system (10) may be configured in accordance with highly-documented industry standards with cooperation between computer vendors and power equipment providers, such that power management system (10) may provide the ability to have the hardware and protocol interface for automated server shutdown and other power events to be handled in an industry standard way regardless of the power equipment provider. Additionally, because power management system (10) may have a zero-configuration nature, virtualization platform hosts may be able to "seamlessly" make use of the power events received via power management system (10) and convey the events directly to the virtual guest operating systems running inside of the virtualization platform host. If such virtual guest operating systems each have their own built-in support for a standardized power management interface, said power management interface may be a preferred operating system-independent means of sending controlled shutdown events to the virtual guest operating system even when virtualization platform-specific drivers are not installed or available.

H. Signaling for Server or Process Failover

For critical applications that are designed with redundant systems in physically or geographically distant locations, there may be processes that "fail over" to a different location when a failure is detected. This may involve a timeout period between the beginning of the failure and the decision that a specific system has failed unrecoverably, prompting redirection of all further processing away from the failed system. This can cause a brief but annoying service interruption, but still a service interruption When an unplanned power event occurs that causes a known temporary window of operation, power management system (10) can possibly provide critical systems such as this an early enough warning to transfer session data cleanly to other remote systems to avoid any service interruption at all. For very complex systems, this extra notification time before actual system shutdown is initiated can make the difference between truly seamless failover and interrupted sessions with users "starting over."

I. Tiered Shutdown and Startup

In computing environments, there may be dependencies between systems that require some systems to be operationally longer-lasting than other systems. One example of this may include the tiers of a web-based application where the web server (tier 1) requires that the database server (tier 2) be available at all times, but not the other way around, and the database server (tier 2) requires the data storage subsystem (tier 3) be available at all times, but not the other way around. This may lead to a logical shutdown progression of tier 1 being told to gracefully shut down first while tiers 2 and 3 continue to operate normally, and then tier 2 can be told to gracefully shut down and data flushed to tier 3 while it continues to operate, and then tier 3 told to gracefully shut down at the end. Accomplishing this in an automated manner without human intervention may be highly complex and risky. Power management system (10) may introduce elegance and simplicity to solve this problem in a number of ways.

1. Tiered Shutdown Notifications

In some scenarios, tiered shutdown notifications may be time based. For instance, when an announced power outage occurs, there may be a known time period before power is removed. When an unplanned power outage occurs with systems powered by a UPS, there may be a known time period before battery power is exhausted and power is removed. In both cases there may be a "countdown" period where systems can be notified of the estimated or actual time left before power is removed. In the present example where power management system (10) is used, system (10) requires essentially no configuration on the PDU or UPS (power provider (20)) side, and only minimal configuration (e.g., one shutdown time value setting, etc.) on the server (power consumer (30)) side.

When a time period is known by power provider (20) for the pending removal of power from its connected power consumers (30), the power provider (20) may transmit a power management notification containing the estimated time remaining to all connected power consumers (30). Each connected device may then evaluate its own configured shutdown time threshold setting to see if the received estimated time remaining is greater than its configured shutdown time and ignore the command if it is. If the received estimated time remaining is less than or equal to the configured shutdown time, then the device will begin its own shutdown sequence. This method can allow multiple tiers to be shut down at the same time, such as when the first tiered power management shutdown command is sent with 10 minutes of power remaining and there are servers configured at 15 minutes, 12 minutes, and 10 minutes, and all of them will shut down at the same time. Remaining servers with shutdown times lower than 10 minutes will get shut down at their appropriate times.

Tiered shutdown notifications may be tier based. For instance, even though power provider (20) may know the time remaining, it may be important that all tiers receive staggered power shutdown notifications with gaps between the tiers. This approach takes a known number of tiers and divides the time remaining between them and sends a power management shutdown command to each tier in sequence with a calculated time gap before sending the next one. This version may require configuration on the power provider (20) side to set the number of tiers if the default number of tiers is not appropriate.

In the present tier-based example, at the beginning of the period before connected power consumers (30) lose power due to a planned or unplanned event, a power provider (20) may send a power management shutdown command with the first (earliest shutdown) tier number. The remaining time before power loss is used to calculate the delay before the next power management shutdown command is sent for the next tier (for example, delay=remainingTime/remainingTiers). Each connected device (e.g., power consumers (30)) will wait for its configured tier number to be announced in the power management shutdown command. This method may be particularly desirable for systems that the first several tiers must be shut down in order, with some time gaps, even when the battery runtime of the UPS is not known for certain due to the degrading of lead acid battery capacity over time and/or failures of individual banks of batteries which may not be known about until an actual power loss stresses the batteries.

Tier-based shutdown could be configured to wait until a specific threshold of time remaining before it sends a power management shutdown command to the first tier (e.g., first tier shutdown command is not sent until there is only 10 minutes remaining).

In versions of power management system (10) that has two-way data communication via power cords (40) (e.g., communication from power provider (20) to power consumers (30) in addition to communication from power consumers (30) to power provider (20)), when each power consumer (30) in a tier has completed its shutdown, it can send an announcement to power provider (20). When power provider (20) has knowledge of all power consumers (30) in a tier and determines that all power consumers (30) in a tier have shut down before the time allocated to that tier, power provider (20) has the option of progressing to the next tier early rather than waiting for the next scheduled tier start time.

In addition, to the extent that power management system (10) that has two-way data communication via power cords (40) as well as equipment identification capabilities as described in greater detail below, power provider (20) actually receive information from each attached power consumer (30) to know which tiers are being "used" by power consumer (30). For example, if in a 5-tier system, there are power consumers (30) assigned to tier 1, 3, 4, and 5, but tier 2 is not assigned to any power consumers (30), then power provider (20) could be configured to skip announcing the shutdown of tier 2 (or combine the shutdown announcement of tier 2 & 3 together) to avoid unnecessary idle runtime that could be used by other power consumers (30) to shut down early and reduce their exposure to premature power loss due to some system taking too long to shut down.

Tiered shutdown notifications may be a hybrid of those described above. For instance, different tiers may have different requirements for the amount of time required for its shutdown operations to complete. Using the tier-based shutdown concept, it may be beneficial in some instances to configure specific tiers to have absolute time delays before the next tier is shut down, and other tiers could have flexible delays with desired minimum times and/or delay multipliers. And with two-way communication, the next tier can be notified when all systems on the current tier signal that they have shut down.

Upon restoration of reliable power, power management startup commands may be issued in the reverse order of shutdown. For tier-based and hybrid shutdown, a configurable or default time interval between tier startup commands may be used.

2. Example Shutdown Stages

The following are merely illustrative examples of shutdown stages that may be employed in any of the tiered shutdown processes described above: web server notifies load balancer to redirect new requests to other locations or "please try back later" message; web server stops allowing new logins and forcibly redirects to failover site; web server notifies users to complete their transactions; web server flushes data and transactions to database or disk and notifies users of aborted transactions; web server initiates graceful shutdown; database server prevents new transactions; database server starts flushing data; database server initiates graceful shutdown; storage subsystem flushes data to permanent storage; storage subsystem marks current state with a "snapshot"; and/or storage subsystem initiates graceful shutdown.

J. Power Management Protocol Bridging

For devices that are powered by alternate means other than a direct dedicated power cord, such as via Power over Ethernet, microwave, or RF power transmission, etc., it may be desired to allow the power management information and events to be transmitted and received over a communications medium other than the RF powerline method (e.g., something other than power cord (40)) described so far. It is understood and expected that with the standardization of the power management protocol, there may be ways to encapsulate or tunnel the power management data using other communications protocols, and perhaps even natively exchange power management data on OSI Layers 1 and 2 different than those described so far. For example, if a device is connected to a Power over Ethernet (PoE) network switch, the connected device may get all of its power from the network cable attached to the PoE network switch. In this case the PoE network switch would be the device that has a standard dedicated power cord (40) and could be equipped with power management capability to get events from a power provider (30) that it is plugged into. In other words, and with reference to FIG. 1, the PoE could network switch could be considered as a power consumer (30). Upon receiving power management event information from its power cord (40), the PoE network switch could relay or send out the appropriate power management event data to all devices powered by the PoE network switch. Devices that are designed to be fully powered by PoE connection may then be good candidates for having their own power management capability built in to communicate with the PoE switch they are powered by, and in essence the PoE network switch may assume the role of the PDU in the typical data center scenario.

In some settings, power management data may be limited to the connections between the PoE "Power Sourcing Equipment" (PSE) and the PoE "Powered Devices" (PD) or consumer, and the PoE PD would not necessarily relay or pass along the power management events or data to any non-PoE network connections it may have (unless, e.g., somehow in a nonstandard way it is a PSE itself). An example of this is a PoE network switch with a network cable connected to an 802.11g wireless access point. Power management data may freely flow between the PoE network switch PSE and the wireless access point PD, but the wireless access point may filter out all power management communication from the wireless data transmitted because that wireless data connection is not providing power to any devices. Power management data would be restricted to pass only through connections that provide power, so that the consumers of power can be notified of impending power loss in the same manner that devices with standard power cords (40) are notified.

IV. Exemplary Equipment Identification through Power Cord

A power management system (10) may also be configured to provide two-way communication (narrowband or broadband) directly through power cord (40) in such a way that allows a power consumer (30), such as a computer system, to identify which power provider (20) it is plugged into. Such communication may also allow a power provider (20) to identify which power consumer (30) it is supplying power to. By way of example only, such communication may be particularly useful in settings where there are several power providers (20) and several power consumers (30), with a sea of power cords (40) making it otherwise difficult and cumbersome to determine which power provider (20) and which power consumer (30) a given power cord (40) is connected to.

Equipment identification through power cord (40) may be used to resolve a variety of issues. Several examples of such issues are described in greater detail below, while others will be apparent to those of ordinary skill in the art in view of the teachings herein.

A. Uncertainty of What Equipment Is Powered By a Specific Outlet.

There may be scenarios where it is important to find out which power consumer (30) is plugged in to a specific outlet (22) on a power provider (20). For instance, personnel may need to service a given power provider (20), such that the service personnel may need to decouple connected power consumers (30) from that power provider (20) (and possible re-connect those power consumers (30) to another power provider (20)). Another exemplary scenario may be where personnel needs to determine failure cases of what equipment would be affected if a specific power provider (20) or circuit loses power. Without power management system (10) of the present example, the only way to determine this is to follow a power cord (40) from outlet (22) all the way to the other end (perhaps through the bundle of identical black power cords (40)) and see what power consumer (30) is found there at the other end of power cord (40). Keeping records when power consumers (30) are coupled with a power provider (20) may be subject to too much human error and can become inaccurate when unexpected events cause an operator to move power cords (40) without documentation.

FIG. 28 depicts an exemplary power provider (20b) enhanced with capability to detect which of a plurality of power outlets (22a, 22b, 22c) a specific power consumer (30a, 30b, 30c) is connected to by virtue of the ability to isolate powerline communication signals to individual power outlets (22a, 22b, 22c) and use RFICs (24b, 24c, 24d) to detect powerline communication RF signals discretely. Various configurations and methods by which RFICs (26) may be used to discretely detect which of a plurality of outlets (22) are already noted above, and the one depicted is merely an illustrative example. In this example, when an arbitrary RFIC-equipped power consumer (30a) is initially connected to an outlet (22a), the power consumer's RFIC may begin transmitting powerline communication RF signal through power cord (40) and into power provider (20b) via power outlet (22a) with such signal being received by RFIC (24b). RFIC (24b) may communicate received data to microprocessor (27) via data link (35). Microprocessor (27) in power provider (20b) may inspect RF signal and determine that identification data contained in RF signal was not transmitted to the specific RFIC (24b) immediately prior to this point in time, and therefore conclude that power consumer (30a) has been newly connected to outlet (22a). By virtue of RF filters (26) included in power provider (20b) in this example the said conclusion can be made due to the fact that the only powerline path by which an RF signal may reach RFIC (24b) is outlet (22a). Once this conclusion is made, microprocessor (27) may store the conclusion in internal memory (not shown) and create event data with information that power consumer (30a) is now connected through outlet (22a) to power provider (20b) and then transmit said data via out of band data connection (33) and a plurality of RFICs (24a, 24b, 24c, 24d) to upstream and downstream connected devices. By virtue of this newly created and transmitted event, data power consumer (30a) itself receives information about what power provider (20b) and outlet (22a) it is connected to, and other devices receive the same information, including but not limited to power management system control server (360) as shown in FIG. 24.

Figure 29:
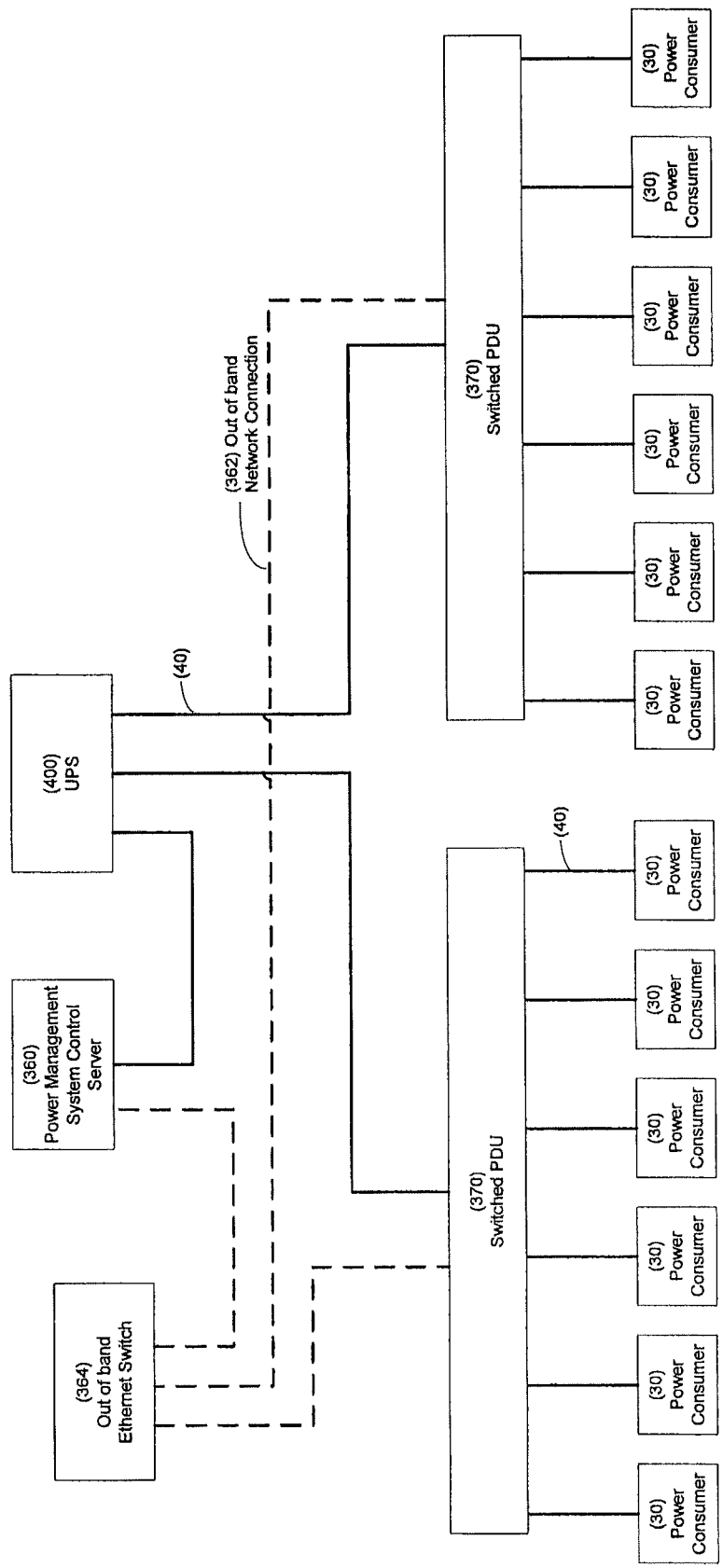
FIG. 29 depicts a schematic view of an exemplary power management system with a power management system control server and out of band network connections.

It should be noted that in FIG. 29, once microprocessor (27) concludes that the identification data it received is from a newly connected power consumer (30a), it does not relay this identification data through its plurality of RFICs (24a, 24b, 24c, 24d) in this example because that could cause other power providers (20) to incorrectly conclude that the power consumer (30a) has been newly connected to one of their power outlets (22) instead of only to outlet (22a) on power provider (20b). At this point the operator may make a connection to a device which contains this information and is capable of displaying said information, such as power management system control server (360), so that the operator may know with certainty that the power cord (40) that is connected to power consumer (30a) on one end is connected either directly or indirectly to outlet (22a) on power provider (20b).

It should also be understood that any of the power providers (370) shown in FIG. 29 may have two RFIC types—one type for "upstream" powerline communications (e.g., communications with power provider (400)); and another type for "downstream" powerline communications (e.g., communications with power consumers (30). Examples of such "upstream" and "downstream" types of RFICs are illustrated in FIG. 19, and are described in greater detail elsewhere herein. Of course, having two types of RFICs is merely optional.

B. Uncertainty of What Outlets Power a Specific Server

When a power consumer (30) stops responding or malfunctioning, sometimes the only way to resolve the problem may be to temporarily remove power from the power consumer (30) (called power-cycling). For an operator remotely connected from another location, one method of performing this operation may be to remotely connect to a "switched PDU" type of power provider (20), which allows switching on or off power to individual outlets (22). However, the operator may not have absolute certainty in what outlet (22) powers a specific power consumer (30). Human error may cause the record of what outlet (22) the power cord (40) of a given power consumer (30) is plugged into to be wrong in too many ways, from typographical errors to plugging in to the wrong outlet (22) or wrong power provider (20), or an operator moving power cord (40) during maintenance, etc. It may therefore be difficult if not impossible for a remote user to determine with 100% certainty that remotely turning off power to a certain outlet (22) will be turning off power to the correct power consumer (30).

The more "hands," meaning the higher the headcount in an information technology organization, the greater the likelihood in a specific organization that someone could change the power configuration or outlets (22) that a power consumer (30) (e.g., server, etc.) is plugged into without following proper change management procedures. Power consumers (30) that have redundant power supplies may be even more prone to undocumented power cord (40) changes, since one power cord (40) may be unplugged, while the other power cords (40) are still connected, and the unplugged power cord (40) may be moved to another outlet (22) without any system interruptions and with no critical alerts that would cause investigation by an operator.

Figure 20:
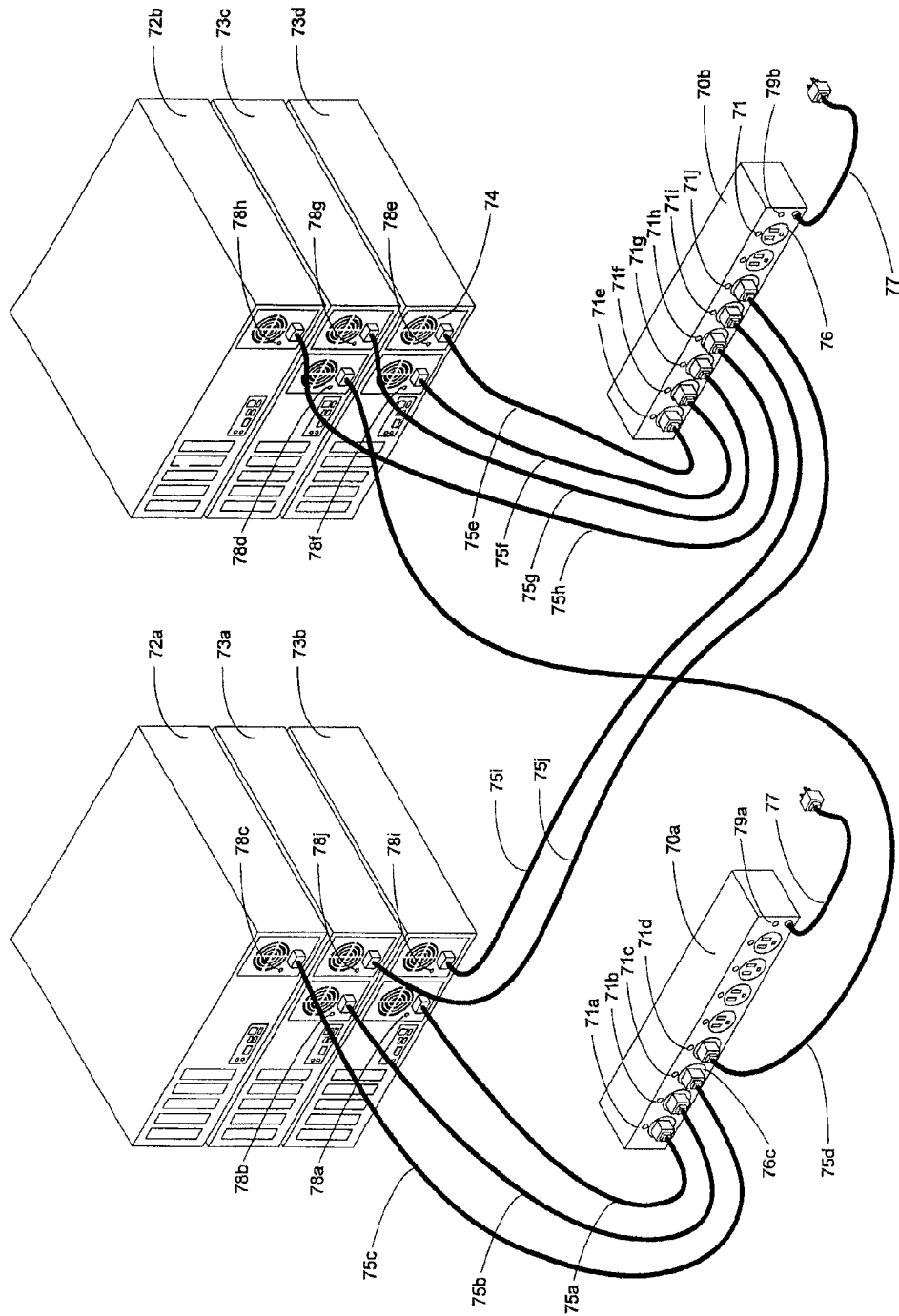
FIG. 20 depicts a perspective view of a pair of the power strip devices of FIG. 19 coupled with exemplary power consumers.

One merely illustrative example of this may be demonstrated in FIG. 20, where power providers (70a, 70b) may have power consumers (72a-b, 73a-d) connected to a plurality of power outlets (76) as a part of exemplary power management system (10); and an operator may desire to switch off power to individual power consumer (72a) while leaving all other power consumers (72b, 73a-d) in their current operational state. In the present example, power consumer (72a) may be coupled with a power cord (75c) that additionally couples with a power provider (70a) via power outlet (76c). The power provider (70a) is of type switched PDU, which has the ability to switch on or off power to each of a plurality of outlets and detect which discrete outlet out of a plurality of outlets (76) receives a specific powerline communication signal, as noted elsewhere above. Each power provider (70a) in this example may be configured in accordance with the power provider (370) shown in FIG. 19.

The power provider (370) in FIG. 19 has two types of RFICs—one type for "upstream" powerline communication and another type for "downstream" powerline communication. In particular, the "upstream" type is embodied in this example an upstream narrowband RF powerline communication module and an upstream broadband RF powerline communication module. Of course, some other versions may simply include only narrowband, only broadband, or some other type of "upstream" RFIC module. These "upstream" types of RFICs may be used to the extent that power provider (370) takes on the role of a power consumer (30), with power provider (370) receiving power (and possibly information/command communications) from an upstream power provider (20) that is coupled with power provider (370) via input power cord (77). Power provider (370) of this example also includes "downstream" RFICs that are embodied in this example as per-outlet narrowband powerline communication modules. Of course, some other versions may simply include only narrowband, only broadband, or some other type of "downstream" RFIC module. Power provider (370) of this example is thus operable to engage in powerline communication with its own upstream power provider (20) and downstream power consumers (30). In other words, power provider (370) of this example may be viewed as serving a dual role as both power provider (20) and power consumer (30). It should be understood that any power provider (20) described herein may similarly serve dual roles as both power provider (20) and power consumer (30), such as when one power provider (20) is coupled between another power provider (20) and a power consumer (30). It should further be understood that any power provider (20) described herein that is coupled between another power provider (20) and a power consumer (30) may have separate RFIC types—one or more RFICs for "upstream" powerline communications and one or more RFICs for "downstream" powerline communications. Alternatively, any other suitable configurations may be used.

Continuing with the example of FIG. 20, power outlet (76c) is the discrete outlet receiving powerline communication from power consumer (72a). When an operator makes a logical connection to power provider (70a) with intention to switch the state of a power outlet for a specific power consumer (72a), the operator may desire positive confirmation that the individual power outlet (76c) which is chosen is in fact coupled to desired power consumer (72a). To achieve such confirmation, as an example, power provider (70a) may transmit powerline communication through discrete power outlet (76c) requesting identification information, and request is received and responded to by power consumer (72a) via power cord (75c) through same discrete power outlet (76c) confirming that the individual power outlet (76c) which is chosen is in fact coupled to desired power consumer (72a). Positive feedback may be indicated to the operator via the logical connection previously established and the operator may initiate action via logical connection to switch off power to outlet (76c).

C. Uncertain Inventory of Equipment

Some automated inventory methods may require that power consumers (30) be powered on and in communication with a local network. For power consumers (30) that are turned off, network communication may not be possible, so automated inventories miss these power consumers (30). Power consumers (30) that have no network interface may thus never be seen by automated inventory systems. In some settings, there may an entire subset of "stealth" power consumers (30) that are all plugged into one or more power providers (20) and are part of the data center environment, yet that are missed by automated inventory systems due to such power consumers (30) not being in communication with a local network or for other reasons. Such "stealth" power consumers (30) may nevertheless be known via power management system (10) through power data signal communication through power cords (40) as described herein.

When powered on, the RFIC in power consumers (30) may be operable to transmit inventory of components and capabilities even when power consumer (30) is not "turned on". Information provided to the power management functionality of a system when powered on can be stored in flash memory (or other type of memory) within the RFIC or otherwise in communication with the RFIC so that a static snapshot of this information is available when the power consumer (30) is powered off. Because the power cord (40) may still provide power when the power consumer (30) is powered off, the RFIC may still receive power and can interact with other devices similarly supplied with an RFIC for Powerline communication. Complete inventories of powered-off power consumers (30) can be performed by simply plugging in a power cord (44) for less than a minute, without ever powering on the complete power consumer (30).

D. Uncertainty of System Capabilities of Connected Servers

Even if a power consumer (30) is powered on and connected to a local network, extensive knowledge and preparation of power consumer (30) may be required to get any useful information about power consumer (30) and what its capabilities are. Some determination may need to be made about what type of operating system a power consumer (30) uses (e.g., Windows, Linux, other) and determine what method may be used to gather information and capabilities (e.g., manufacturer, model, processor, memory, disk, firmware versions, etc.) of power consumer (30). If power consumer (30) is not connected to a network, or power consumer (30) is not a computer system, there may be no way to obtain any information about power consumer (30). If any power consumer (30) without lights-out management is turned off, then again power consumer (30) may be obscure and no information about it can be obtained electronically.

As is described elsewhere in this disclosure and in the section titled "RFIC Adapter", power management system (10) may accommodate powerline communication with power consumer (30) devices that are supplied power by a power provider (20) but are not switched "on" or active, and information about the power consumer (30) device may be stored in memory and transmitted by the RFIC while same device is still "off". In the merely illustrative example of power consumer (30) that is a personal computer or computer server with an RFIC adapter or internal RFIC implementation, during times that the same device is active and operational, the operating system (e.g., Windows, Linux, other) may store information in the RFIC memory about the same device, including operating system name, version numbers, system RAM configuration, processor speed and quantity, etc., so that information may be queried using power management system (10) even when the same device is switched "off" but power is yet supplied via power cord (40) or power connection (42).

E. Detection of Unapproved Equipment

The more protective an information technology department is over its computing facilities, the more they might want to ensure that every device that is installed in their data center is known about and approved of. The only way to enforce this may be to either physically prevent the addition of any equipment by policing of all people and equipment entering a facility, or make it physically unfeasible to install new equipment due to a lack of physical space or power. A preferred scenario may be to have a way to detect and identify any piece of equipment that is plugged in and receiving power.

As a merely illustrative example, FIG. 20 shows an exemplary power management system (10) where all power providers (70a, 70b) are of type switched PDU with each outlet (76) able to discretely detect which outlet is receiving a powerline communication signal. In the present example, ways in which unapproved equipment may be detected includes, but is not limited to, the methods described below.

Power provider (70a, 70b) may continually send and receive powerline communication with currently connected power consumers (72a-b, 73a-d) to ensure that their power cord (75a-j) is not removed and the power cord (75a-j) or power outlet (76) used for powering unapproved equipment by direct coupling or addition of extension cord or outlet splitter when switched PDU is clearly provided to power one power consumer (30, 72a-b, 73a-d) per outlet (76). Detection of equipment removal is further described below. Upon detection of a condition indicative of temporary or permanent equipment removal, an alert may be transmitted by various methods so that an operator may know to investigate detected equipment removal.

Power provider (70a, 70b) may detect newly connected power consumer (30) that has power management system (10) capabilities as described in this disclosure and provide identification information via powerline communication upon connection. Should the identification information provided by power consumer (30) not match a configured list of approved equipment, either by device type or by serial number, an alert may be transmitted by various methods so that an operator may know to investigate detected unapproved equipment.

Power provider (70a, 70b) may contain electrical current sensing circuitry (31) for each outlet. When any electrical current through a discrete outlet (76) is detected that is not immediately followed by the identification of a power consumer (30) that matches a configured list of approved equipment, either by device type or by serial number, an alert may be transmitted by various methods so that an operator may know to investigate detected unapproved equipment.

Power provider (70a, 70b) may be equipped with an RFIC per outlet (22), as shown in FIG. 28, and RFICs may be of such a nature that they may periodically transmit powerline communication RF signal and be calibrated to detect when a power cord (40), power connection (42), or power consumer (30) is connected to a discrete outlet (76) when the RF signal qualities of the outlet change from those previously calibrated. When such changes are detected for a discrete outlet (22) and not immediately followed by the identification of a power consumer (30) that matches a configured list of approved equipment, either by device type or by serial number, an alert may be transmitted by various methods so that an operator may know to investigate detected unapproved equipment F. Detection of Equipment Removal or Equipment Tampering Detection of power consumers (30) that stop responding to in-band network monitoring may be relatively easy in some settings. But when power consumers (30) are powered off (e.g., decommissioned equipment, or temporarily powered off for power savings with a technology like VMware Distributed Resources Scheduler, etc.) then such power consumers (30) may simply drop off the radar, so to speak. Monitoring the presence of a powered-off power consumer (30) may be extremely difficult to impossible in some settings. The permanent removal of a power consumer (30) may be one problem, and tampering may be another. Tampering may include situations where power consumer (30) is removed temporarily and then replaced with the same power consumer (30) with undesired functionality added or components removed, or power consumer (30) is replaced with similar hardware serving a different function, any of which might threaten the security of the data center.

Power management system (10) may allow for the powered-off monitoring of power consumer (30) to verify its continual and uninterrupted presence at the end of power cord (40), and it may also open new avenues for monitoring changes to powered-off power consumer (30). "Tamper switches" and case intrusion detection where notification is deferred or impossible until the power consumer (30) device is fully powered on is generally known in the art. Power management system (10) may allow for the transmission of tampering event data when power consumer (30) is powered off, so power consumers (30) designed with security in mind may add circuitry to detect case intrusion, hard drive insertion/removal, network cable insertion/removal, USB cable insertion/removal, etc. Such detection circuitry may be operable to detect such events and generate a signal indicative of the occurrence of such events, even when power is not being provided to power consumer (30) (e.g., when power consumer (30) is turned off). Such detection circuitry may be coupled with power management components, an RFIC, and/or with other suitable components, such that data indicative of such events could be ultimately communicated in accordance with the teachings herein, to alert an operator to unauthorized tampering of power consumer (30), as well as unauthorized unplugging of power consumer (30) from power provider (20).

G. Identification of Systems with Redundant Power Supplies that Are Incorrectly Plugged into Same Power Source A power consumer (30) may be equipped with two or more power supplies and power cords (40) with the intent of redundancy of power. Each power supply may convert power from the supplied format into whatever the specific power needs are of power consumer (30). These power supplies may produce large amounts of heat and may be considered one of the most unreliable components of a computer system, hence the tendency of higher-end servers to be designed with more than one power supply so that one or more can fail and the system can continue to operate normally. An additional reason to have redundant power supplies may be to allow the individual power cords (40) from each power supply to be plugged into separate distinct power providers (20). For example, a power consumer (30) with two power supplies may have one cord (40) plugged into a PDU as power provider (20), and the other cord (40) plugged into a UPS as power provider (20). This may allow either the PDU or the UPS to fail and power consumer (30) would continue to operate, or if line power were to fail the UPS may continue to power the power consumer (30). Other valid configurations in a data center environment may include having each cord (40) plugged into a separate PDU as power provider (20); or each cord (40) plugged into a separate UPS as power provider (20). Regardless, the situation that an operator may wish to avoid is plugging both power cords (40) for the same power consumer into only one power provider (20), as this may provide a single point of failure. Such a configuration may simply be the result of human error from not being able to easily trace power cord (40) from one end to the other end through a jumble of cords (40) that may be typical data center server rack.

Power management system (10) in this example may be able to easily detect and generate an alert when all the redundant power supplies on the same power consumer (30) have been attached to the same power provider (20).

For instance, each power consumer (30) may be associated with a unique identifier, and may be configured to communicate such an identifier back to power provider (20) through power cord (40) in accordance with the teachings herein. A microprocessor (27) in power provider (20) may be capable of receiving and comparing such identifiers that are communicated through all outlets (22) of power provider (20). A storage medium (e.g., flash memory, etc.) in power provider (20) may also store such identifiers. When a new power cord (40) is coupled with an outlet (22), and the identifier for the power consumer (30) at the other end of the new power cord (40) is communicated to power provider (20) (e.g., pushed or pulled through power cord (40)), the microprocessor (27) of power provider (20) may compare the new identifier to the other identifiers stored on the storage device of power provider (20) (i.e., identifiers that are associated with power consumers (30) that were already coupled with power provider (20)). If the microprocessor (27) determines that the identifier for the power consumer (30) at the other end of the new power cord (40) is the same as an identifier that is already stored on the storage medium of power provider (20), the microprocessor (27) may be configured to generate an alert. Such an alert may be communicated to an operator in any suitable fashion, including but not limited to a visual or audio alarm, an e-mail message (e.g., where power provider (20) is also coupled with a data network), a text message, a pop-up window, etc. The microprocessor (27) and storage device of power provider (20) may also be configured such that when a power consumer (30) is decoupled from an outlet (22) (e.g., power cord (40) decoupled from power consumer (30) or power cord (40) decoupled from outlet (22)), the identifier associated with that power consumer (30) is deleted from the memory of the storage medium of power provider (20). Of course, other ways in which such detection and alert generation may be performed will be apparent to those of ordinary skill in the art in view of the teachings herein.

Through centralized power management software and operator configuration, it may even be possible to detect when a single power consumer (30) with redundant power supplies is plugged into different power providers (20) that are fed by the same power circuit so the failure of a single power circuit would not cause an outage on the power consumer (30). As a merely illustrative example, FIG. 24 shows an exemplary power management system (10). The power providers (370a-c) are of type switched PDU, which have the ability to switch on or off power to each of a plurality of outlets (76) and detect which discrete outlet (76) out of a plurality of outlets (76) receives a specific powerline communication signal, as noted elsewhere above. The power consumers (382a, 382b) in this example are computer servers of the type that contain two or more power supplies (74) per computer server so that the failure or disconnection of one power supply (74) will not disrupt delivery of power to power consumer (382a, 382b). In this example, power consumer (382a) is correctly connected via two power cords (40) to two independent power providers (370a and 370b). By virtue of power management system (10), the power management control server ("control server") (360) may issue a command to central UPS (350) to transmit via powerline communication to power consumer (382a) requesting information about its power connections. The response would contain information regarding the two power connections and their identification information (since each power connection may be an independent power supply (74) each with its own RFIC and serial number or other identifier) and information about the power provider (370) each is connected to, which are power provider (370a) and power provider (370b) respectively. The control server (360) may apply programmable logic and configuration information to conclude that power consumer (382a) has redundant power supplies that are connected to separate power providers (370a and 370b), which may be a preferred configuration and may warrant no alert or further action.

However, in this example power consumer (382b) is incorrectly connected via two power cords (40) to the same power provider (370b). Again, by virtue of power management system (10), the power management control server ("control server")(360) may issue a command to central UPS (350) to transmit via powerline communication to power consumer (382b) requesting information about its power connections. The response would contain information regarding the two power connections and their identification information (since each power connection may be an independent power supply (74) each with its own RFIC and serial number or other identifier) and information about the power provider (370) each is connected to, which is only power provider (370b) for both connections. The control server (360) may apply programmable logic and configuration information to conclude that power consumer (382b) has redundant power supplies that are connected to the same power provider (370b), which may not be a preferred configuration, and therefore may warrant that an alert be generated and possibly transmitted to an operator for corrective action.

Alternatively, as a merely illustrative example, in FIG. 24 if switched PDU power provider (370b) contains a microprocessor of sufficient capability to contain programmable logic and configuration information, power provider (370b) may automatically on its own accord request information about power connections from all connected power consumers (382a, 380c, 382b) and, similar to the above example, determine that power consumer (382b) has two power connections to the same power provider (370b). In this situation the power provider (370b) may provide feedback to operators in the form of an audible buzzer incorporated into the power provider (370b), or if the power provider (370b) contains a PML (described elsewhere in this disclosure) it may provide visible feedback by changing the lighting state of a lightable pushbutton. Additionally, the power provider (370b) may alert the operator when a logical connection is established to the PML management interface or transmit an alert via powerline communication or other means to a device capable of notifying the operator of the need for corrective action.

H. Targeted Device Shutdown and Power Management Commands

It should be understood that individual events and notifications can be sent out to target specific devices for day-to-day operations or testing. Test commands may also be useful to make a UPS act as if line power was removed without actually physically changing the state of power supplied to the UPS. For instance, an operator may wish to run a test to see if a website's storage array is going to shut down after their database servers go down in a power outage, without affecting accounting's servers. To do this, the operator may initiate "targeted" tiered impending power-loss broadcast events that propagate the same way normal power management events do, but in such a way that they only affect devices that are in the list included in the special test event. End-devices or power providers are valid targets, so sending a test "power loss" event with a UPS in the list can automatically have the UPS respond to and notify all connected downstream devices.

I. "Green" Data Centers

Many power consumers (30) may have known parameters for their power usage. Some power consumers (30) may always use the same amount of power regardless of their function, and some may vary their power usage based on various operating factors. Some power consumers (30) may even have multiple modes of operation to reduce the amount of power they are using, perhaps with reduced capabilities as well. Such information, minimum power usage, max power usage, and power-saving modes, may be known extensively by the manufacturer, but not be conveyed in a meaningful way to the operator that is using it, and may not be otherwise available in electronically-readable format outside of the power consumer (30) itself. Power management system (10) may provide the opportunity to make all this information available to the operator the moment a power consumer (30) is plugged into a power provider (20), by providing such information in device ID and inventory information that is communicated through power cords (40). Some power consumers (30) may even have the ability to provide data about their power usage in real-time, and power management system (10) may be able to query and obtain that data from properly-equipped power consumers (30) via power cords (40).

By knowing the various power-saving capabilities of all power consumers (30) in a data center, there may be great potential for discovering power consumers (30) that are capable of power-saving modes that are not utilizing them. Power consumers (30) that provide enhanced monitoring and management capabilities as described in greater detail below can actually provide metrics on the performance of the power consumer (30) in relation to its power-saving mode and power usage. For example, if a server that is monitored using power management as described below is found to only be using 5% of its CPU capability, but power management system (10) may shows that the server has power-saving modes that are available but not in effect, then such a server may be a good candidate for reconfiguration, or perhaps a good candidate for server virtualization. All of this information may be currently available in some form or another, yet not currently be presented in one electronically-readable interface. Power management system (10) may provide the ability to make all of this information available with no network or server configuration required. In particular, such information may be made available simply by plugging in a power cord (40) and having the information communicated through power cord (40) as described herein.

Data center-wide on-demand power usage reduction may be a desirable goal in some settings. Having a universal communications mechanism with guaranteed connectivity to every power consumer (30) may be a desirable tool to reach this goal. There are several scenarios where enforcing data center-wide power-saving modes using power management commands may have positive impacts for the data center and the environment. For example, power management system (10) may be used to address HVAC undercapacity. Whether from unexpected extremely hot weather, or actual HVAC unit failures, may be potential for one or more sections of a data center to be in a situation where the cooling capacity is insufficient for periods of time. The ability to send a power management command that instructs all power consumers (30) to go into a configurable level of power-savings mode may turn a potential system availability disaster into a nearly-hands-off information technology management task. Forcing even highly-utilized power consumers (30) (e.g., servers, etc.) into a lower-performing power-saving mode may be more desirable than shutting off such power consumers (30) (intentionally or due to automatic thermal protection circuits) or other power consumers (30) that they depend on. Another example where enforcing data center-wide power-saving modes using power management commands may be useful may include power utility "demand response" compliance. As more and more "Smart Energy" and "Smart Grid" initiatives get underway, it may be desirable that data centers also be able to reduce their power usage on-demand during times of peak demand when rolling blackouts threaten the safety of individuals in locales with heat or cold emergencies. The ability of a data center to reduce its power consumption during these times could become mandated in locales through legislation over time, but it may also be good for the community and a company's public relations. Although this may be difficult in some conventional settings, power management system (10) may make it relatively simple and automated where, if not automatic, an operator can engage an entire data center's power-saving modes remotely from anywhere with internet connectivity.

Yet another example where enforcing data center-wide power-saving modes using power management commands may be useful may include extending UPS and generator runtimes. One scenario in which it may be desirable to force all devices in a data center into a power-saving mode is when a utility power outage occurs, or at least when an extended power outage is expected. Reducing the power usage at a data center may include means extending the time that UPS batteries can supply power before being exhausted. During extended outages when a power generator is involved, it may be desirable to reduce power usage to extend fuel supply life if the frequency of fuel deliveries is at all uncertain due to weather or environmental conditions.

Other scenarios in which enforcement of data center-wide power-saving modes using power management commands may be useful will be apparent to those of ordinary skill in the art in view of the teachings herein.

J. Identification of Power Management Capabilities

As power management features and capabilities grow, power management in accordance with the above examples may serve as a building block that allows future systems to identify and negotiate what power management functionality is supported by power management system (10). For instance, it will be apparent to those of ordinary skill in the art of computer network programming and information technology in view of the teachings herein that powerline communication may be used, along with a protocol similar in features to the OSI Layer 7, as described elsewhere in this disclosure, that it may be trivial in nature for devices with power management system (10) capabilities as described in this disclosure to respond to a request via powerline communication with enumerative and detailed information about the exact power management system (10) capabilities of the same device. The data describing the capabilities may take forms including, but not limited to, plain text, XML, JSON, or any other published and possibly standardized data format.

V. Exemplary Physical Identification of Connected Devices Using Power Management Light ("PML")

A. Exemplary PML Lights in a Power Providers and Power Consumers

In some data center environments, the path followed by a given power cord (40) may be greatly obscured between outlet (22) where power cord (40) is plugged into a power provider (20) and power consumer (30) at the other end of power cord (40). Many conventional power cords may be visually indistinguishable from each other in use in the same area (e.g., all black, similar texture, no identifiable printing along the cable, etc.), and may come in two standard sizes (e.g., 6 ft/2 m or 10-12 ft/3-4 m). This may contributes to confusion about, given one end of a power cord (40), what is connected to at the other end of power cord (40).

Determining with any degree of certainty where the other end of power cord (40) is located may have risks associated with it since it may involve gentle tugging and pushing of power cord (40) to trace the path of power cord (40) by observing movement in an another area when moving power cord (40) in one area. This can break the connection of the power cord (40) being traced or disconnect other cords (e.g., other power cords (40) and/or data cables). Visually determining which power cords (40) are going to be affected or need to be removed or replaced when servicing or decommissioning devices in the data center can be extremely important, and being able to make the visual determination while physically interacting with the equipment may be key to reducing the risk of human error, since even turning away to log in to a web page or look at a printout to cross reference may introduce distraction and increase the possibility of misidentification of a power cord (40), outlet (22), power provider (20), and/or power consumer (30). It may therefore be desirable in some settings to be able to physically and visually identify both ends of a power cord (40) in real-time with positive user-initiated feedback.

One merely illustrative example of this is shown in FIG. 20 where power providers (70a, 70b) and power consumers (72a-b, 73a-d) may include lightable pushbutton ("Power Management Light" or "PML") (79a-b, 78a-j, 75a-j) as a part of power management system (10). A PML may possess association to specific power inputs or specific power outputs. A power input PML (79a-b, 78a-j) may be logically or visibly associated to a power input, such as but not limited to power input cord (77) on a power provider or power input cord (75*a-j*) on power consumer (74). A power output PML (71*a-j*) may be logically or visibly associated to a power outlet. PML may be linked to an RFIC or connected microprocessor and configured to provide two-way communication (narrowband, broadband, or otherwise), thereby allowing a computer sever administrator to push a PML and positively identify the physical equipment on both ends of power cord (40) as indicated by a change in illumination state of PMLs. Alternatively, each PML may comprise a push button and a separate light, buzzer, or positive feedback indicator instead of a lightable pushbutton. In the present example, a first PML (78*c*) may be located on a power consumer (72*a*) with a coupled power cord (75*c*) that additionally couples with a power provider (70*a*) via power outlet (76) with associated PML (71*c*). In the present example the power provider (70*a*) being a switched PDU has the ability to detect which discrete outlet (76) receives a specific powerline communication signal, as noted elsewhere above. By physically pushing on the first PML (78*c*), the power consumer (72*a*) may change the lighting state of the PML to one of a plurality of possible lighting states, and may then send a power management system command via powerline communication through power cord (75*c*) to power provider (70*a*), which may correspondingly change the lighting state of the PML (71*c*) associated with the outlet coupled with power cord (75*c*). Alternatively, a user may push on the second PML (71*c*) first, which may then result in a similar change to the lighting state of the first PML (78*c*).

As a merely illustrative example, if all pushbuttons in a data center locale are in the "off" lighting state, then if an operator pushes the pushbutton where a power cord (40) enters a power consumer (30), that pushbutton may change its lighting state to "on," and by virtue of a power management command being sent through the connected power cord (40), the pushbutton located on outlet (22) at the other end of power cord (40) may also change its lighting state to "on." In this example, those would be the only two pushbuttons that would change their lighting state, therefore positively identifying the two distinct termination points for that one specific power cord (40). In another version, a power management command is not what causes the second pushbutton to light up in response to the first pushbutton being pressed. Instead, pushing the first pushbutton simply closes a circuit between the first and second pushbuttons, and power already being communicated through power cord (40) is fed into this circuit when the switch is closed, and such power is used to illuminate the two pushbuttons.

It should also be understood that, in some versions, operators may push a pushbutton in a plurality of patterns, and power management system (10) may recognize a plurality of patterns, including but not limited to any or all of the following, among others: single push, double push (two pushes within a configurable amount of time), triple push (three pushes within a configurable amount of time), long push (button pushed for greater than a configurable amount of time), extended push (button pushed for greater than a configurable amount of time that is significantly greater than for "long push"), etc. This simple set of examples shows a method to invoke a plurality of visual positive feedback modes from the same pushbutton.

A plurality of lighting states can be generated for an individual pushbutton. Examples of some lighting states may include any or all of the following, among others: "off," "on red," "on blue," "on green," "on white," "flashing red," "flashing blue," "flashing green," "flashing white," etc. A plurality of colors are possible using various lighting technologies, and a plurality of flashing speeds and flashing patterns are possible, so the total quantity of lighting states is not technically limited. However, an estimate of patterns that are easily interpreted and distinguishable by a human operator may be around ten.

By recognizing a plurality of push patterns and the ability to generate a plurality of lighting states, a plurality of visual positive feedback modes can be invoked. Some mode examples may include any or all of those described below, among others.

Pressing in a recognized push pattern the PML associated with coupled power cord may initiate powerline communication from device containing PML being pushed through power cord causing the PMLs associated with both ends of the power cord to visually indicate the associated location of both ends of the power cord, including the PML being pushed.

Pressing in a recognized push pattern the PML on a power provider may initiate from the same power provider the transmission of powerline communication commands to all directly connected power consumers (30) causing the PMLs on the power consumers to visually indicate all of the power consumers receiving power directly from the power provider with the PML being pushed.

Pressing in a recognized push pattern the PML on a power consumer with redundant power supplies, positive visual feedback will indicate when any of the redundant power supplies are errantly plugged into the same power provider. This may augment the similar functionality of power management discussed previously in that the operator may immediately in real-time push a PML and get feedback about the validity of the power cord (40) configuration without the displacement of having to log in to some other computer system to verify that the redundant power supplies of the same power consumer (30) are plugged into separate power providers (20).

Pressing in a recognized push pattern the PML on a power provider may initiate from the same power provider the transmission of powerline communication commands to all connected power consumers (30) and connected power providers (20). Additionally the commands transmitted may instruct all downstream power providers (30) that receive the command to relay and propagate the same command to all connected power consumers and power providers connected to the receiving power provider. Upon receipt of the transmitted and propagated commands, the associated PML of each device receiving the command may change the lighting state to visually indicate to the operator all downstream power consumers (30) and power providers (20) that would be affected if power were lost at the particular power provider (20) where the PML is being pushed. Various lighting states may visually indicate power consumers (30) that would be in different power states. Some examples of those states may include any or all of the following, among others: power consumers (30) that would continue to have power supplied by a power provider (20) (e.g., UPS); power consumers (30) that would lose power from the power provider (20) where the pushbutton is being pushed but still function due to redundant power supplies that would still have power from other power providers (20); and/or power consumers (30) that would have no power. This simulation could be performed on multiple power providers (20) at once to visually show how the loss of multiple power circuits affects the downstream power consumers (30).

It should be understood that visual positive feedback can in fact be physical or virtual. In other words, an operator may be given the benefit of real-time visual positive feedback by physically being present at the devices and simply pressing a pushbutton. When physically working with the hardware, the operator can avoid any workflow displacement normally caused by having to leave the location to go somewhere else to log in and obtain information or confirm connections, and this may greatly reduces the chance of human error. Immediate testability and instant results may encourage the careful confirmation of all changes made in the data center power environment.

However, in some settings, all operations that can be performed physically by pushing a physical button may also be performed in the virtual realm when logged in to software that can generate and interpret the same events that occur when the physical button is pushed. In other words, any visual indication or push-button operation that can be performed on the physical hardware could also be shown and performed in the virtual realm with the implementation of properly-designed software.

Additionally, using virtual operations in software, the lighting state of the PML can be changed for visual confirmation and identification purposes. For example, an operator can log in to power management-capable computer software and locate a specific outlet (22) of a power provider (20) in a list, then issue an instruction in the user interface (e.g., click a button or other user interface feature) and the lighting state of the PML on the actual outlet (22) may change so the operator can visually locate the physical outlet (22) in the data center.

The physical pushing of the PML may also result in a data message being generated that the operator may find to be of extreme value. As an example, the operator may approach an unidentified device that is known to be power management-capable with the applicable PML. The operator may push the PML, with the optional lighting state change for visual confirmation, and a central power management-capable computer that is a part of this system may detect the powerline communication signal indicating the pressing of the PML. The central power management-capable computer may then query the identity of the device with the pushbutton that was pressed and then send an email, SMS message, instant message, or other near-realtime communications message to a preconfigured list of recipients, of which the operator may be a member, and the operator would then be able to inspect the message that was received to learn the identity of the device where the pushbutton was pressed. This may happen in real-time or near-realtime in such a manner that the operator does not experience any significant physical or workflow displacement because they are able to determine the identity of the device without leaving the physical proximity of the device or perhaps even losing physical contact with the device.

B. Exemplary PML Lights in a Power Cord

In addition to or as an alternative to incorporating PML into a power provider (20) or power consumer (30), some versions of power management system (10) may implement power cord (40) which may include a lightable pushbutton (e.g., PML) on opposing ends of power cord (40), and may be configured to provide two-way communication (narrowband, broadband, or otherwise), thereby allowing a computer sever administrator to push a lit pushbutton and positively identify the physical equipment on both ends of power cord (40). Alternatively, each end of power cord (40) has a push button and a separate light instead of a lightable pushbutton. In the present example, a first pushbutton may be located at the end of power cord (40) that couples with a power consumer (30), and a second pushbutton is located at the end that couples with a power provider (20). By physically pushing on the second pushbutton, the power provider (20) may change the lighting state of the pressed pushbutton to one of a plurality of possible lighting states, and may then send a power management command through power cord (40) to power consumer (30), which may correspondingly change the lighting state of the pushbutton at that location. Alternatively, a user may push on the first pushbutton first, which may then result in a similar change to the lighting state of the second pushbutton.

In some other versions, a power cord (40) has two lights but only one pushbutton. Such a single pushbutton may be located at the end of the power cord (40) that couples with power provider (20); or at the end of the power cord (40) that couples with power consumer (30). Regardless of which end the pushbutton is at, the lights may be at both ends of power cord (40).

In another merely illustrative example, a power cord (40) is "dumb," such that it is not responsive to any data signals communicated by an RFIC or otherwise. For instance a power cord (40) may have lightable pushbuttons on each of its ends, and such lightable pushbuttons may be selectively coupled with a circuit. That circuit may also be in communication with the main powerline running through power cord (40). In particular, power cord (40) may be configured such that either lightable pushbutton may be selectively actuated as a switch to selectively complete the circuit that includes both lightable pushbuttons and the main powerline of power cord (40). Completing the circuit in such a way may cause both lightable pushbuttons to be illuminated (assuming power is actively running through the main powerline of power cord (40)). The main powerline of such a power cord (40) may still communicate power regardless of whether the lightable pushbutton circuit is completed or not. In other words, the lightable pushbutton circuit may be dependent on the main powerline of such a power cord (40); while the main powerline of such a power cord (40) is not dependent on the lightable pushbutton circuit.

As yet another variation of a "dumb" power cord (40), a battery (e.g., small button battery) may included in one of the ends of power cord (40) (or elsewhere), and such a battery may provide the power to illuminate both lightable pushbuttons when one of the lightable pushbuttons is actuated to complete the circuit on which both lightable pushbuttons and the battery reside. Such a circuit may be completely isolated from the main powerline of power cord (40), if desired. Alternatively, the main powerline of power cord (40) may be coupled with such a circuit. For instance, the main powerline of power cord (40) may provide the power to illuminate the lightable pushbuttons when power is running through the main powerline, and may also provide power to recharge the battery in power cord (40); while the battery provides the power to illuminate the lightable pushbuttons when power is not running through the main powerline.

It should be understood in view of the foregoing that various versions of power cord (40) may have utility beyond the data center, regardless of whether data is communicated along power cord (40) in addition to simple electricity for power. In other words, power cord (40) need not be in communication with any RFIC or similar components in order to provide several of the functionalities noted above. Furthermore, the foregoing examples may be adapted to virtually any other type of cords or cables, and such examples are not limited to cords or cables that communicate power. By way of example only, any of the foregoing examples may be adapted to any suitable type of data cables such as networking cables, audio/video cables, etc., or any other suitable type of cable or cord.

Still other ways in which a power cord (40) may provide physical feedback of conditions and events, through lighting or otherwise, will be apparent to those of ordinary skill in the art in view of the teachings herein. Similar, other suitable uses for power cord (40) will be apparent to those of ordinary skill in the art in view of the teachings herein.

VI. Exemplary Computer Management and Monitoring through a Power Cord

A power management system (10) as described herein may be configured to provide two-way broadband communication directly through power cord (40), thereby allowing power consumers (30) (e.g., computer servers, etc.) with "Lights-Out" management capabilities to be set up, managed, and monitored completely, out of band, by simply plugging in power cord (40). For instance, power management system (10) may be utilized as a de facto out-of-band communications layer for remote access, monitoring, and management of data center devices using technologies such as SNMP, CIM, IPMI, and future Distributed Management Task Force initiatives. Thus, in the present example, power management system (10) provides utilization of power management broadband powerline communication for such out-of-band communication through power cord (40) and not requiring any further connections. It is understood that there is no technical limitation to cause the powerline communication to be used only for out of band communication, and in-band network and internet traffic may in some circumstances be desirable communication to facilitate through the power management system (10). However, it is believed that there are effectively no adopted standards for out of band computer management and monitoring that are as inclusive for all line-powered devices as the power management system (10) described in this disclosure. Solely for the sake of clarity and brevity, and not due to technical limitations, this section of the disclosure will focus on the power management system (10) using powerline communication for the primary purpose of out of band computer management and monitoring through a power cord.

For instance, if every data center device were to implement power management system (10) with broadband communication chipsets, by virtue of simply plugging in a device's power cord (40) the device could immediately be managed and monitored. Such power management systems (10) may support bridging or tunneling of the management and monitoring data to existing standards (SNMP, CIM, IPMI, etc.) and future standards, as well as providing opportunity for additional native monitoring and management capabilities that will be built into power management system (10) standards and protocols.

Although there may be vendor-proprietary methods for managing servers and other types of power consumers (30), the IPMI standards and IPMI payloads may hold potential for supporting universal Lights-Out management and setup of bare-metal servers without additional network connectivity the moment an operator plugs in a power cable (40). IPMI Payloads may include Keyboard Video Mouse ("KVM") and Remote Desktop Protocol ("RDP") support and presentation of virtual installation files, virtual media connections, and media image files, which could be transparently passed through power management system (10) using hardware and techniques described herein.

Some conventional cross-platform management tools may interface to a server's Lights-Out management module via an IP address or simply allow a web browser to connect to the lights-out management module. To the extent that there is complexity associated with managing and maintaining a separate and independent set of network switches or RS232 multiplexers, information technology groups may simply opt for using "in-band communication," where management and monitoring data continuity can be susceptible to production LAN congestion or potentially the management and monitoring data can adversely affect the production network. It may therefore be desirable in some settings to provide management and monitoring data should out-of-band and segregated to a separate network, which is exactly what power management system (10) may provide by simply plugging in power cords (40), without any of the additional complexity sometimes associated with segregated switches or even in-band network traffic management or VLAN partitioning.

By relying on communication only through power cords (40) for basic system management, an immediate reduction of cabling complexity can be realized in some settings by the elimination of up to four cables per power consumer (e.g., in the case of a server, video, mouse, keyboard, lights-out management cables may be eliminated). The elimination of KVM switches and out-of-band network switches may also reduce equipment costs and recover valuable rackspace in some settings.

Some conventional power providers (20) may not be designed to support IPMI or other open management standards other than SNMP, but if they become central fixtures in power management communication, power providers (20) may benefit from having standards-based management of their own.

The end result of configuring and using power management system (10) in such a way may be a truly universal and OS-agnostic plug-and-play system for device failure monitoring, management, and alerting from the moment power cord (40) is plugged in. It may not matter whether a power consumer (30) that is plugged in at a data center is a Sun server running Linux, a Cisco router, a desktop PC, a printer, a disk array, or a Windows server. Any power management-capable power consumer (30) that is plugged into a power management-capable power provider (20) may be able to be detected, identified, and immediately monitored for system failures or alerts without user intervention. This may include power consumers (30) that would not even ordinarily have network connectivity on their own, such as a disk array or computer monitor because the out-of-band communications functionality may be added to the power consumer (30) by inclusion of an RFIC that provides said out of band communication through the power cord (40). Numerous device failures may occur in data centers daily that are not noticed because either the power consumer (30) was not set up in a data center's monitoring system when it was added to the environment, or the power consumer (30) lacked a network connection to send an alert through. Power management system (10) may reduce or eliminate the occurrence of undetected failures since every power consumer (30) that gets power in the data center will have the ability to communicate statuses and failures and can be centrally monitored the moment it is plugged in (e.g., even if the power consumer (30) is not also powered on). Additionally, once power consumer (30) is detected, may also be eligible to be configured and managed centrally through power management system (10), potentially with no further human interaction, regardless of the type of power consumer (30) it is. For instance, a printer may be managed and configured through power cord (40) using power management system (10) as easily as a Windows or Linux server is managed through a power cord (40).

A possible version of this power management system (10) is that as soon as a power cord (40) of a power consumer (30) is plugged in, an automation system can detect the powerline communication of the newly deployed power consumer (30) and power it on and begin an unattended automated operating system installation or image deployment even before an Ethernet network connection is available. In a cloud computing environment, a plurality of computer server devices are deployed on a relatively large scale (e.g., numbering 100s or 1000s of devices) with nearly identical characteristics. By using power management system (10), a server may be provisioned totally out-of-band using power management communication before configuring its participation on the production network. Detection of devices newly plugged in or newly provided power is described elsewhere in this disclosure. Additionally it is described elsewhere in this disclosure how power management system (10) may utilize powerline communication for out-of-band connectivity with lights-out-management of computers and servers to provide remote management, virtual KVM connectivity, and transmission of firmware updates, virtual media connections, and disk images. It will be apparent to those of ordinary skill in the art of enterprise information technology that utilizing prior art, such as the "HP Insight Rapid Deployment Software" or "Rapid Deployment Pack", in combination with examples described herein to provide out-of-band data connectivity, a computer server may be remotely provisioned and configured even when a power cord (40) or power connection (42) is the only connection provided to the same server.

Operating systems may also incorporate explicit support for this example of a power management system in the form of audio and/or visual user notifications or alerts when a computer is not plugged in to a power provider (20) that is powerline communications enabled. An example of this is the Microsoft "Windows Security Center" which displays alerts when Anti-virus, Firewall, or Automatic Update settings are not configured to optimal settings. An addition to the "Windows Security Center" may include an exemplary alert such as "Your PC is not connected to a power provider with power management capabilities. To best protect your valuable data and PC hardware please plug your PC power cord into a UPS with power management capabilities." Such an alert may be provided in the form of a pop-up window, pop-up balloon, e-mail, text message, and/or any other form of notification.

VII. Exemplary Additional Features of a Power Management System

A. Power Management System and Feature Licensing

Data center management is an area that has open-source movement and software available. The approach of selling proprietary licensed software to do data center management through closed and proprietary management APIs may hurt the growth and acceptance of power management systems, such as those described herein. Instead, all aspects of data center management may be supported through open APIs and standards so that the individual information technology groups can determine what software they choose to use for their enhanced management of systems using the power management functionality. However, the enabling of data flow through these open APIs and standards could be controlled by license key to recoup the cost of functionality with higher R&D costs or profit potential. The manufacturer of the hardware may still have a domain knowledge advantage to allow them to produce best-of-breed management software which could be licensed separately or bundled with additional licensing keys to allow advanced data flow through the open APIs.

B. Power Management Systems and Server Virtualization

Merely illustrative examples of ways in which power management system (10) may be used in association with server virtualization include, but are not limited to, the following: power management outage notifications & Vmotion & VM standby; power management systems turn unplanned power outages into planned shutdowns; UPSes that get notified by PDUs pass along planned outage timing with their internal runtime added to it; and/or planned outages as "one-stop-shopping." Power management systems may coordinate all shutdowns. All hardware and OS vendors now have one standard to follow for OS and network independent data center maintenance coordination.

C. Power Management Systems and Network Hardware

Out-of-band network hardware devices can be remotely configured immediately upon devices being supplied power without any additional connections.

D. Power Management Systems and Storage

All independently-powered storage devices, such as USB disk drives, external tape drives, standalone disk arrays, et al. may all participate in power management system (10) via powerline communication independent of any standard logical data connections.

E. Power Management System Security.

The power management systems (10) described herein may include implementations of a communications protocol that covers several distinct domains of functionality. Security need not be ignored in the implementation of these power management systems (10). There may be circumstances where a "wide open" or promiscuous configuration is warranted so that any new equipment plugged in can instantly participate with no prior intervention at all. There may also be circumstances that require data encryption for both privacy and authentication of power management messages. Encryption keys could be set electronically through configuration interfaces, but an advanced approach would be to build in support for physical tokens, such as either a simple flash memory device such as microSD, or a device similar to a GSM SIM card or a SmartCard, all of which would allow storing of secret symmetric encryption keys or private asymmetric encryption keys and configuration data or the implementation of standard or custom algorithms for symmetric or public key encryption and authentication mechanisms.

Regardless of the authentication method, there may be a desirable amount of certainty that a power management command or notification that has been received is intentional. In one merely illustrative example, in an environment where authentication methods include a challenge/response protocol, where for example power provider (20) may send a command to immediately power off, and then power consumer (30) may respond with a challenge of "if you are serious about me powering off, send me another command and include the MD5 hash of my device serial number and the random number 0x88A32BC13." This kind of challenge/response may eliminate the chance that a spurious non-intentional command was sent out by a device, or that some kind of random signal could be interpreted as a command to shut down. Various versions are possible with various cryptographic and logic-based controls to insure the authenticity and/or authorization for a command before it is acted upon by the power management-capable device.

Another aspect of security implementation may be the use of automatically renewing tokens which would allow a randomly-generated "start" key or token to be used to initialize a power management-capable device, after which immediately it would be updated via the power management protocol to be issued a temporary security token which is replaced immediately before its expiration and is based on the previously valid token. This could in effect create an environment where a power management-capable device has to be explicitly added using a "start" key, and if at any point the device had its power cable (40) unplugged for longer than the security token was valid, then the device could not be simply plugged back in to the power management system (10) and participate. This may not only prevent unauthorized devices from being used in power management system (10), but it may prevent authorized devices from being removed (unplugged), modified, and re-introduced into power management system (10). The unique aspect of this is that it would not necessarily require any OS involvement at all—the OS could be nonfunctional or nonexistent and this security mechanism could still be in effect. Part of the enforcement implementation may be that any outlet (22) of a power provider (20) that detects power usage without a properly authenticated power management system security token would have the outlet (22) powered off (and appropriate alerts sent, if desired). Alternatively, any other reaction may be provided to an authentication failure.

Data centers using 802.1x authentication on their in-band data networks could actually require part of the authentication data to come from the power management system security token. This may prevent authorized hardware from being removed from the data center, modified, and then plugged back in to the network running off of an external power source (such as a portable UPS, generator, or extension cord running to somewhere else).

Power consumers (30) could also be configured with advanced power management functionality which requires power consumer (30) to be powered by an authorized or authenticated power provider (20). If a power provider (20) does not have the proper power management system token and authentication protocol enabled, then the entire power management system (10) could be configured to perform a variety of actions, including a data wipe and total system power-off to clear volatile RAM. This may prevent a power consumer (30) with redundant power supplies from having one power cord (40) unplugged and plugged into a portable power source, and then the other power cords (40) removed so that the power consumer (30) could be unracked and transported out of a data center while powered on to preserve sensitive unencrypted data in volatile system RAM while external tools are used to inspect the memory contents.

Additional methods to ensure power management-cable device detection compliance may include requiring that all devices provide real-time power usage data, and if an outlet (22) is detected to supply more electricity than is consumed by the associated power management-capable power consumer (30) that is reporting its power usage, then an alert could be sent to the operator, the outlet (22) could simply be powered off, and/or any other reaction may be provided.

While several examples have been provided to illustrate how device authentication hardware and algorithms may be incorporated into power management system (10), those of ordinary skill in the art will recognize in view of the teachings herein that there are a variety of other ways in which device authentication hardware and algorithms may be incorporated into power management system (10).

F. Power Over Ethernet

Because the Power over Ethernet IEEE 802.3af standard only defines a method for negotiating power upon initial connection, but provides no means of communicating any other information about power usage power-related events (basically PoE is either on or off), the power management system (10) data protocol might be a good candidate for a method of adding extensive power and device management capabilities to all PoE Power Sourcing Equipment (PSE) and PoE Powered Device (PD) hardware in the future.

It should be understood that, with respect to any example described anywhere in this disclosure, in any power consumer (30), retrofit adapter, and/or other component that contains an RFIC, the RFIC may be implemented with redundancy (e.g., one or more additional backup RFICs). Similarly, it should be understood that, with respect to any example described anywhere in this disclosure, in any power consumer (30), retrofit adapter, and/or other component that contains an RFIC, the RFIC may be implemented with both a Narrow Band RFIC and a Wide Band RFIC, such as to communicate with power providers (20) that implement either or both of NBRFIC and/or WBRFIC communication. Still other ways in which RFICs may be implemented in any suitable components or configurations will be apparent to those of ordinary skill in the art in view of the teachings herein.

G. Communication Protocols

In several versions where there is communication between devices related to power management and other topics in this disclosure, it is understood that the implementation may require a protocol similar in nature to the OSI Model Layer 7 "Application Layer" to define the manner and format in which notifications, commands, information requests, logging data, and any other such data or information will be passed between devices. It is believed that, in view of the teachings herein, those of ordinary skill in the art of computer network programming can create and implement a formal or informal Layer 7 protocol related to power management and all other topics in this disclosure, and upon its implementation in two or more devices, allow any one device to transmit said data and one or more other devices to receive said protocol data via powerline communication, Power over Ethernet, USB, or any other communication method, and the receiving device then may take appropriate action. Such an implementation may resemble or utilize, but is not limited to, the SOAP specification to allow requests and responses in a defined structure, although the implementer must decide on the actual data content that is placed inside the SOAP requests and responses. Of course, any other suitable protocols and/or specifications may be used.

It is expected that the implementer could have categories of interactions defined as informal or formal protocols or instructions between two devices that include, but are not limited to, event notifications, commands, information requests, logging data, and data transfer sessions. Examples of event notifications that may be sent to a static or dynamic set of one or more devices may include, but are not limited to, power to device detected, device operation enabled, device operation disabled, power provider switching to battery power, power provider estimated battery runtime, power provider battery power exhausted, power from power provider being terminated, power provider main power restored, device temperature outside acceptable limits, device error detected, device physical orientation or location changed. Other types of event notifications will be apparent to those of ordinary skill in the art in view of the teachings herein. Examples of commands that could be received and responded to by a device may include, but are not limited to, enable device operation, disable device operation, reduce power consumption, restore full power consumption, reboot device, initiate device self test, save critical data immediately and shut down, initiate military data wipe, perform device self-destruct. Other types of commands will be apparent to those of ordinary skill in the art in view of the teachings herein. Examples of information requests that could be responded to by a device may include, but are not limited to, request device identification, request device operational status, request device power status, enumerate device power consumers, enumerate device power providers, request device temperature, request device orientation and location, enumerate device capabilities. Other types of information requests will be apparent to those of ordinary skill in the art in view of the teachings herein. Examples of logging data that may be configured to be sent to a static or dynamic set of one or more destination devices independent of all other interactions (possibly for auditing purposes) may include, but are not limited to, operational heartbeat periodic data, periodic temperature data, periodic fan RPM data, periodic CPU and disk performance data, device login and logout data, device commands performed, device requests received, device errors predicted, device errors detected, device errors resolved. Other types of logging data will be apparent to those of ordinary skill in the art in view of the teachings herein. Examples of data transfer sessions that could be established between two or more devices may include, but is not limited to, file transfer sessions, keyboard/video/mouse remote control console sessions, device firmware update sessions, device battery-backed cache memory content transfer sessions, device disk or persistent storage data image transfer sessions, remote video and/or audio surveillance sessions. Other types of data transfer sessions will be apparent to those of ordinary skill in the art in view of the teachings herein.

These interactions may use a variety of addressing methods, including but not limited to IP addresses, MAC addresses, DNS names, NETBIOS names, GUIDs, and serial numbers to specify the sender and the target receiver or target receivers for each protocol interaction. Other types of addressing methods will be apparent to those of ordinary skill in the art in view of the teachings herein. Additionally, each interaction may contain a plurality of ancillary data related to the interaction for the devices to act upon in appropriate ways. An example of such ancillary data may be that a Request Device Temperature instruction may evoke a response that contains a numeric representation of the currently measured device temperature. An example implementation of the OSI Model Layers 1 through 6 may use a HomePlug Powerline communication chipset in two or more devices powered by a shared power connection and TCP/IP to establish a TCP connection between two devices on a destination port that may or may not be registered with the Internet Assigned Numbers Authority (IANA). Many other implementations at various layers of the OSI model are possible, including but not limited to Ethernet, Asynchronous Transfer Mode, RS232, USB, HTTP, HTTPS, PPTP, PPP, and IEEE 1394 Firewire.

Having shown and described various embodiments of the present invention, further adaptations of the methods and systems described herein may be accomplished by appropriate modifications by one of ordinary skill in the art without departing from the scope of the present invention. Several of such potential modifications have been mentioned, and others will be apparent to those skilled in the art. For instance, the examples, embodiments, geometrics, materials, dimensions, ratios, steps, and the like discussed above are illustrative and are not required. Accordingly, the scope of the present invention should be considered in terms of claims that may be presented, and is understood not to be limited to the details of structure and operation shown and described in the specification and drawings.

We claim:

1. A power management device, comprising:
   (a) a power input configured to couple with an external power source;
   (b) a plurality of power outputs configured to transmit power; and
   (c) one or more processing components in communication with the power input and the power outputs, wherein the one or more processing components are configured to transmit power from the power input to the power outputs, wherein the one or more processing components comprises at least one radio frequency (RF) powerline communication module, wherein the at least one RF powerline communication module is configured to transmit data through at least one of the power outputs using powerline communication while power is transmitted through the at least one of the power outputs;
   wherein the one or more processing components further comprise a logic configured to:
      (i) determine whether two or more power outputs of the plurality of power outputs are coupled with all power inputs of a single power consuming device, and
      (ii) trigger a notification in response to determining that two or more power outputs of the plurality of power outputs are coupled with all power inputs of a single power consuming device.

2. The power management device of claim 1, further comprising a power supply housing, wherein the power input, the plurality of power outputs, and the one or more processing components are all integral with the power supply housing.

3. The power management device of claim 1, wherein the at least one RF powerline communication module is further configured to receive data communicated from the at least one of the power outputs while power is transmitted through the at least one of the power outputs, the one or more processing components being further configured to process received data communicated from the at least one of the power outputs.

4. The power management device of claim 1, wherein the one or more processing components are further configured to monitor and control power usage by one or more power consuming components coupled with one or more of the power outputs.

5. The power management device of claim 1, wherein the at least one RF powerline communication module comprises a plurality of RF powerline communication modules, wherein each RF powerline communication module of the plurality of RF powerline communication modules is associated with a respective power output of the plurality of power outputs.

6. The power management device of claim 1, wherein the one or more processing components further comprise one or more RF filters in communication with the at least one RF powerline communication module.

7. The power management device of claim 1, further comprising:
   (a) a power consuming device, wherein the power consuming device comprises a power input coupled with a selected one of the power outputs; and
   (b) a cable coupling the power input of the power consuming device with the selected one of the power outputs, wherein the power consuming device is configured to receive power from the selected one of the power outputs via the cable, wherein the at least one RF powerline communication module is configured to transmit data through the cable using powerline communication while power is transmitted through the cable.

8. The power management device of claim 7, wherein the power consuming device further comprises at least one RF powerline communication module, wherein the at least one RF powerline communication module of the power consuming device is configured to communicate with the at least one RF powerline communication module of the one or more processing components using powerline communication via the cable.

9. The power management device of claim 1, wherein the at least one RF powerline communication module comprises a first RF powerline communication module and a second RF powerline communication module, wherein the first RF powerline communication module is configured to operate within a first RF range, wherein the second RF powerline communication module is configured to operate within a second RF range.

10. The power management device of claim 9, wherein the first RF range does not overlap with the second RF range.

11. A system, comprising:
(a) a power supply, wherein the power supply comprises:
  (i) a plurality of power outputs,
  (ii) one or more processing components in communication with the power outputs, wherein the one or more processing components comprises at least one radio frequency (RF) powerline communication module, wherein the at least one RF powerline communication module is configured to transmit data through at least one of the power outputs using powerline communication while power is transmitted through the at least one of the power outputs, and
  (iii) a plurality of output visual indicators associated with respective power outputs of the plurality of power outputs;
(b) a plurality of power consuming devices coupled with the plurality of power outputs, wherein each power consuming device has a respective input visual indicator; and
(c) a plurality of user inputs, wherein each user input is operable to selectively activate a corresponding output visual indicator of the plurality of output visual indicators and a corresponding input visual indicator of the plurality of input visual indicators, thereby indicating an associations between the corresponding output and input visual indicators.

* * * * *